United States Patent
Ohsawa et al.

(10) Patent No.: US 12,004,359 B2
(45) Date of Patent: Jun. 4, 2024

(54) LIGHT-EMITTING ELEMENT, DISPLAY DEVICE, ELECTRONIC DEVICE, AND LIGHTING DEVICE

(71) Applicant: Semiconductor Energy Laboratory Co., Ltd., Kanagawa-ken (JP)

(72) Inventors: Nobuharu Ohsawa, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 17/989,000

(22) Filed: Nov. 17, 2022

(65) Prior Publication Data

US 2023/0094551 A1 Mar. 30, 2023

Related U.S. Application Data

(62) Division of application No. 16/542,589, filed on Aug. 16, 2019, now Pat. No. 11,508,926, which is a
(Continued)

(30) Foreign Application Priority Data

Oct. 10, 2014 (JP) ................... 2014-208543

(51) Int. Cl.
*H10K 50/11* (2023.01)
*C09K 11/06* (2006.01)
(Continued)

(52) U.S. Cl.
CPC .............. *H10K 50/11* (2023.02); *C09K 11/06* (2013.01); *H10K 50/121* (2023.02);
(Continued)

(58) Field of Classification Search
CPC .... H10K 50/11; H10K 50/121; H10K 85/615; H10K 2101/10; H10K 2101/27;
(Continued)

(56) References Cited

U.S. PATENT DOCUMENTS 5,281,489 A 1/1994 Mori et al.
6,097,147 A 8/2000 Baldo et al.
(Continued)

FOREIGN PATENT DOCUMENTS

EP 2 695 930 A1 2/2014
JP 07-085972 A 3/1995
(Continued)

OTHER PUBLICATIONS

Park, Young-Seo, et al. "Exciplex-forming co-host for organic light-emitting diodes with ultimate efficiency." Advanced Functional Materials 23.39 (2013): 4914-4920. (Year: 2013).*
(Continued)

*Primary Examiner* — Dawn L Garrett
(74) *Attorney, Agent, or Firm* — Husch Blackwell LLP

(57) ABSTRACT

A light-emitting element including a fluorescent material as a light-emitting material and having high emission efficiency is provided. The light-emitting element includes a pair of electrodes and an EL layer provided between the pair of electrodes. The EL layer includes a host material and a guest material. The host material is capable of exhibiting thermally activated delayed fluorescence at room temperature. The guest material is capable of exhibiting fluorescence. The second triplet excitation energy level of the guest material is higher than or equal to the lowest singlet excitation energy level of the guest material.

12 Claims, 14 Drawing Sheets

Related U.S. Application Data division of application No. 14/878,376, filed on Oct. 8, 2015, now abandoned.

(51) Int. Cl.
  *H10K 50/12*     (2023.01)
  *H10K 85/60*     (2023.01)
  *H10K 101/00*    (2023.01)
  *H10K 101/10*    (2023.01)
  *H10K 101/30*    (2023.01)

(52) U.S. Cl.
  CPC ....... *H10K 85/615* (2023.02); *H10K 2101/10* (2023.02); *H10K 2101/27* (2023.02); *H10K 2101/30* (2023.02); *H10K 2101/90* (2023.02)

(58) Field of Classification Search
  CPC ........... H10K 2101/30; H10K 2101/90; H10K 2101/20; H10K 50/81; H10K 50/82; H10K 59/1213; H10K 59/40; C09K 11/06; F21V 23/0485; H05B 33/02; H05B 33/14
  See application file for complete search history.

(56) References Cited

U.S. PATENT DOCUMENTS

| | | |
|---|---|---|
| 7,572,522 B2 | 8/2009 | Seo et al. |
| 7,701,131 B2 | 4/2010 | Gerhard et al. |
| 7,862,904 B2 | 1/2011 | Vestweber et al. |
| 7,943,925 B2 | 5/2011 | Yamazaki |
| 8,247,086 B2 | 8/2012 | Inoue et al. |
| 8,247,575 B2 | 8/2012 | Nomura et al. |
| 8,274,214 B2 | 9/2012 | Ikeda et al. |
| 8,293,921 B2 | 10/2012 | Nomura et al. |
| 8,334,061 B2 | 12/2012 | Nomura et al. |
| 8,343,639 B2 | 1/2013 | Seo et al. |
| 8,530,658 B2 | 9/2013 | Nomura et al. |
| 8,563,740 B2 | 10/2013 | Kawata et al. |
| 8,643,268 B2 | 2/2014 | Ogiwara et al. |
| 8,653,553 B2 | 2/2014 | Yamazaki et al. |
| 8,729,310 B2 | 5/2014 | Osaka et al. |
| 8,736,157 B2 | 5/2014 | Seo et al. |
| 8,766,249 B2 | 7/2014 | Sawada et al. |
| 8,810,125 B2 | 8/2014 | Ikeda et al. |
| 8,853,680 B2 | 10/2014 | Yamazaki et al. |
| 8,916,897 B2 | 12/2014 | Yamazaki et al. |
| 8,969,579 B2 | 3/2015 | Kawata et al. |
| 8,969,854 B2 | 3/2015 | Takemura et al. |
| 8,981,355 B2 | 3/2015 | Seo |
| 8,981,393 B2 | 3/2015 | Seo et al. |
| 8,994,013 B2 | 3/2015 | Seo |
| 8,994,263 B2 | 3/2015 | Shitagaki et al. |
| 9,048,398 B2 | 6/2015 | Yamazaki et al. |
| 9,059,421 B2 | 6/2015 | Seo et al. |
| 9,059,430 B2 | 6/2015 | Seo et al. |
| 9,065,066 B2 | 6/2015 | Seo et al. |
| 9,076,976 B2 | 7/2015 | Seo et al. |
| 9,082,994 B2 | 7/2015 | Watabe et al. |
| 9,099,617 B2 | 8/2015 | Yamazaki et al. |
| 9,299,944 B2 | 3/2016 | Seo et al. |
| 9,475,991 B2 | 10/2016 | Kubota et al. |
| 9,515,279 B2 | 12/2016 | Ishisone et al. |
| 9,660,211 B2 | 5/2017 | Seo et al. |
| 9,911,936 B2 | 3/2018 | Seo et al. |
| 10,439,005 B2 | 10/2019 | Ishisone et al. |
| 10,693,095 B2 | 6/2020 | Seo et al. |
| 10,714,700 B2 | 7/2020 | Seo et al. |
| 11,563,191 B2 | 1/2023 | Seo et al. |
| 2005/0048310 A1 | 3/2005 | Cocchi et al. |
| 2006/0063027 A1 | 3/2006 | Vestweber et al. |
| 2006/0134464 A1 | 6/2006 | Nariyuki |
| 2006/0228577 A1 | 10/2006 | Nagara |
| 2007/0244320 A1 | 10/2007 | Inoue et al. |
| 2008/0160345 A1 | 7/2008 | Inoue et al. |
| 2008/0286604 A1 | 11/2008 | Inoue et al. |
| 2009/0166563 A1 | 7/2009 | Yokoyama et al. |
| 2010/0052527 A1 | 3/2010 | Ikeda et al. |
| 2010/0145044 A1 | 6/2010 | Inoue et al. |
| 2011/0001146 A1 | 1/2011 | Yamazaki et al. |
| 2011/0095678 A1 | 4/2011 | Ogita et al. |
| 2011/0210316 A1 | 9/2011 | Kadoma et al. |
| 2011/0215714 A1 | 9/2011 | Seo et al. |
| 2012/0098417 A1 | 4/2012 | Inoue et al. |
| 2012/0205632 A1 | 8/2012 | Shitagaki et al. |
| 2012/0205687 A1 | 8/2012 | Yamazaki et al. |
| 2012/0206035 A1 | 8/2012 | Shitagaki et al. |
| 2012/0217486 A1 | 8/2012 | Takemura et al. |
| 2012/0217487 A1 | 8/2012 | Yamazaki et al. |
| 2012/0242219 A1 | 9/2012 | Seo et al. |
| 2012/0248421 A1 | 10/2012 | Yamazaki et al. |
| 2012/0248968 A1 | 10/2012 | Ogiwara et al. |
| 2012/0256535 A1 | 10/2012 | Seo et al. |
| 2012/0274201 A1 | 11/2012 | Seo et al. |
| 2012/0277427 A1 | 11/2012 | Inoue et al. |
| 2013/0048964 A1 | 2/2013 | Takeda et al. |
| 2013/0056720 A1 | 3/2013 | Kim et al. |
| 2013/0112961 A1 | 5/2013 | Seo et al. |
| 2013/0207088 A1 | 8/2013 | Seo |
| 2013/0270531 A1 | 10/2013 | Seo et al. |
| 2013/0277653 A1 | 10/2013 | Osaka et al. |
| 2013/0277654 A1 | 10/2013 | Seo et al. |
| 2013/0277655 A1 | 10/2013 | Seo et al. |
| 2013/0277656 A1 | 10/2013 | Seo et al. |
| 2013/0292656 A1 | 11/2013 | Seo et al. |
| 2013/0306945 A1 | 11/2013 | Seo |
| 2014/0014930 A1 | 1/2014 | Hirose et al. |
| 2014/0034925 A1 | 2/2014 | Osaka et al. |
| 2014/0034926 A1 | 2/2014 | Matsubara et al. |
| 2014/0034927 A1 | 2/2014 | Seo et al. |
| 2014/0034929 A1 | 2/2014 | Hamada et al. |
| 2014/0034930 A1 | 2/2014 | Seo et al. |
| 2014/0034931 A1 | 2/2014 | Inoue et al. |
| 2014/0034932 A1 | 2/2014 | Seo et al. |
| 2014/0042469 A1 | 2/2014 | Seo et al. |
| 2014/0061604 A1 | 3/2014 | Seo et al. |
| 2014/0084274 A1 | 3/2014 | Yamazaki et al. |
| 2014/0103329 A1 | 4/2014 | Ogiwara et al. |
| 2014/0191220 A1 | 7/2014 | Watabe et al. |
| 2014/0252338 A1 | 9/2014 | Seo et al. |
| 2014/0284578 A1 | 9/2014 | Takeda et al. |
| 2014/0319492 A1 | 10/2014 | Seo et al. |
| 2014/0336379 A1 | 11/2014 | Adachi et al. |
| 2014/0340888 A1 | 11/2014 | Ishisone et al. |
| 2015/0001502 A1 | 1/2015 | Seo et al. |
| 2015/0021579 A1 | 1/2015 | Yamazaki et al. |
| 2015/0053958 A1 | 2/2015 | Ishisone et al. |
| 2015/0102331 A1 | 4/2015 | Seo et al. |
| 2015/0155510 A1 | 6/2015 | Kawata et al. |
| 2015/0155511 A1 | 6/2015 | Ohsawa et al. |
| 2015/0188068 A1 | 7/2015 | Seo et al. |
| 2015/0188070 A1 | 7/2015 | Ogiwara et al. |
| 2015/0188072 A1 | 7/2015 | Seo |
| 2016/0064684 A1 | 3/2016 | Seo et al. |
| 2016/0093823 A1 | 3/2016 | Seo et al. |
| 2017/0250360 A1 | 8/2017 | Seo et al. |
| 2017/0271610 A1 | 9/2017 | Takahashi |
| 2019/0140027 A1 | 5/2019 | Ishisone et al. |
| 2023/0157042 A1 | 5/2023 | Seo et al. |

FOREIGN PATENT DOCUMENTS

| | | |
|---|---|---|
| JP | 2004-241374 A | 8/2004 |
| JP | 2006-024830 A | 1/2006 |
| JP | 2006-511939 | 4/2006 |
| JP | 2006-528421 | 12/2006 |
| JP | 2010-185007 A | 8/2010 |
| JP | 2011-213643 A | 10/2011 |
| JP | 2012-004526 A | 1/2012 |
| JP | 2012-044125 A | 3/2012 |
| JP | 2013-116975 A | 6/2013 |
| JP | 2013-236058 A | 11/2013 |
| JP | 2014-044942 A | 3/2014 |
| JP | 2014-045179 A | 3/2014 |

(56) References Cited

FOREIGN PATENT DOCUMENTS

| JP | 2016-207998 A | 12/2016 |
|---|---|---|
| JP | 2017-175128 A | 9/2017 |
| JP | 2020-174044 A | 10/2020 |
| WO | WO 2012/132936 A1 | 10/2012 |
| WO | WO 2014/021443 A1 | 2/2014 |
| WO | WO 2015/029808 A1 | 3/2015 |
| WO | WO 2017/158475 A1 | 9/2017 |

OTHER PUBLICATIONS

Baldo.M et al., "Highly Efficient Phosphorescent Emission From Organic Electroluminescent Devices", Nature, Sep. 10, 1998, vol. 395, pp. 151-154.
Baldo.M et al., "Very High-Efficiency Green Organic Light-Emitting Devices Based on Electrophosphorescence", Appl. Phys. Lett. (Applied Physics Letters), Jul. 5, 1999, vol. 75, No. 1, pp. 4-6.
Gu.G et al., "Transparent Organic Light Emitting Devices", Appl. Phys. Lett. (Applied Physics Letters), May 6, 1996, vol. 68, No. 19, pp. 2606-2608.
Choong.V et al., "Organic Light-Emitting Diodes With a Bipolar Transport Layer", Appl. Phys. Lett. (Applied Physics Letters), Jul. 12, 1999, vol. 75, No. 2, pp. 172-174.
Adachi.C et al., "Nearly 100% Internal Phosphorescence Efficiency in an Organic Light Emitting Device", J. Appl. Phys. (Journal of Applied Physics), Nov. 15, 2001, vol. 90, No. 10, pp. 5048-5051.
Baldo.M et al., "Prospects for Electrically Pumped Organic Lasers", Phys. Rev. B (Physical Review. B), Jul. 19, 2002, vol. 66, p. 035321-1-035321-16.
Markham.J et al., "High-efficiency green phosphorescence from spin-coated single-layer dendrimer light-emitting diodes", Appl. Phys. Lett. (Applied Physics Letters), Apr. 15, 2002, vol. 80, No. 15, pp. 2645-2647. Itano.K et al., "Exciplex formation at the organic solid-state interface: Yellow emission in organic light-emitting diodes using green-fluorescent tris(8-quinolinolato)aluminum and hole-transporting molecular materials with low ionization potentials", Appl. Phys. Lett. (Applied Physics Letters), Feb. 9, 1998, vol. 72, No. 6, pp. 636-638.
Kondakova.M et al., "High-efficiency, low-voltage phosphorescent organic light-emitting diode devices with mixed host", J. Appl. Phys. (Journal of Applied Physics), Nov. 4, 2008, vol. 104, pp. 094501-1-094501-17.
Seo.J et al., "Efficient blue-green organic light-emitting diodes based on heteroleptic tris-cyclometalated iridium(III) complexes", Thin Solid Films, Sep. 25, 2008, vol. 517, No. 5, pp. 1807-1810.
Fujita.M et al., "Reduction of operating voltage in organic light-emitting diode by corrugated photonic crystal structure", Appl. Phys. Lett. (Applied Physics Letters), Dec. 6, 2004, vol. 85, No. 23, pp. 5769-5771.
Yoshida.K et al., "High efficiency reverse intersystem crossing of exciplex states", The 71st Autumn Meeting of the Japan Society of Applied Physics and Related Societies, 2010, p. 319, The Japan Society of Applied Physics.
Goushi.K et al., "Delayed fluorescence organic light-emitting diodes based on exciplex", The 59th Spring Meeting of the Japan Society of Applied Physics and Related Societies Preliminary Drafts, 2012, p. 251.
Nakagawa.T et al., "Electroluminescence based on thermally activated delayed fluorescence generated by a spirobifluorene donor-acceptor structure", Chemical Communications, Apr. 17, 2012, vol. 48, No. 77, pp. 9580-9582, RSC Publishing.
Yokoyama.D et al., "Dual efficiency enhancement by delayed fluorescence and dipole orientation in high-efficiency fluorescent organic light-emitting diodes", Appl. Phys. Lett. (Applied Physics Letters), Sep. 22, 2011, vol. 99, No. 12, pp. 123303-1-123303-4, AIP Publishing.
Mehes.G et al., "Thermally Activated Delayed Fluorescence and its Application for OLED", The 2nd Phoenics International Symposium, Mar. 5, 2012.
Yang.C et al., "Excited State Luminescence of Multi-(5-phenyl-1,3,4-oxadiazo-2-yl)benzenes in an Electron-Donating Matrix: Exciplex or Electroplex?", J. Phys. Chem. B (The Journal of Physical Chemistry B), Dec. 29, 2009, vol. 114, No. 2, pp. 756-768. Endo.A et al., "Thermally Activated Delayed Fluorescence from Sn4+-Porphyrin Complexes and Their Application to Organic Light Emitting Diodes—A Novel Mechanism for Electroluminescence", Adv. Mater. (Advanced Materials), Aug. 12, 2009, vol. 21, No. 47, pp. 4802-4806.
Furukawa.T et al., "Dual enhancement of electroluminescence efficiency and operational stability by rapid upconversion of triplet excitons in OLEDs", Sci. Rep. (Scientific Reports), Feb. 12, 2015, vol. 5, No. 8429, pp. 1-8.
Tanaka.H et al., "Efficient green thermally activated delayed fluorescence (TADF) from a phenoxazine-triphenyltriazine (PXZ-TRZ) derivative", Chemical Communications, Dec. 4, 2012, vol. 48, No. 93, pp. 11392-11394, The Royal Society of Chemistry 2012.
Nakanotani.H et al., "High-efficiency organic light-emitting diodes with fluorescent emitters", Nature Communications, May 30, 2014, vol. 5, pp. 4016-1-4016-7.
Hirata.S et al., "Highly efficient blue electroluminescence based on thermally activated delayed fluorescence", nature materials, Dec. 8, 2014, vol. 14, No. 3, pp. 330-336.
Jankus.V et al., "Highly Efficient TADF OLEDs: How the Emitter-Host Interaction Controls Both the Excited State Species and Electrical Properties of the Devices to Achieve Near 100% Triplet Harvesting and High Efficiency", Advanced Functional Materials, Aug. 8, 2014, vol. 24, No. 39, pp. 6178-6186.
Yu.T et al., "Progress in small-molecule luminescent materials for organic light-emitting diodes", Science China Chemistry, Jun. 1, 2015, vol. 58, No. 6, pp. 907-915.
Endo.A et al., "Efficient Up-Conversion of Triplet Excitons Into a Singlet State and Its Application for Organic Light Emitting Diodes", Appl. Phys. Lett. (Applied Physics Letters), Feb. 24, 2011, vol. 98, No. 8, pp. 083302-1-083302-3.

* cited by examiner

LIGHT-EMITTING ELEMENT, DISPLAY DEVICE, ELECTRONIC DEVICE, AND LIGHTING DEVICE

This application is a divisional of copending U.S. application Ser. No. 16/542,589, filed on Aug. 16, 2019 which is a divisional of U.S. application Ser. No. 14/878,376, filed on Oct. 8, 2015 (now abandoned), which are all incorporated herein by reference.

BACKGROUND OF THE INVENTION

1. Field of the Invention

One embodiment of the present invention relates to a light-emitting element in which a light-emitting layer capable of providing light emission by application of an electric field is provided between a pair of electrodes, and also relates to a display device, an electronic device, and a lighting device including the light-emitting element.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a method for driving any of them, and a method for manufacturing any of them.

2. Description of the Related Art

In recent years, research and development have been extensively conducted on light-emitting elements using electroluminescence (EL). In a basic structure of such a light-emitting element, a layer containing a light-emitting substance (an EL layer) is interposed between a pair of electrodes. By application of a voltage between the electrodes of this element, light emission from the light-emitting substance can be obtained.

Since the above light-emitting element is a self-luminous type, a display device using this light-emitting element has advantages such as high visibility, no necessity of a backlight, and low power consumption. Further, such a light-emitting element also has advantages in that the element can be manufactured to be thin and lightweight, and has high response speed.

In the case of a light-emitting element (e.g, an organic EL element) whose EL layer includes an organic material as a light-emitting material and is provided between a pair of electrodes, application of a voltage between the pair of electrodes causes injection of electrons from a cathode and holes from an anode into the EL layer having a light-emitting property and thus a current flows. By recombination of the injected electrons and holes, the light-emitting organic material is brought into an excited state to provide light emission.

Note that an excited state formed by an organic material can be a singlet excited state ($S^*$) or a triplet excited state ($T^*$). Light emission from the singlet-excited state is referred to as fluorescence, and light emission from the triplet excited state is referred to as phosphorescence. The statistical generation ratio of the excited states in the light-emitting element is considered to be $S^*:T^*=1:3$. In other words, a light-emitting element including a phosphorescent material has higher emission efficiency than a light-emitting element containing a fluorescent material. Therefore, a light-emitting element including a phosphorescent material capable of converting the triplet excited state into light emission has been actively developed in recent years.

As one of materials capable of partly converting the triplet excited state into light emission, a thermally activated delayed fluorescence (TADF) substance has been known. In a thermally activated delayed fluorescent substance, a singlet excited state is generated from a triplet excited state by reverse intersystem crossing, and the singlet excited state is converted into light emission. Patent Document 1 and Patent Document 2 each disclose a thermally activated delayed fluorescent substance.

In order to increase emission efficiency of a light-emitting element using a thermally activated delayed fluorescence substance, not only efficient generation of a singlet excited state from a triplet excited state but also efficient emission from a singlet excited state, that is, high fluorescence quantum yield are important in a thermally activated delayed fluorescence substance. It is, however, difficult to design a light-emitting material that meets these two.

Patent Document 3 discloses a method: in a light-emitting element containing a thermally activated delayed fluorescence substance and a material emitting fluorescence, singlet excitation energy of the thermally activated delayed fluorescence substance is transferred to the material emitting fluorescence and light emission is obtained from the material emitting fluorescence.

REFERENCE

Patent Document

[Patent Document 1] Japanese Published Patent Application No. 2004-241374

[Patent Document 2] Japanese Published Patent Application No. 2006-24830

[Patent Document 3] Japanese Published Patent Application No. 2014-45179

SUMMARY OF THE INVENTION

In order to increase emission efficiency of a light-emitting element containing a thermally activated delayed fluorescent substance and a material emitting fluorescence, efficient generation of a singlet excited state from a triplet excited state in the thermally activated delayed fluorescent substance is important. Furthermore, efficient excitation energy transfer from the singlet excited state of the thermally activated delayed fluorescent substance to a singlet excited state of the material emitting fluorescence is important. In addition, efficient light emission from the singlet excited state of the material emitting fluorescence, that is, high fluorescence quantum yield of the material emitting fluorescence, is important.

When excitation energy is transferred efficiently from the singlet excited state of the thermally activated delayed fluorescent substance to the singlet excited state of the material emitting fluorescence, excitation energy is also transferred from the triplet excited state of the thermally activated delayed fluorescent substance to the triplet excited state of the material emitting fluorescence in some cases. When excitation energy is transferred from the triplet excited state of the thermally activated delayed fluorescent substance to the triplet excited state of the material emitting fluorescence, the generation probability of the singlet excited state from the triplet excited state in the thermally activated delayed fluorescent substance is reduced. Therefore, in order to increase emission efficiency of the light-emitting element, it is important to prevent the transfer of excitation energy from the triplet excited state of the thermally activated delayed fluorescent substance to the triplet excited state of the material emitting fluorescence.

An object of one embodiment of the present invention is to provide a light-emitting element having high emission efficiency which includes a material emitting fluorescence as a light-emitting material. Another object of one embodiment of the present invention is to provide a light-emitting element with high reliability. Another object of one embodiment of the present invention is to provide a light-emitting element with high emission efficiency and high reliability. Another object of one embodiment of the present invention is to provide a novel light-emitting element. Another object of one embodiment of the present invention is to provide a novel light-emitting element with high emission efficiency and low power consumption.

Note that the description of the above objects does not disturb the existence of other objects. In one embodiment of the present invention, there is no need to achieve all the objects. Objects other than the above objects will be apparent from and can be derived from the description of the specification and the like.

One embodiment of the present invention is a light-emitting element including a pair of electrodes and an EL layer provided between the pair of electrodes. The EL layer includes a host material and a guest material. The host material is capable of exhibiting thermally activated delayed fluorescence at room temperature. The guest material is capable of exhibiting fluorescence. The second triplet excitation energy level of the guest material is higher than or equal to the lowest singlet excitation energy level of the guest material.

Another embodiment of the present invention is a light-emitting element including a pair of electrodes and an EL layer provided between the pair of electrodes. The EL layer includes a host material and a guest material. The host material is capable of exhibiting thermally activated delayed fluorescence at room temperature. The guest material is capable of exhibiting fluorescence. The second triplet excitation energy level of the guest material is higher than or equal to the lowest triplet excitation energy level of the host material. The lowest triplet excitation energy level of the host material is higher than or equal to the lowest triplet excitation energy level of the guest material.

In the above structure, the second triplet excitation energy level of the guest material is preferably higher than or equal to the lowest singlet excitation energy level of the host material.

In the above structure, a difference between the lowest triplet excitation energy levels of the host material and the guest material is preferably higher than or equal to 0.5 eV.

In each of the above structures, a thermally activated delayed fluorescence emission energy of the host material is preferably higher than or equal to a phosphorescence emission energy of the guest material.

In each of the above structures, a difference between the thermally activated delayed fluorescence emission energy of the host material and the phosphorescence emission energy of the guest material is preferably higher than or equal to 0.5 eV.

Another embodiment of the present invention is a light-emitting element including a pair of electrodes and an EL layer provided between the pair of electrodes. The EL layer includes a host material and a guest material. The host material is capable of exhibiting thermally activated delayed fluorescence at room temperature. The guest material is capable of exhibiting fluorescence. The second triplet excitation energy level of the guest material is higher than or equal to the lowest triplet excitation energy level of the host material. The lowest triplet excitation energy level of the host material is higher than or equal to the lowest singlet excitation energy level of the guest material.

In the above structure, the second triplet excitation energy level of the guest material is preferably higher than or equal to the lowest singlet excitation energy level of the host material.

In each of the above structures, the thermally activated delayed fluorescence emission energy of the host material is preferably higher than or equal to the fluorescence emission energy of the guest material.

In each of the above structures, it is preferable that the host material have a difference of more than 0 eV and less than or equal to 0.2 eV between the lowest singlet excitation energy level and the lowest triplet excitation energy level.

Another embodiment of the present invention is a light-emitting element including a pair of electrodes and an EL layer provided between the pair of electrodes. The EL layer includes a host material and a guest material. The host material includes a first organic compound and a second organic compound. An exciplex formed by the first organic compound and the second organic compound is capable of exhibiting thermally activated delayed fluorescence at room temperature. The guest material is capable of exhibiting fluorescence. The second triplet excitation energy level of the guest material is higher than or equal to the lowest singlet excitation energy level of the guest material.

Another embodiment of the present invention is a light-emitting element including a pair of electrodes and an EL layer provided between the pair of electrodes. The EL layer includes a host material and a guest material. The host material includes a first organic compound and a second organic compound. An exciplex formed by the first organic compound and the second organic compound is capable of exhibiting thermally activated delayed fluorescence at room temperature. The guest material is capable of exhibiting fluorescence. The second triplet excitation energy level of the guest material is higher than or equal to the lowest triplet excitation energy level of the exciplex. The lowest triplet excitation energy level of the exciplex is higher than or equal to the lowest triplet excitation energy level of the guest material.

In the above structure, the second triplet excitation energy level of the guest material is preferably higher than or equal to the lowest singlet excitation energy level of the exciplex.

In each of the above structures, a difference between the lowest triplet excitation energy level of the exciplex and the lowest triplet excitation energy level of the guest material is preferably higher than or equal to 0.5 eV.

In each of the above structures, the thermally activated delayed fluorescence emission energy of the exciplex is preferably higher than or equal to the phosphorescence emission energy of the guest material.

In each of the above structures, a difference between the thermally activated delayed fluorescence emission energy of the exciplex and the phosphorescence emission energy of the guest material is preferably higher than or equal to 0.5 eV.

Another embodiment of the present invention is a light-emitting element including a pair of electrodes and an EL layer provided between the pair of electrodes. The EL layer includes a host material and a guest material. The host material includes a first organic compound and a second organic compound. An exciplex formed by the first organic compound and the second organic compound is capable of exhibiting thermally activated delayed fluorescence at room temperature. The guest material is capable of exhibiting fluorescence. The second triplet excitation energy level of the guest material is higher than or equal to the lowest triplet excitation energy level of the exciplex. The lowest triplet excitation energy level of the exciplex is higher than or equal to the lowest singlet excitation energy level of the guest material.

In the above structure, the second triplet excitation energy level of the guest material is preferably higher than or equal to the lowest singlet excitation energy level of the exciplex.

In each of the above structures, the thermally activated delayed fluorescence emission energy of the exciplex is preferably higher than or equal to the fluorescence emission energy of the guest material.

In each of the above structures, it is preferable that the exciplex have a difference of more than 0 eV and less than or equal to 0.2 eV between the lowest singlet excitation energy level and the lowest triplet excitation energy level.

In each of the above structures, the guest material preferably emits light.

In each of the above structures, the guest material preferably includes at least one skeleton selected from anthracene, tetracene, chrysene, pyrene, perylene, and acridine and at least one substituent selected from an aromatic amine, an alkyl group, and an aryl group.

In each of the above structures, the skeleton is preferably bonded to the substituent.

In the above structure, it is preferable that the skeleton be bonded to the two substituents and that the two substituents have the same structure.

Another embodiment of the present invention is a display device which includes the light-emitting element with any of the above structures and a color filter, a seal, a or a transistor. Another embodiment of the present invention is an electronic device which includes the display device and a housing or a touch sensor. Another embodiment of the present invention is a lighting device which includes the light-emitting element with any of the above-described structures and a housing or a touch sensor.

One embodiment of the present invention makes it possible to provide a light-emitting element having high emission efficiency which includes a material emitting fluorescence as a light-emitting material. One embodiment of the present invention makes it possible to provide a highly reliable light-emitting element. One embodiment of the present invention makes it possible to provide a light-emitting element with high reliability and high emission efficiency. One embodiment of the present invention makes it possible to provide a novel light-emitting element. One embodiment of the present invention makes it possible to provide a novel light-emitting element with high emission efficiency and low power consumption.

Note that the description of these effects does not disturb the existence of other effects. One embodiment of the present invention does not necessarily achieve all the effects listed above. Other effects will be apparent from and can be derived from the description of the specification, the drawings, the claims, and the like.

DETAILED DESCRIPTION OF THE INVENTION

Figure 1A:
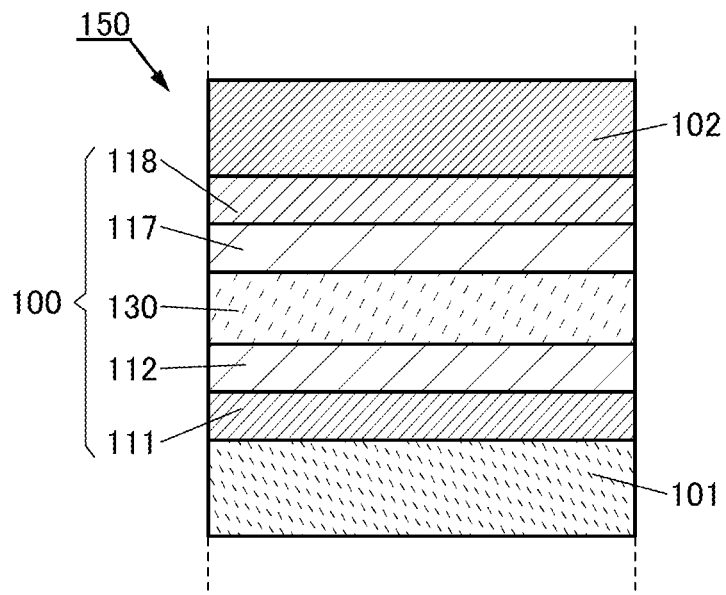
FIGS. 1A and 1B are schematic cross-sectionals views of a light-emitting element of one embodiment of the present invention and FIG. 1C is a schematic diagram illustrating the correlation of energy levels.

Embodiments of the present invention will be explained below with reference to the drawings. Note that the present invention is not limited to the following description, and various changes and modifications can be made without departing from the spirit and scope of the present invention. Accordingly, the present invention should not be interpreted as being limited to the content of the embodiments below.

Note that the position, the size, the range, or the like of each structure illustrated in drawings and the like is not accurately represented in some cases for simplification. Therefore, the disclosed invention is not necessarily limited to the position, the size, the range, or the like disclosed in the drawings and the like.

Ordinal numbers such as "first" and "second" in this specification and the like are used for convenience and do not denote the order of steps or the stacking order of layers in some cases. Therefore, for example, description can be made even when "first" is replaced with "second" or "third", as appropriate. In addition, the ordinal numbers in this specification and the like are not necessarily the same as those which specify one embodiment of the present invention.

In the description of modes of the present invention in this specification and the like with reference to the drawings, the same components in different diagrams are commonly denoted by the same reference numeral in some cases.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In this specification and the like, a singlet excited state means a singlet state having excited energy. Among singlet excited states, an excited state having the lowest energy is referred to as the lowest singlet excited state.

In this specification and the like, a singlet excitation energy level means an energy level in a singlet excited state. Among singlet excitation energy levels, the lowest excitation energy level is referred to as the lowest singlet excitation energy level.

In this specification and the like, a triplet excited state means a triplet state having excited energy. Among triplet excited states, an excited state having the lowest energy is referred to as the lowest triplet excited state. Among triplet excited states, an excited state having higher energy than the lowest triplet excited state is referred to as a higher triplet excited states. Among higher triplet excited states, an excited state having the lowest energy is referred to as the second triplet excited state.

In this specification and the like, a triplet excitation energy level means an energy level in a triplet excited state. Among triplet excitation energy levels, the lowest excitation energy level is referred to as the lowest triplet excitation energy level. Among triplet excitation energy levels, an energy level higher than the lowest triplet excitation energy level is referred to as a higher triplet excitation energy levels. Among higher triplet excitation energy levels, the lowest energy level is referred to as the second triplet excitation energy level.

In this specification and the like, a fluorescent material refers to a material that emits light in the visible light region when the singlet excited state relaxes to the ground state. A phosphorescent material refers to a material that emits light in the visible light region at room temperature when the triplet excited state relaxes to the ground state. That is, a phosphorescent material refers to a material that can convert triplet excitation energy into visible light.

In this specification and the like, a thermally activated delayed fluorescent substance is a material which can generate a singlet excited state from a triplet excited state by reverse intersystem crossing and thermal activation. The thermally activated delayed fluorescent substance may include a material which can generate a singlet excited state by itself from a triplet excited state by reverse intersystem crossing, for example, a material which emits TADF. Alternatively, the thermally activated delayed fluorescent substance may include a combination of two kinds of materials which form an exciplex.

It also can be said that the thermally activated delayed fluorescent substance is a material of which a triplet excited state is close to a singlet excited state. Specifically, a material in which the difference between the energy levels of the triplet excited state and the singlet excited state is more than 0 eV and less than or equal to 0.2 eV is preferably used. That is, it is preferable that the difference between the energy levels of the triplet excited state and the singlet excited state be more than 0 eV and less than or equal to 0.2 eV in a material which can generate a singlet excited state by itself from a triplet excited state by reverse intersystem crossing, for example, a material which emits TADF, or it is preferable that the difference between the energy levels of the triplet excited state and the singlet excited state be more than 0 eV and less than or equal to 0.2 eV in an exciplex.

In this specification and the like, a thermally activated delayed fluorescence emission energy refers to an emission peak (including a shoulder) on the shortest wavelength side of thermally activated delayed fluorescence. In this specification and the like, a phosphorescence emission energy or a triplet excitation energy refers to a phosphorescence emission peak (including a shoulder) on the shortest wavelength side of phosphorescence emission. Note that the phosphorescence emission can be observed by time-resolved photoluminescence in a low-temperature (e.g., 10 K) environment.

Note that in this specification and the like, room temperature refers to a temperature in the range from 0° C. to 40° C.

Embodiment 1

In this embodiment, a light-emitting element of one embodiment of the present invention will be described below with reference to FIGS. 1A to 1C, FIG. 2, and FIGS. 3A and 3B.

1. Structure Example 1 of Light-Emitting Element

First, a structure of a light-emitting element of one embodiment of the present invention will be described below with reference to FIGS. 1A to 1C.

FIG. 1A is a schematic cross-sectional view of a light-emitting element 150 of one embodiment of the present invention.

The light-emitting element 150 includes an EL layer 100 between a pair of electrodes (an electrode 101 and an electrode 102). The EL layer 100 includes at least a light-emitting layer 130. Note that in this embodiment, description is given assuming that the electrode 101 and the electrode 102 serve as an anode and a cathode, respectively.

The EL layer 100 illustrated in FIG. 1A includes functional layers which are a hole-injection layer 111, a hole-transport layer 112, an electron-transport layer 117, and an electron-injection layer 118 in addition to the light-emitting layer 130. Note that the structure of the EL layer 100 is not limited to the structure illustrated in FIG. 1A, and a structure may be employed in which at least one selected from the hole-injection layer 111, the hole-transport layer 112, the electron-transport layer 117, and the electron-injection layer 118 is included. Alternatively, the EL layer 100 may include a functional layer which is capable of lowering a hole injection barrier or an electron injection barrier, improving a hole-transport property or an electron-transport property, inhibiting a hole-transport property or an electron-transport property, or suppressing a quenching phenomenon by an electrode, for example.

Figure 1B:
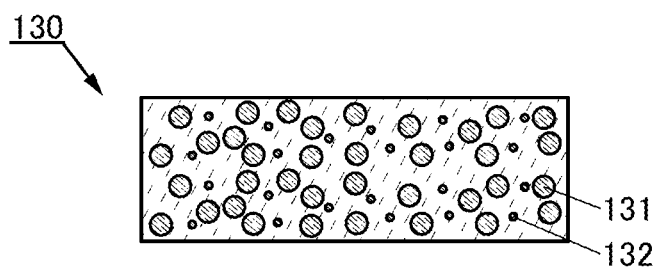

FIG. 1B is a schematic cross-sectional view of an example of the light-emitting layer 130 in FIG. 1A. The light-emitting layer 130 in FIG. 1B includes a host material 131 and a guest material 132.

The host material 131 preferably has a function of converting triplet excitation energy into singlet excitation energy by reverse intersystem crossing. Thus, part of the triplet excitation energy generated in the light-emitting layer 130 is converted into the singlet excitation energy by the host material 131 and transferred to the guest material 132, so that it can be extracted as phosphorescence. In order to achieve this, the host material 131 preferably has a difference of more than 0 eV and less than or equal to 0.2 eV between the lowest singlet excitation energy level and the lowest triplet excitation energy level. It is particularly preferable that the host material 131 be a substance which exhibits thermally activated delayed fluorescence at room temperature, that is, a thermally activated delayed fluorescent substance.

Note that the host material 131 may be composed of a single material or may include a plurality of materials. The guest material 132 may be a light-emitting organic material, and the light-emitting organic material is preferably a material capable of emitting fluorescence (hereinafter also referred to as a fluorescent material). An example in which a fluorescent material is used as the guest material 132 will be described below. Note that the guest material 132 may be read as the fluorescent material.

1-1. Emission Mechanism of Light-Emitting Element

First, an emission mechanism of the light-emitting element 150 will be described below.

In the light-emitting element 150 of one embodiment of the present invention, voltage application between a pair of electrodes (the electrodes 101 and 102) causes electrons and holes to be injected from the cathode and the anode, respectively, into the EL layer 100 and thus current flows. By recombination of the injected electrons and holes, the guest material 132 in the light-emitting layer 130 of the EL layer 100 is brought into an excited state to provide light emission.

Note that light emission from the guest material 132 can be obtained through the following two processes:
direct recombination process (α); and
energy transfer process (β).

1-2. Direct Recombination Process (α)

First, the direct recombination process in the guest material 132 will be described. Carriers (electrons and holes) are recombined in the guest material 132, and the guest material 132 is brought into an excited state. In the case where the excited state of the guest material 132 is a singlet excited state, fluorescence is obtained. In contrast, in the case where the excited state of the guest material 132 is a triplet excited state, thermal deactivation occurs.

In the direct recombination process in the above (a), if the guest material 132 has high fluorescence quantum yield, light emission can be obtained efficiently from the singlet excited state of the guest material 132. However, the triplet excited state of the guest material 132 does not contribute to light emission due to thermal deactivation.

1-3. Energy Transfer Process (β)

Figure 1C:
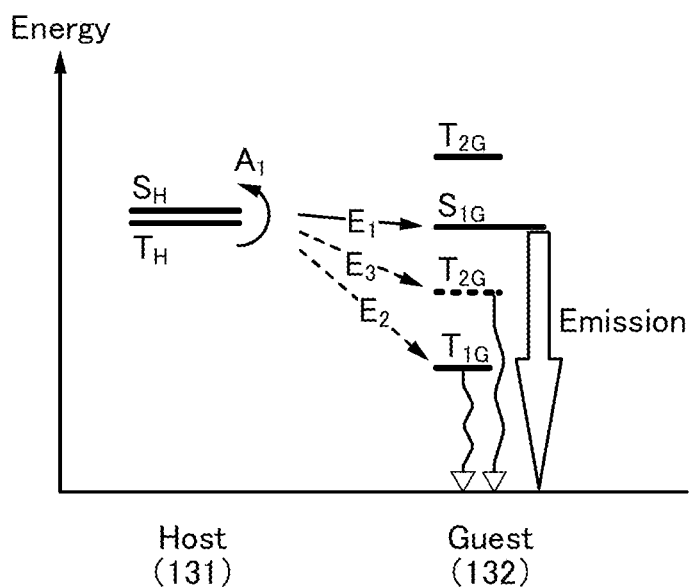

Next, in order to describe the energy transfer process of the host material 131 and the guest material 132, a schematic diagram illustrating the correlation of energy levels is shown in FIG. 1C. The following explains what terms and signs in FIG. 1C represent:
Host (131): the host material 131
Guest (132): the guest material 132 (fluorescent material)
$S_H$: the lowest singlet excitation energy level of the host material 131
$T_H$: the lowest triplet excitation energy level of the host material 131
$S_{1G}$: the lowest singlet excitation energy level of the guest material 132 (fluorescent material)
$T_{1G}$: the lowest triplet excitation energy level of the guest material 132 (fluorescent material)
$T_{2G}$: the second triplet excitation energy level of the guest material 132 (fluorescent material)

Carriers are recombined in the host material 131, and the host material 131 is brought into an excited state. At this time, in the case where the excited state of the host material 131 is a singlet excited state and the $S_H$ of the host material 131 is higher than or equal to the $S_{1G}$ of the guest material 132, as shown by a route $E_1$ in FIG. 1C, the singlet excited energy of the host material 131 is transferred from the host material 131 to the guest material 132, so that the guest material 132 is brought into the singlet excited state. Fluorescence is obtained from the guest material 132 in the singlet excited state.

Note that since direct transition of the guest material 132 from a singlet ground state to a triplet excited state is forbidden, energy transfer from the host material 131 in the singlet excited state to the guest material 132 in the triplet excited state is unlikely to be a main energy transfer process; therefore, a description thereof is omitted here. In other words, energy transfer from the host material 131 in the singlet excited state to the guest material 132 in the singlet excited state is important as represented by the following general formula (G1).

$$^1H^* + {}^1G \rightarrow {}^1H + {}^1G^* \tag{G1}$$

Note that in the general formula (G1), $^1H^*$ represents the lowest singlet excited state of the host material 131; $^1G$ represents the singlet ground state of the guest material 132; $^1H$ represents the singlet ground state of the host material 131; and $^1G^*$ represents the lowest singlet excited state of the guest material 132.

Accordingly, in the case where the excited state of the host material 131 is a singlet excited state, the lowest singlet excitation energy level ($S_H$) of the host material 131 is preferably higher than or equal to the lowest singlet excitation energy level ($S_{1G}$) of the guest material 132.

When the excited state of the host material 131 is produced, fluorescence can be obtained through the following two processes in the case where the spin state is triplet.

Since the host material 131 has a function of converting part of the triplet excitation energy into the singlet excitation energy by reverse intersystem crossing, in a first process, excitation energy is transferred from the $T_H$ to the $S_H$ of the host material 131 by reverse intersystem crossing (upconversion) as shown by a route $A_1$ in FIG. 1C.

In a subsequent second process, in the case where the $S_H$ of the host material 131 is higher than or equal to the $S_{1G}$ of the guest material 132, excitation energy is transferred from the $S_H$ of the host material 131 to the $S_{1G}$ of the guest material 132 as shown by a route $E_1$ in FIG. 1C, whereby the guest material 132 is brought into the singlet excited state. Fluorescence is obtained from the guest material 132 in the singlet excited state.

The above-described first and second processes are represented by the following general formula (G2).

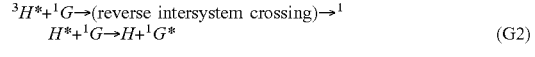
$$^3H^* + {}^1G \rightarrow \text{(reverse intersystem crossing)} \rightarrow {}^1H^* + {}^1G \rightarrow {}^1H + {}^1G^* \tag{G2}$$

Note that in the general formula (G2), $^3H^*$ represents the lowest triplet excited state of the host material 131; $^1G$ represents the singlet ground state of the guest material 132;

$^1$H* represents the lowest singlet excited state of the host material 131; $^1$H represents the singlet ground state of the host material 131; and $^1$G* represents the lowest singlet excited state of the guest material 132.

As represented by the general formula (G2), the lowest singlet excited state ($^1$H*) of the host material 131 is generated from the lowest triplet excited state ($^3$H*) of the host material 131 by reverse intersystem crossing, and then excitation energy is transferred to the lowest singlet excited state ($^1$G*) of the guest material 132.

When all the energy transfer processes described above in the energy transfer process (β) occur efficiently, both the triplet excitation energy and the singlet excitation energy of the host material 131 are efficiently converted into the lowest singlet excited state ($^1$G*) of the guest material 132. Thus, high-efficiency light emission is possible.

However, before excitation energy is transferred from the singlet excited state of the host material 131 to the singlet excited state of the guest material 132, when the host material 131 is deactivated by emitting the excitation energy as light or heat, the emission efficiency is decreased. In addition, the emission efficiency is also decreased by a decrease in efficiency of A$_1$, which is the previous process where the host material 131 is transferred from a triplet excited state to a singlet excited state by reverse intersystem crossing. The energy difference between T$_H$ and S$_H$ is large particularly when T$_H$ of the host material 131 is lower than T$_{1G}$ of the guest material 132 and S$_H$≥S$_{1G}$>T$_{1G}$>T$_H$ is satisfied. As a result, the reverse intersystem crossing shown by the route A$_1$ in FIG. 1C is unlikely to occur; accordingly, the subsequent energy transfer process shown by the route E$_1$ is reduced to lower efficiency for generating a singlet excited state of the guest material 132. Therefore, the lowest triplet excitation energy level (T$_H$) of the host material 131 is preferably higher than or equal to the lowest triplet excitation energy level (T$_{1G}$) of the guest material 132.

Note that in the case where excitation energy is transferred from the T$_H$ of the host material 131 to the T$_{1G}$ of the guest material 132 as shown by a route E$_2$ in FIG. 1C, the excitation energy is also thermally deactivated. Therefore, it is preferable that the energy transfer process shown by the route E$_2$ in FIG. 1C be less likely to occur because the generation efficiency of the triplet excited state of the guest material 132 can be decreased and the occurrence of thermal deactivation can be reduced. To achieve this, it is preferable that the concentration of the guest material 132 with respect to the host material 131 be low.

Note that when the direct recombination process in the guest material 132 is dominant, a large number of triplet excited states of the guest material 132 are generated in the light-emitting layer, resulting in a decreased emission efficiency due to thermal deactivation. That is, it is preferable that the probability of the energy transfer process (β) be higher than that of the direct recombination process (α) because the generation efficiency of the triplet excited state of the guest material 132 can be reduced and thus the occurrence of thermal deactivation can be reduced. To achieve this, it is preferable that the concentration of the guest material 132 with respect to the host material 131 be low.

Next, factors controlling the above-described processes of intermolecular energy transfer between the host material 131 and the guest material 132 will be described. As mechanisms of the intermolecular energy transfer, two mechanisms, i.e., Förster mechanism (dipole-dipole interaction) and Dexter mechanism (electron exchange interaction), have been proposed.

1-4. Förster Mechanism

In Förster mechanism, energy transfer does not require direct contact between molecules and energy is transferred through a resonant phenomenon of dipolar oscillation between the host material 131 and the guest material 132. By the resonant phenomenon of dipolar oscillation, the host material 131 provides energy to the guest material 132, and thus, the host material 131 in an excited state is put in a ground state and the guest material 132 in a ground state is put in an excited state. Note that the rate constant $k_{h^* \to g}$ of Förster mechanism is expressed by Formula (1).

[Formula 1]

$$k_{h^* \to g} = \frac{9000c^4 K^2 \phi \ln 10}{128\pi^5 n^4 N \tau R^6} \int \frac{f'_h(v)\varepsilon_g(v)}{v^4} dv \quad (1)$$

In Formula (1), ν denotes a frequency, f'$_h$(ν) denotes a normalized emission spectrum of the host material 131 (a fluorescent spectrum in energy transfer from a singlet excited state, and a phosphorescent spectrum in energy transfer from a triplet excited state), ε$_g$(ν) denotes a molar absorption coefficient of the guest material 132, N denotes Avogadro's number, n denotes a refractive index of a medium, R denotes an intermolecular distance between the host material 131 and the guest material 132, τ denotes a measured lifetime of an excited state (fluorescence lifetime or phosphorescence lifetime), c denotes the speed of light, φ denotes a luminescence quantum yield (a fluorescence quantum yield in energy transfer from a singlet excited state, and a phosphorescence quantum yield in energy transfer from a triplet excited state), and K$^2$ denotes a coefficient (0 to 4) of orientation of a transition dipole moment between the host material 131 and the guest material 132. Note that K$^2$=⅔ in random orientation.

1-5. Dexter Mechanism

In Dexter mechanism, the host material 131 and the guest material 132 are close to a contact effective range where their orbitals overlap, and the host material 131 in an excited state and the guest material 132 in a ground state exchange their electrons, which leads to energy transfer. Note that the rate constant $k_{h^* \to g}$ of Dexter mechanism is expressed by Formula (2).

[Formula 2]

$$k_{h^* \to g} = \left(\frac{2\pi}{h}\right) K^2 \exp\left(-\frac{2R}{L}\right) \int f'_h(v)\varepsilon'_g(v) dv \quad (2)$$

In Formula (2), h denotes a Planck constant, K denotes a constant having an energy dimension, ν denotes a frequency, f'$_h$(ν) denotes a normalized emission spectrum of the host material 131 (a fluorescent spectrum in energy transfer from a singlet excited state, and a phosphorescent spectrum in energy transfer from a triplet excited state), ε'$_g$(ν) denotes a normalized absorption spectrum of the guest material 132, L denotes an effective molecular radius, and R denotes an intermolecular distance between the host material 131 and the guest material 132.

Here, the efficiency of energy transfer from the host material 131 to the guest material 132 (energy transfer efficiency φ$_{ET}$) is expressed by Formula (3). In the formula, $k_r$ denotes a rate constant of a light-emission process (fluorescence in energy transfer from a singlet excited state, and phosphorescence in energy transfer from a triplet excited state) of the host material 131, $k_n$ denotes a rate constant of a non-light-emission process (thermal deactivation or intersystem crossing) of the host material 131, and τ denotes a measured lifetime of an excited state of the host material 131.

[Formula 3]

$$\phi_{ET} = \frac{k_{h^* \to g}}{k_r + k_n + k_{h^* \to g}} = \frac{k_{h^* \to g}}{\left(\frac{1}{\tau}\right) + k_{h^* \to g}} \quad (3)$$

According to Formula (3), it is found that the energy transfer efficiency $\phi_{ET}$ can be increased by increasing the rate constant $k_{h^* \to g}$ of energy transfer so that another competing rate constant $k_r + k_n$ (=1/τ) becomes relatively small.

1-6. Concept for Promoting Energy Transfer

In both the energy transfer processes of the general formulae (G1) and (G2), since energy is transferred from the singlet excited state ($^1H^*$) of the host material 131 to the singlet excited state ($^1G^*$) of the guest material 132, energy transfers by both Förster mechanism (Formula (1)) and Dexter mechanism (Formula (2)) occur.

First, an energy transfer by Förster mechanism is considered. When τ is eliminated from Formula (1) and Formula (3), it can be said that the energy transfer efficiency $\phi_{ET}$ is higher when the quantum yield φ (here, a fluorescence quantum yield because energy transfer from a singlet excited state is discussed) is higher. However, in practice, a more important factor is that the emission spectrum of the host material 131 (here, a fluorescent spectrum because energy transfer from a singlet excited state is discussed) largely overlaps with the absorption spectrum of the guest material 132 (absorption corresponding to the transition from the singlet ground state to the singlet excited state). Note that it is preferable that the molar absorption coefficient of the guest material 132 be also high. This means that the emission spectrum of the host material 131 overlaps with the absorption band of the guest material 132 which is on the longest wavelength side.

Next, an energy transfer by Dexter mechanism is considered. According to Formula (2), in order to increase the rate constant $k_{h^* \to g}$, it is preferable that an emission spectrum of the host material 131 (here, a fluorescent spectrum because energy transfer from a singlet excited state is discussed) largely overlap with an absorption spectrum of the guest material 132 (absorption corresponding to transition from a singlet ground state to a singlet excited state).

The above description suggests that the energy transfer efficiency can be optimized by making the emission spectrum of the host material 131 overlap with the absorption band of the guest material 132 which is on the longest wavelength side.

In view of this, one embodiment of the present invention provides a light-emitting element which includes the host material 131 having a function as an energy donor capable of efficiently transferring energy to the guest material 132. A feature of the host material 131 is that the singlet excitation energy level and the triplet excitation energy level are close to each other. Specifically, it is preferable that the host material 131 have a difference of more than 0 eV and less than or equal to 0.2 eV between the lowest singlet excitation energy level ($S_H$) and the lowest triplet excitation energy level ($T_H$). This enables transition (reverse intersystem crossing) of the host material 131 from the lowest triplet excited state to the lowest singlet excited state to be likely to occur. Therefore, the generation efficiency of the singlet excited state of the host material 131, can be increased. Furthermore, in order to facilitate energy transfer from the singlet excited state of the host material 131 to the singlet excited state of the guest material 132 having a function as an energy acceptor, it is preferable that the emission spectrum of the host material 131 (here, the emission spectrum of a substance having a function of exhibiting thermally activated delayed fluorescence) overlap with the absorption band of the guest material 132 which is on the longest wavelength side. Thus, the generation efficiency of the singlet excited state of the guest material 132 can be increased.

1-7. Concept for Suppressing Energy Transfer

In order to efficiently convert the triplet excitation energy of the host material 131 into the singlet excitation energy by reverse intersystem crossing, it is important to prevent the transfer of the triplet excitation energy of the host material 131 to the guest material 132 without through reverse intersystem crossing. That is, it is important to prevent an energy transfer process from the triplet excitation energy level of the host material 131 to the triplet excitation energy level of the guest material 132.

The energy transfer process from the triplet excited state of the host material 131 to the triplet excited state of the guest material 132 is an energy transfer by Dexter mechanism (Formula 2). In order to prevent the energy transfer by Dexter mechanism, it is preferable that a normalized emission spectrum of the host material 131 from a triplet excited state (a normalized phosphorescence spectrum) have as small overlap with a normalized absorption spectrum of the guest material 132 to the triplet excited state as possible. In order to achieve this, it is preferable that an energy difference between the triplet excitation energy level of the host material 131 and the triplet excitation energy level of the guest material 132 be as large as possible.

Note that in the case where the host material 131 is a thermally activated delayed fluorescent substance, the lowest triplet excitation energy level ($T_H$) of the host material 131 is close to the lowest singlet excitation energy level ($S_H$) of the host material 131, and thus is converted into the singlet excitation energy; accordingly, it may be difficult to observe a phosphorescence spectrum, which means light emission from the lowest triplet excitation energy level ($T_H$). In that case, the lowest triplet excitation energy level ($T_H$) of the host material 131 may be estimated from the light emission energy of the thermally activated delayed fluorescent substance.

It is difficult to observe an absorption spectrum at the time of the transition of the guest material 132 from the singlet ground state to the lowest triplet excited state because the transition is a forbidden transition. Therefore, the lowest triplet excitation energy level ($T_{1G}$) of the guest material 132 may be estimated from light emission energy of a phosphorescence spectrum of the guest material 132.

In order that the normalized emission spectrum of the host material 131 from the triplet excitation energy level (a phosphorescent spectrum or a thermally activated delayed fluorescent) has as small overlap with a normalized absorption spectrum of the guest material 132 to the triplet excitation energy (or a phosphorescent spectrum of the guest material 132) as possible, it is preferable that the lowest triplet excitation energy level ($T_H$) of the host material 131 be higher than or equal to the lowest triplet excitation energy level ($T_{1G}$) of the guest material 132 and that an energy difference between them be as large as possible. At this time, the lowest singlet excitation energy level ($S_H$) of the host material 131 is higher than or equal to the lowest triplet excitation energy level ($T_H$) of the host material 131 and thus is higher than or equal to the lowest triplet excitation energy level ($T_{1G}$) of the guest material 132. Accordingly, it is preferable that the thermally activated delayed fluorescence emission energy of the host material 131 be higher than or equal to the phosphorescence emission energy of the guest material 132 and that an energy difference between them be as large as possible. Specifically, an energy difference between the lowest triplet excitation energy level ($T_H$) of the host material 131 and the lowest triplet excitation energy level ($T_{1G}$) of the guest material 132 is preferably higher than or equal to 0.5 eV, further preferably higher than or equal to 1.0 eV. An energy difference between the thermally activated delayed fluorescence emission energy of the host material 131 and the phosphorescence emission energy of the guest material 132 is preferably higher than or equal to 0.5 eV, further preferably higher than or equal to 1.0 eV.

Note that in the case where the second triplet excitation energy level ($T_{2G}$) having higher energy than the lowest triplet excitation energy level ($T_{1G}$), among the triplet excitation energy levels of the guest material 132, is lower than the lowest singlet excitation energy level ($S_{1G}$), an energy difference between the second triplet excitation energy level ($T_{2G}$) of the guest material 132 and the lowest triplet excitation energy level ($T_H$) of the host material 131 is small. In the case where the lowest triplet excitation energy level ($T_H$) of the host material 131 is higher than the second triplet excitation energy level ($T_{2G}$) of the guest material 132, as shown by a route $E_3$ in FIG. 1C, the triplet excitation energy of the host material 131 is easily transferred from the lowest triplet excitation energy level ($T_H$) of the host material 131 to the second triplet excitation energy level ($T_{2G}$) of the guest material 132. That is, the generation probability of the triplet excited state in the guest material 132 is increased, and thus thermal deactivation from excited states is more likely to occur. Therefore, reverse intersystem crossing shown by the route $A_1$ and the subsequent energy transfer process shown by the route $E_1$ are less likely to occur, which reduces the generation efficiency of the singlet excited state of the guest material 132. That is, it is preferable that the energy transfer process shown by the route $E_3$ in FIG. 1C be less likely to occur because the generation efficiency of the triplet excited state of the guest material 132 can be decreased and thermal deactivation can be reduced.

In order to suppress the above-described energy transfer process, the second triplet excitation energy level ($T_{2G}$) of the guest material 132 is preferably higher than or equal to the lowest singlet excitation energy level of the guest material 132.

Furthermore, it is preferable that the second triplet excitation energy level ($T_{2G}$) of the guest material 132 be higher than or equal to the lowest triplet excitation energy level ($T_H$) of the host material 131, and that the lowest triplet excitation energy level ($T_H$) of the host material 131 be higher than or equal to the lowest triplet excitation energy level ($T_{1G}$) of the guest material 132.

In order to suppress the energy transfer process shown by the route $E_3$ in FIG. 1C and efficiently cause reverse intersystem crossing shown by the route $A_1$ and the subsequent energy transfer process shown by the route $E_1$, it is further preferable that the second triplet excitation energy level ($T_{2G}$) of the guest material 132 be higher than or equal to the lowest triplet excitation energy level ($T_H$) of the host material 131 and that the lowest triplet excitation energy level ($T_H$) of the host material 131 be higher than or equal to the lowest singlet excitation energy level ($S_{1G}$) of the guest material 132. When the host material 131 is a thermally activated delayed fluorescent substance, the lowest singlet excitation energy level ($S_H$) of the host material 131 is higher than or equal to the lowest triplet excitation energy level ($T_H$) of the host material 131 and thus higher than or equal to the lowest singlet excitation energy level ($S_{1G}$) of the guest material 132. That is, the thermally activated delayed fluorescence emission energy of the host material 131 is preferably higher than or equal to the fluorescence emission energy of the guest material 132.

It is still further preferable that the second triplet excitation energy level ($T_{2G}$) of the guest material 132 be higher than or equal to the lowest singlet excitation energy level ($S_H$) of the host material 131. At this time, the lowest triplet excitation energy level ($T_H$) of the host material 131 is lower than the lowest singlet excitation energy level ($S_H$) of the host material 131, and thus the energy transfer from the lowest triplet excitation energy level ($T_H$) of the host material 131 to the second triplet excitation energy level ($T_{2G}$) of the guest material 132 can be suppressed effectively. As a result, the generation efficiency of the singlet excited state of the guest material 132 can be improved, leading to improvement in the emission efficiency of a light-emitting element.

1-8. Material

The guest material 132 having any of the above energy levels in the light-emitting layer 130 is preferably a material including at least one skeleton selected from anthracene, tetracene, chrysene, pyrene, perylene, and acridine, and at least one substituent selected from an aromatic amine, an alkyl group, and an aryl group. It is preferable to use a material which includes the skeleton bonded to the substituent because the structure stabilizes the lowest singlet excitation energy level, and the second triplet excitation energy level is likely to be higher than or equal to the lowest singlet excitation energy level. Furthermore, it is preferable to use a material which includes the skeleton bonded to the two substituents which have the same structure each other because the structure stabilizes the lowest singlet excitation energy level, and the second triplet excitation energy level is likely to be higher than or equal to the lowest singlet excitation energy level. An organic material including the skeleton is preferably used as a light-emitting material because of its high fluorescent quantum yield and its high reliability.

As an aromatic amine which is an example of substituents included in the guest material 132, tertiary amine not including an NH group, in particular, an arylamine skeleton is preferably used. As an aryl group of an aryl skeleton, a substituted or unsubstituted aryl group having 6 to 13 carbon atoms is preferable and examples thereof include a phenyl group, a naphthyl group, and a fluorenyl group. The aryl group may have a substituent, and the above substituents may be bonded to form a ring. As the substituent, an alkyl group having 1 to 6 carbon atoms, a cycloalkyl group having 3 to 6 carbon atoms, or an aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, an n-hexyl group, and the like. Specific examples of a cycloalkyl group having 3 to 6 carbon atoms include a cyclopropyl group, a cyclobutyl group, a cyclopentyl group, a cyclohexyl group, and the like. Specific examples of the aryl group having 6 to 13 carbon atoms include a phenyl group, a naphthyl group, a biphenyl group, a fluorenyl group, and the like. As an example in which substituents are bonded to form a ring, in the case where a carbon at the 9-position in a fluorene skeleton has two phenyl groups as substituents, which means a spirofluorene skeleton formed by the bond of the phenyl groups, can be given. Note that an unsubstituted group has an advantage in easy synthesis and an inexpensive raw material.

As an alkyl group and an aryl group which are examples of substituents in the guest material 132, an alkyl group having 1 to 6 carbon atoms, a cycloalkyl group having 3 to 6 carbon atoms, or a substituted or unsubstituted aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, an n-hexyl group and the like. Specific examples of a cycloalkyl group having 3 to 6 carbon atoms include a cyclopropyl group, a cyclobutyl group, a cyclopentyl group, a cyclohexyl group, and the like. Specific examples of the aryl group having 6 to 13 carbon atoms include a phenyl group, a naphthyl group, a biphenyl group, a fluorenyl group, and the like. The aryl group may have a substituent, and substituents of the aryl group may be bonded to form a ring. As the substituent, an alkyl group having 1 to 6 carbon atoms, a cycloalkyl group having 3 to 6 carbon atoms, an aryl group having 6 to 13 carbon atoms, an aromatic amine, or a π-electron rich heteroaromatic ring can also be selected. Specific examples of the alkyl group having 1 to 6 carbon atoms include a methyl group, an ethyl group, a propyl group, an isopropyl group, a butyl group, an isobutyl group, a tert-butyl group, an n-hexyl group, and the like. Specific examples of a cycloalkyl group having 3 to 6 carbon atoms include a cyclopropyl group, a cyclobutyl group, a cyclopentyl group, a cyclohexyl group, and the like. Specific examples of the aryl group having 6 to 13 carbon atoms are a phenyl group, a naphthyl group, a biphenyl group, a fluorenyl group, and the like. As an aromatic amine, tertiary amine not including an NH group, in particular, an arylamine skeleton is preferably used. As an aryl group of an arylamine skeleton, a substituted or unsubstituted aryl group having 6 to 13 carbon atoms is preferable and examples thereof include a phenyl group, a naphthyl group, a fluorenyl group, and the like. As a π-electron rich heteroaromatic ring, a furan skeleton, a thiophene skeleton, or a pyrrole skeleton is preferable because of its high stability and its high reliability. As a furan skeleton, a dibenzofuran skeleton is preferable. As a thiophene skeleton, a dibenzothiophene skeleton is preferable. As a pyrrole skeleton, an indole skeleton or a carbazole skeleton is preferable. The π-electron rich heteroaromatic ring may further have a substituent. As an example in which substituents are bonded to form a ring, in the case where a carbon at the 9-position in a fluorene skeleton has two phenyl groups as substituents, a spirofluorene skeleton formed by the bond of the phenyl groups can be given. Note that an unsubstituted group has an advantage in easy synthesis and cost of a raw material.

Specific examples of a guest material having any of the above energy levels or any of the above structures include 9,10-diphenylanthracene (abbreviation: DPAnth, 9-[4-(10-phenyl-9-anthryl)phenyl]-9H-carbazole (abbreviation: CzPA), N,N,9-triphenylanthracen-9-amine (abbreviation: DPhAPhA), 9,10-bis(diphenylamino)anthracene (abbreviation: DPhA2A), N,N'-dipheny-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), 2,5,8,11-tetra(tert-butyl)perylene (abbreviation: TBP), N,N-diphenylquinacridone (abbreviation: DPQd), 5,6,11,12-tetraphenyl naphthacene (trivial name: rubrene), 6,12-bis(diphenylamino) chrysene (abbreviation: DPhA2C), and the like.

Table 1 shows the lowest singlet excitation energy levels, the lowest triplet excitation energy levels, and the second triplet excitation energy levels of examples of organic compounds which can be used for the above guest material 132. Furthermore, structures and abbreviations of these organic compounds are shown below.

[Chemical Formulae 1]

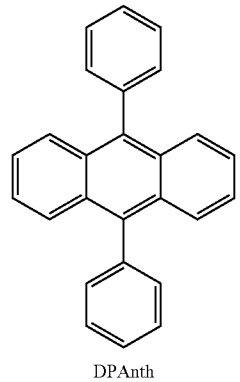

DPAnth

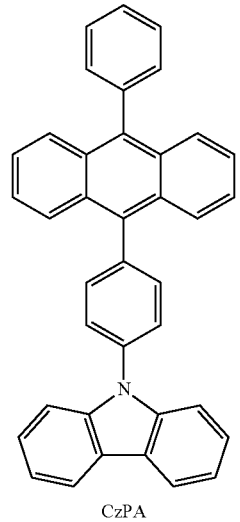

CzPA

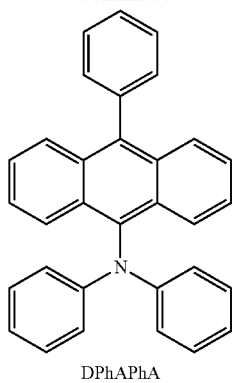
DPhAPhA
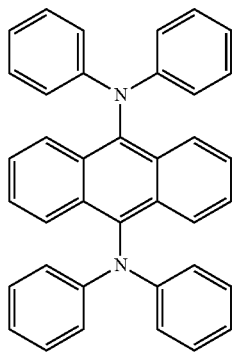
DPhA2A
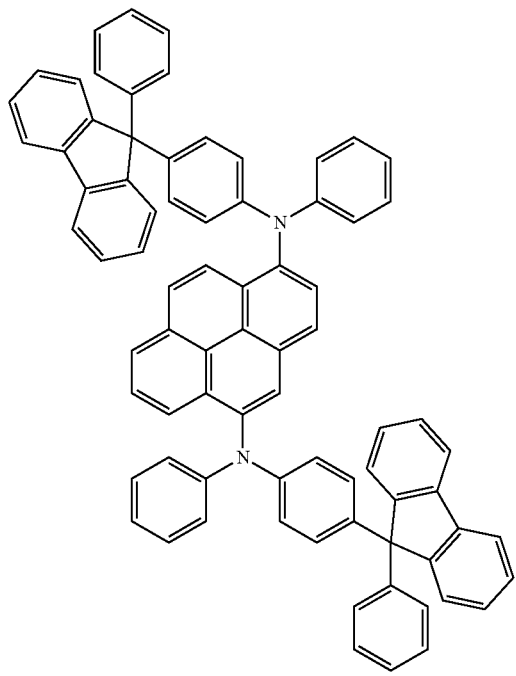
1,6FLPAPrn
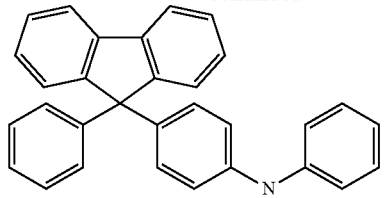
1,6mMemFLPAPrn
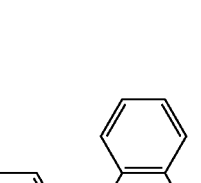
DPQd
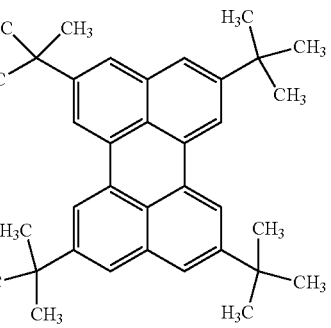
TBP -continued

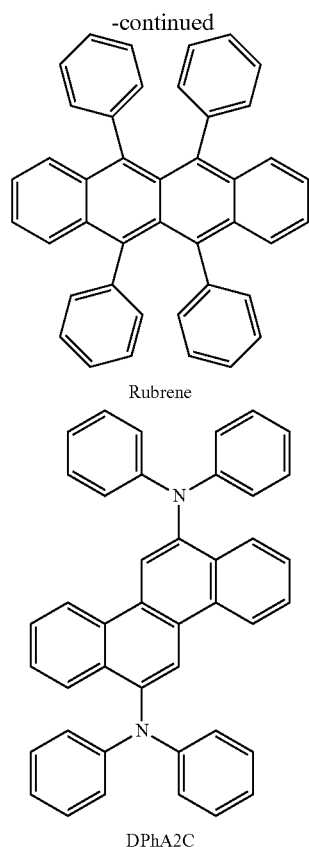

Rubrene

DPhA2C

TABLE 1

| Abbreviation | The second triplet excitation energy level $[T_2]$(eV) | The lowest singlet excitation energy level $[S_1]$(eV) | The lowest triplet excitation energy level $[T_1]$(eV) |
| --- | --- | --- | --- |
| DPAnth | 3.434 | 3.130 | 1.763 |
| CzPA | 3.233 | 3.123 | 1.763 |
| DPhAPhA | 2.642 | 2.567 | 1.695 |
| DPhA2A | 2.556 | 2.408 | 1.623 |
| 1,6FLPAPrn | 2.717 | 2.671 | 1.895 |
| 1,6mMemFLPAPrn | 2.726 | 2.672 | 1.887 |
| TBP | 3.035 | 2.859 | 1.645 |
| DPQd | 2.843 | 2.724 | 2.029 |
| Rubrene | 2.353 | 2.176 | 0.989 |
| DPhA2C | 2.961 | 2.883 | 2.210 |
| Perylene | 3.061 | 2.849 | 1.549 |

In order to obtain the energy levels in Table 1, the most stable structures in the singlet ground states of the above organic compounds were calculated using density functional theory (DFT). Note that Gaussian 09 was used as the quantum chemistry computational program. As a basis function, 6-311G(d,p) was used, and as a functional, B3LYP was used. A high performance computer (ICE X, manufactured by SGI Japan, Ltd) was used for the calculation. The singlet excitation energy levels and the triplet excitation energy levels were calculated using the time-dependent density functional theory (TD-DFT). In the DFT, the total energy is represented as the sum of potential energy, electrostatic energy between electrons, electronic kinetic energy, and exchange-correlation energy including all the complicated interactions between electrons. Also in the DFT, an exchange-correlation interaction is approximated by a functional (a function of another function) of one electron potential represented in terms of electron density to enable high-accuracy calculations.

In each of the organic compounds shown in Table 1, the second triplet excitation energy level is higher than or equal to the lowest singlet excitation energy level. Accordingly, any of the organic compounds shown in Table 1 is used as the guest material 132, whereby the energy transfer process of the triplet excitation energy shown by the route $E_3$ in FIG. 1C can be suppressed, and reverse intersystem crossing shown by the route $A_1$ and the subsequent energy transfer process of the singlet excitation energy shown by the route $E_1$ occur easily. Accordingly, the generation efficiency of the singlet excited state of the guest material 132 can be improved.

In the light-emitting layer 130, the host material 131 may be composed of one kind of compound or a plurality of compounds. It is preferable that the lowest triplet excitation energy level of the host material 131 is lower than or equal to the second triplet excitation energy level of the guest material 132 and that the lowest triplet excitation energy level of the host material 131 is higher than or equal to the lowest triplet excitation energy level of the guest material 132. For example, in the case where the host material 131 is composed of one kind of compound, any of the following compounds can be used.

First, a fullerene, a derivative thereof, an acridine derivative such as proflavine, and eosin can be given. Further, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2$(OEP)), which are shown in the following structural formulae. Structures and abbreviations of the above-described organic compounds are given below.

[Chemical Formulae 2]

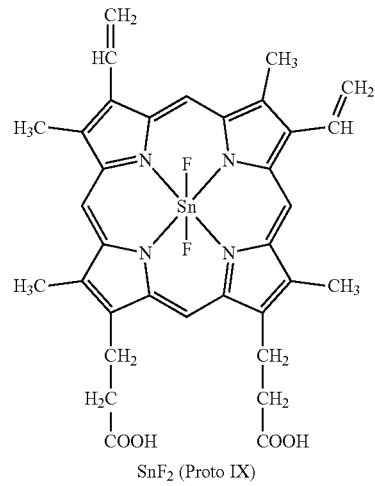

$SnF_2$ (Proto IX)

-continued
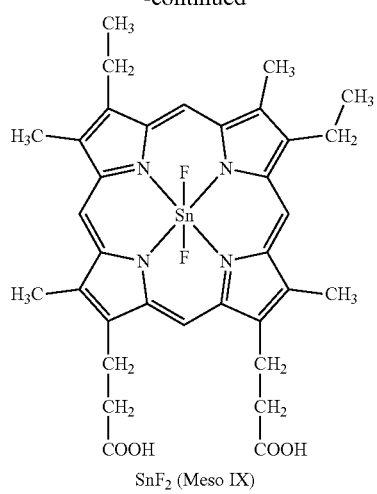
SnF₂ (Meso IX)
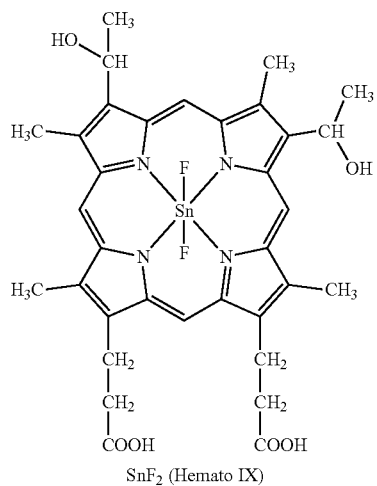
SnF₂ (Hemato IX)
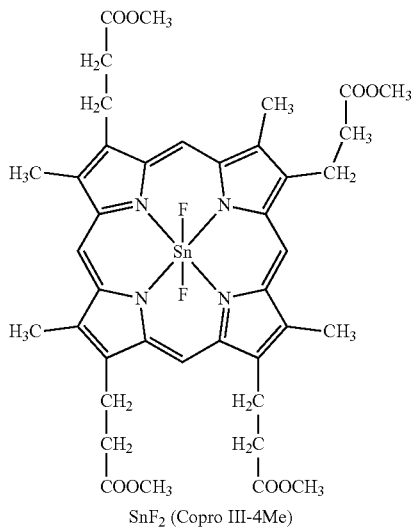
SnF₂ (Copro III-4Me)
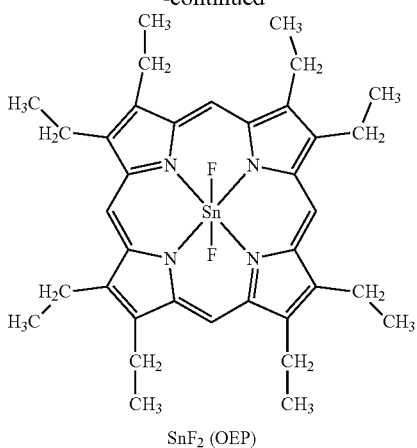
SnF₂ (OEP)
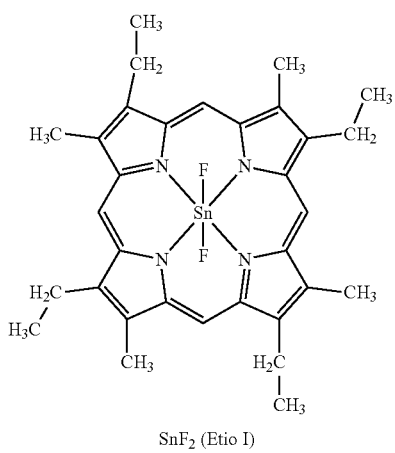
SnF₂ (Etio I)
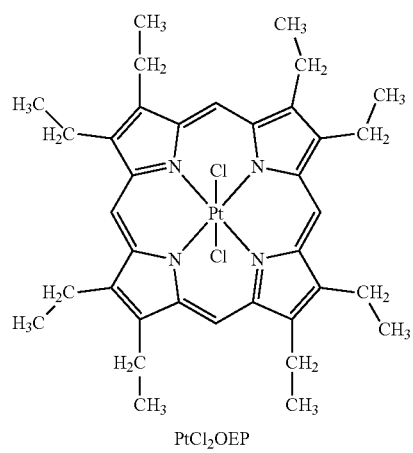
PtCl₂OEP Alternatively, a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (abbreviation: PIC-TRZ), 2-{4-[3(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazine-10-yl)phenyl]-4,6-diphenyl-1,3,5-triazine (abbreviation: PXZ-TRZ), 3-[4-(5-phenyl-5,10-dihydrophenazine-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) shown in the following structural formulae, can be used as the host material 131 composed of one kind of compound. The heterocyclic compound is preferably used because of the π-electron rich heteroaromatic ring and the π-electron deficient heteroaromatic ring, for which the electron-transport property and the hole-transport property are high. Note that a substance in which the π-electron rich heteroaromatic ring is directly bonded to the π-electron deficient heteroaromatic ring is particularly preferably used because the donor property of the π-electron rich heteroaromatic ring and the acceptor property of the π-electron deficient heteroaromatic ring are both increased and the difference between the energy level of the singlet excited state and the energy level of the triplet excited state becomes small.

Table 2 shows the lowest singlet excitation energy levels and the lowest triplet excitation energy levels of the above examples of organic compounds which can be used for the host material 131. Structures and abbreviations of the organic compounds are given below.

[Chemical Formulae 3]

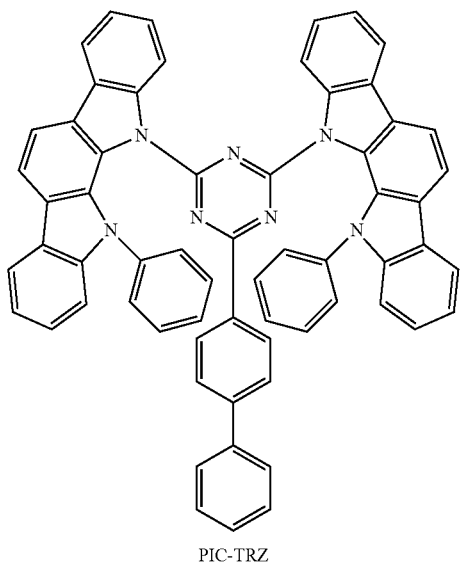

PIC-TRZ

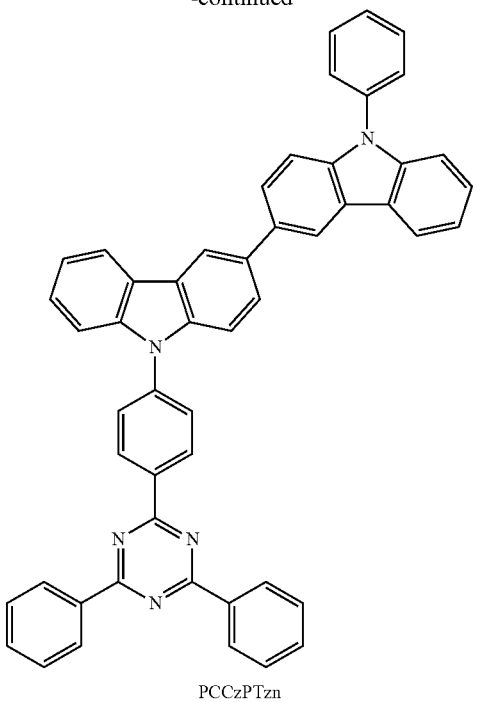

PCCzPTzn

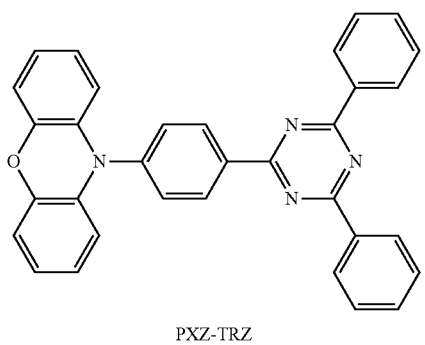

PXZ-TRZ

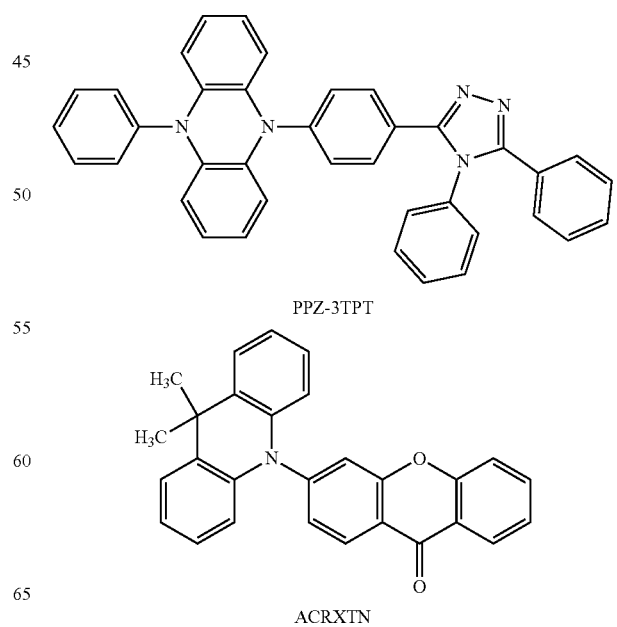

PPZ-3TPT

ACRXTN

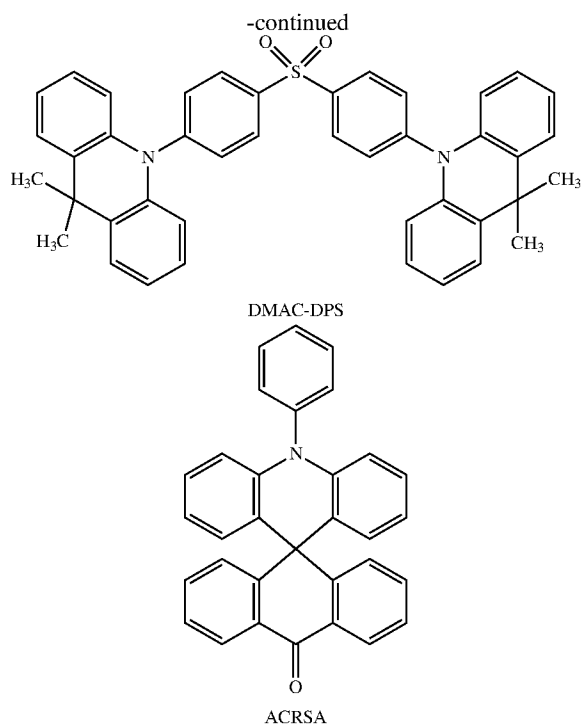

DMAC-DPS

ACRSA

TABLE 2

| Abbreviation | The lowest singlet excitation energy level [S₁](eV) | The lowest triplet excitation energy level [T₁](eV) |
|---|---|---|
| PIC-TRZ | 2.882 | 2.783 |
| PCCzPTzn | 2.755 | 2.572 |
| PXZ-TRZ | 2.113 | 2.106 |
| PPZ-3TPT | 2.342 | 2.334 |
| ACRXTN | 2.458 | 2.448 |
| DMAC-DPS | 2.737 | 2.727 |
| ACRSA | 2.842 | 2.821 |

The energy levels shown in Table 2 were calculated using a calculation method similar to that used in Table 1. In the light-emitting element of one embodiment of the present invention, it is preferable to select any of the organic compounds in Table 2 and any of the organic compounds in Table 1 as the host material 131 and the guest material 132, respectively, such that the second triplet excitation energy level of the guest material 132 is higher than or equal to the lowest triplet excitation energy level of the host material 131 and that the lowest triplet excitation energy level of the host material 131 is higher than or equal to the lowest triplet excitation energy level of the guest material 132. Thus, the energy transfer process of the triplet excitation energy shown by the route $E_3$ in FIG. 1C can be suppressed, and reverse intersystem crossing shown by the route $A_1$ and the subsequent energy transfer process of the singlet excitation energy shown by the route $E_1$ occur easily. Accordingly, the generation efficiency of the singlet excited state of the guest material 132 can be improved.

Each of the organic compounds in Table 2 has an energy difference of more than 0 eV and less than or equal to 0.2 eV between the lowest singlet excitation energy level and the lowest triplet excitation energy level. Accordingly, these organic compounds are compounds which can exhibit thermally activated delayed fluorescence at room temperature.

Here, transient fluorescent characteristics of PCCzPTzn were measured using time-resolved emission measurement.

The time-resolved emission measurement was performed on a thin-film sample in which PCCzPTzn was deposited over a quartz substrate to a thickness of 50 nm.

A picosecond fluorescence lifetime measurement system (manufactured by Hamamatsu Photonics K.K.) was used for the measurement. In this measurement, the thin film was irradiated with pulsed laser, and emission of the thin film which was attenuated from the laser irradiation underwent time-resolved measurement using a streak camera to measure the lifetime of fluorescent emission of the thin film. A nitrogen gas laser with a wavelength of 337 nm was used as the pulsed laser. The thin film was irradiated with pulsed laser with a pulse width of 500 ps at a repetition rate of 10 Hz. By integrating data obtained by the repeated measurement, data with a high S/N ratio was obtained. The measurement was performed at room temperature (in an atmosphere kept at 23° C.).

Figure 2:
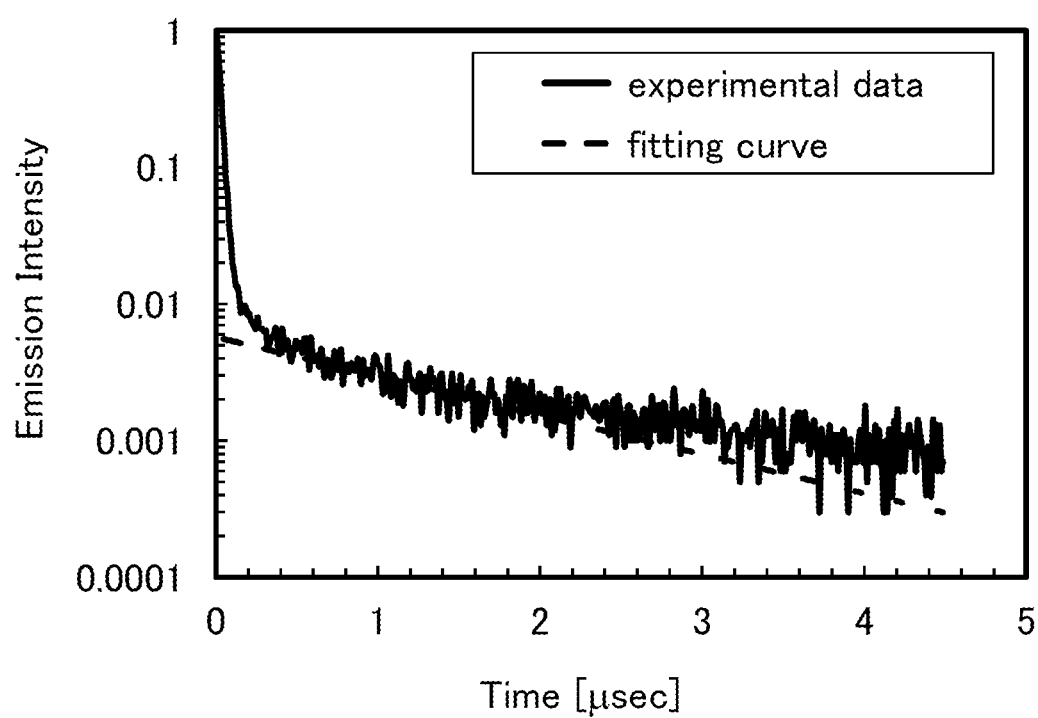
FIG. 2 shows transient fluorescence characteristics of a host material of one embodiment of the present invention.

FIG. 2 shows transient fluorescent characteristics of PCCzPTzn obtained by the measurement.

The attenuation curve shown in FIG. 2 was fitted with Formula 4.

[Formula 4]

$$L = \sum_{n=1}^{} A_n \exp\left(-\frac{t}{a_n}\right) \quad (4)$$

In Formula 4, L and t represent normalized emission intensity and elapsed time, respectively. The attenuation curve was able to be fitted when n was 1 to 3. This fitting results show that the emission component of the PCCzPTzn thin-film sample contains a fluorescent component having an emission lifetime of 0.015 μs and a delayed fluorescence component having an emission lifetime of 1.5 μs. In other words, it is found that PCCzPTzn is a thermally activated delayed fluorescence substance exhibiting delayed fluorescent at room temperature.

As described above, when the singlet excitation energy levels and the triplet excitation energy levels of the guest material 132 and the host material 131 in the light-emitting layer 130 are set as described above in one embodiment of the present invention, a light-emitting element with high emission efficiency can be provided.

Note that the light-emitting layer 130 can be formed by an evaporation method (including a vacuum evaporation method), an inkjet method, a coating method, gravure printing, or the like.

2. Structure Example 2 of Light-Emitting Element

Next, a structure different from the structure illustrated in FIGS. 1B and 1C will be described below with reference to FIGS. 3A and 3B.

Figure 3A:
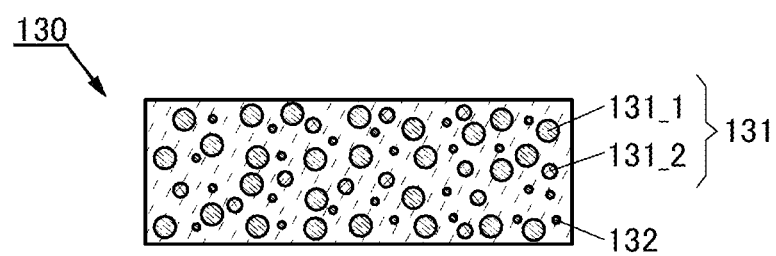
FIGS. 3A and 3B are a schematic cross-sectional view of a light-emitting layer in a light-emitting element of one embodiment of the present invention and a schematic diagram illustrating the correlation of energy levels.

FIG. 3A is a schematic cross-sectional view of an example of the light-emitting layer 130 in FIG. 1A. The light-emitting layer 130 in FIG. 3A includes the host material 131 and the guest material 132. The host material 131 includes an organic compound 131_1 and an organic compound 131_2.

It is preferable that a combination of the organic compound 131_1 and the organic compound 131_2 form an exciplex. An exciplex tends to have a very small difference between the singlet excitation energy level and the triplet excitation energy level, and thus transition (reverse intersystem crossing) from the triplet excited state to the singlet excited state is likely to occur.

Note that also in the case of using a host material 131 which allows a combination of the organic compound 131_1 and the organic compound 131_2 to form an exciplex, light emission from the guest material 132 can be obtained through the following two processes:
direct recombination process (α); and
energy transfer process (β).

Note that the direct recombination process (α) is not described here because it is similar to the process described above in the subsection 1-2.

2-1. Emission Mechanism Through Energy Transfer Process (β)

Although there is no limitation on the combination of the organic compound 131_1 and the organic compound 131_2 in the light-emitting layer 130 as long as an exciplex can be formed, it is preferred that one organic compound be a material having a hole-transport property and the other organic compound be a material having an electron-transport property. In that case, a donor-acceptor excited state is formed easily, which allows an exciplex to be formed efficiently. In the case where the combination of the organic compound 131_1 and the organic compound 131_2 is a combination of the material having a hole-transport property and the material having an electron-transport property, the carrier balance can be easily controlled depending on the mixture ratio. Specifically, the weight ratio of the material having a hole-transport property to the material having an electron-transport property is preferably within the range of 1:9 to 9:1. Since the carrier balance can be easily controlled with the above-described structure, a recombination region can also be easily controlled.

It is preferable that the exciplex formed by the organic compound 131_1 and the organic compound 131_2 have a difference of more than 0 eV and less than or equal to 0.2 eV between the lowest singlet excitation energy level and the lowest triplet excitation energy level. This enables transition (reverse intersystem crossing) of the exciplex from the triplet excitation energy level to the singlet excitation energy level to be likely to occur. Therefore, the generation efficiency of the singlet excited state of the exciplex, i.e., the host material 131, can be increased. Note that in order to efficiently make reverse intersystem crossing occur, the triplet excitation energy level of the exciplex is preferably lower than the triplet excitation energy level of each of the organic compounds (the organic compound 131_1 and the organic compound 131_2) which form the exciplex. Thus, quenching of the triplet excitation energy of the exciplex due to the organic compound 131_1 and the organic compound 131_2 is less likely to occur, which causes reverse intersystem crossing efficiently.

Furthermore, it is preferable that the emission spectrum of the host material 131 (here, the emission spectrum of the exciplex formed by the organic compound 131_1 and the organic compound 131_2) overlap with the absorption band of the guest material 132 which is on the longest wavelength side. This facilitates energy transfer from the singlet excited state of the host material 131 to the singlet excited state of the guest material 132. Therefore, the generation efficiency of the singlet excited state of the guest material 132 can be increased; thus, emission efficiency can be increased.

Figure 3B:
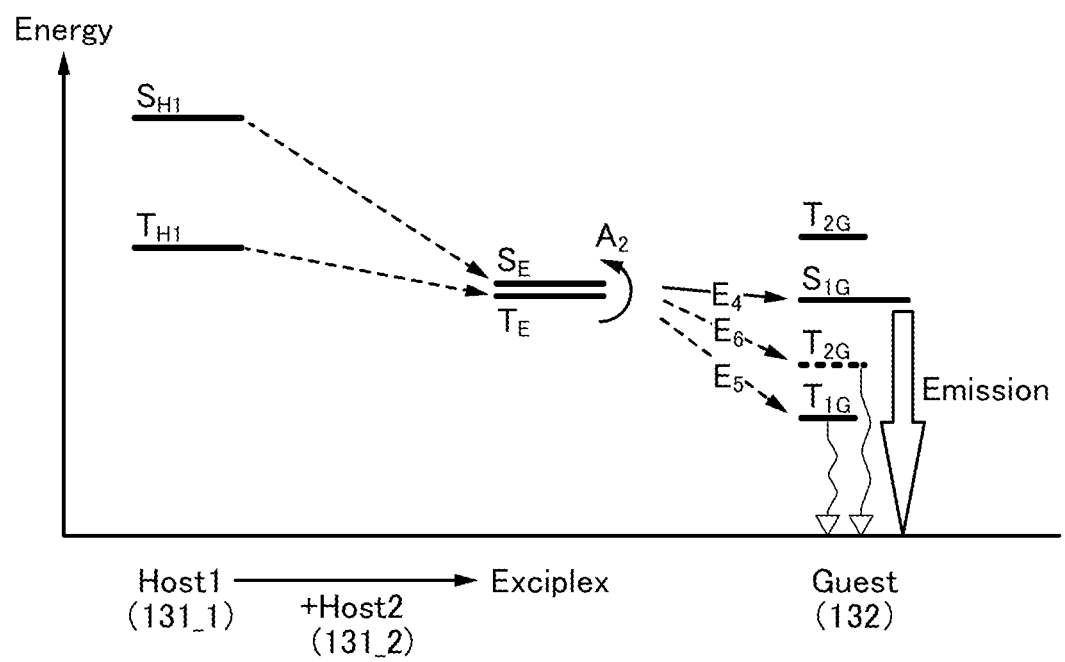

Here, in order to describe the energy transfer process of the exciplex, a schematic diagram illustrating the correlation of energy levels is shown in FIG. 3B.

The following explains what terms and signs in FIG. 3B represent:
Host 1 (131_1): the organic compound 131_1
Host 2 (131_2): the organic compound 131_2
Guest (132): the guest material 132 (fluorescent material)
$S_{H1}$: the lowest singlet excitation energy level of the organic compound 131_1
$T_{H1}$: the lowest triplet excitation energy level of the organic compound 131_1
$S_E$: the lowest singlet excitation energy level of the exciplex
$T_E$: the lowest triplet excitation energy level of the exciplex
$S_{1G}$: the lowest singlet excitation energy level of the guest material 132 (fluorescent material)
$T_{1G}$: the lowest triplet excitation energy level of the guest material 132 (fluorescent material); and
$T_{2G}$: the second triplet excitation energy level of the guest material 132 (fluorescent material).

When carriers are transported to the light-emitting layer 130, one of the organic compounds 131_1 and 131_2 receives holes and the other receives electrons, and a cation and an anion come close to each other, whereby the exciplex is formed at once. Alternatively, when one substance becomes in an excited state, the one immediately interacts with the other substance to form the exciplex. Therefore, most excitons in the light-emitting layer 130 exist as the exciplexes. A band gap of the exciplex is narrower than that of each of the organic compounds 131_1 and 131_2; therefore, the driving voltage can be lowered when the exciplex is formed by recombination of a hole and an electron.

As shown in FIG. 3B, the organic compounds 131_1 and 131_2 included in the host material 131 form the exciplex. Since a donor-acceptor excited state can be formed at this time, the $S_E$ and the $T_E$ of the exciplex are close to each other.

In the case where the excited state of the exciplex is a single excited state and the $S_E$ of the exciplex is higher than or equal to the $S_{1G}$ of the guest material, excitation energy is transferred from the $S_E$ of the exciplex to the $S_{1G}$ of the guest material 132 as shown by a route $E_4$ in FIG. 3B, whereby the guest material 132 is brought into the singlet excited state. Fluorescence is obtained from the guest material 132 in the singlet excited state. In other words, energy transfer occurs from the exciplex in the singlet excited state to the guest material 132 in the singlet excited state as represented by the following general formula (G3).

$${}^1[H\text{-}A]^* + {}^1G \rightarrow {}^1H + {}^1A + {}^1G^* \qquad (G3)$$

Note that in the general formula (G3), $^1[H\text{-}A]^*$ represents the lowest singlet excited state of the exciplex formed by the organic compound 131_1 and the organic compound 131_2; $^1G$ represents the singlet ground state of the guest material 132; $^1H$ represents the singlet ground state of the organic compound 131_1; $^1A$ represents the singlet ground state of the organic compound 131_2; and $^1G^*$ represents the lowest singlet excited state of the guest material 132.

Therefore, in the case where the excited state of the exciplex serving as the host material 131 is the singlet excited state, the lowest singlet excitation energy level ($S_E$) of the exciplex is preferably higher than or equal to the lowest singlet excitation energy level ($S_{1G}$) of the guest material 132.

Next, in the case where the organic compounds 131_1 and 131_2 form the exciplex and the exciplex is in a triplet state, fluorescence can be obtained through the following two processes.

Since the exciplex has a function of converting part of the triplet excitation energy into the singlet excitation energy by reverse intersystem crossing, in a first process, excitation energy is transferred from the $T_E$ to the $S_E$ of the exciplex by reverse intersystem crossing (upconversion) as shown by a route $A_2$ in FIG. 3B.

In a subsequent second process, in the case where the $S_E$ of the exciplex is higher than or equal to the $S_{1G}$ of the guest material 132, excitation energy is transferred from the $S_E$ of the exciplex to the $S_{1G}$ of the guest material 132 as shown by a route $E_4$ in FIG. 3B, whereby the guest material 132 is brought into the singlet excited state. Fluorescence is obtained from the guest material 132 in the singlet excited state.

The above-described processes through the route $A_2$ and the route $E_4$ may be referred to as exciplex-singlet energy transfer (ExSET) or exciplex-enhanced fluorescence (ExEF) in this specification and the like.

The above-described first and second processes are represented by the following general formula (G4).

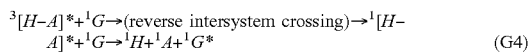
(G4)

Note that in the general formula (G4), $^3[H–A]^*$ represents the lowest triplet excited state of the exciplex formed by the organic compound 131_1 and the organic compound 131_2; $^1G$ represents the singlet ground state of the guest material 132; $^1[H–A]^*$ represents the lowest singlet excited state of the exciplex formed by the organic compound 131_1 and the organic compound 131_2; $^1H$ represents the singlet ground state of the organic compound 131_1; $^1A$ represents the singlet ground state of the organic compound 131_2; and $^1G^*$ represents the lowest singlet excited state of the guest material 132.

As represented by the general formula (G4), the lowest singlet excited state ($^1[H–A]^*$) of the exciplex is generated from the lowest triplet excited state ($^3[H–A]^*$) of the exciplex by reverse intersystem crossing, and then excitation energy is transferred to the lowest singlet excited state ($^1G^*$) of the guest material 132.

When the host material 131 has the above structure, the energy transfer process (β) occurs efficiently, and both the singlet excitation energy and the triplet excitation energy of the exciplex are efficiently converted into the singlet excited state of the guest material 132. Thus, light emission can be efficiently obtained from the guest material 132 (fluorescent material) of the light-emitting layer 130.

However, before excitation energy is transferred from the exciplex to the guest material 132, when the exciplex is deactivated by emitting the excitation energy as light or heat, the emission efficiency is decreased. In addition, the emission efficiency is also decreased by a decrease in efficiency of the route $A_2$, which is the previous process where the exciplex is transferred from a triplet excited state to a singlet excited state by reverse intersystem crossing. The energy difference between the $T_E$ and the $S_E$ is large when the $T_E$ of the exciplex is lower than the $T_{1G}$ of the guest material 132, which suggest $S_E \geq S_{1G} > T_{1G} > T_E$ is satisfied. As a result, the reverse intersystem crossing shown by the route $A_2$ in FIG. 3B and the subsequent energy transfer process shown by the route $E_4$ in FIG. 3B are unlikely to occur, and thus the generation efficiency of the singlet excited state of the guest material 132 is decreased. Accordingly, the lowest triplet excitation energy level ($T_E$) of the exciplex is preferably higher than or equal to the lowest triplet excitation energy level ($T_{1G}$) of the guest material 132. Furthermore, an energy difference between the energy levels is preferably as large as possible. Specifically, the energy difference between the lowest triplet excitation energy level ($T_E$) of the exciplex and the lowest triplet excitation energy level ($T_{1G}$) of the guest material 132 is preferably higher than or equal to 0.5 eV, further preferably higher than or equal to 1.0 eV.

Note that in the case where the exciplex exhibits thermally activated delayed fluorescence at this time, the lowest singlet excitation energy level ($S_E$) of the exciplex is higher than or equal to the lowest triplet excitation energy level ($T_E$) of the exciplex and thus higher than or equal to the lowest triplet excitation energy level ($T_{1G}$) of the guest material 132. That is, the thermally activated delayed fluorescence emission energy of the exciplex is preferably higher than or equal to the phosphorescence emission energy of the guest material 132. Furthermore, an energy difference between these energy levels is preferably as large as possible. Specifically, an energy difference between the thermally activated delayed fluorescence emission energy of the exciplex and the phosphorescence emission energy of the guest material 132 is preferably higher than or equal to 0.5 eV, further preferably higher than or equal to 1.0 eV.

Also in the case where excitation energy is transferred from the $T_E$ of the exciplex to the $T_{1G}$ of the guest material 132 as shown by a route $E_5$ in FIG. 3B, thermal deactivation occurs. Therefore, it is preferable that the energy transfer process shown by the route $E_5$ in FIG. 3B be less likely to occur because the generation efficiency of the triplet excited state of the guest material 132 can be decreased and the occurrence of thermal deactivation can be reduced. To achieve this, it is preferable that the concentration of the guest material 132 with respect to the host material 131 be low.

Furthermore, in the case where the second triplet excitation energy level ($T_{2G}$) having higher energy than the lowest triplet excitation energy level ($T_{1G}$), among the triplet excitation energy levels of the guest material 132, is lower than the $S_{1G}$, as shown by a route $E_6$ in FIG. 3B, part of the excitation energy is transferred easily from the $T_E$ of the exciplex to the $T_{2G}$ of the guest material 132. The guest material 132 in the second triplet excited state is also thermally deactivated and thus does not contribute to light emission.

Note that in the case where excitation energy is transferred from the exciplex to the guest material 132, the smaller a difference in energy level between them is, the energy is transferred more easily. That is, in the case where the $T_{2G}$ of the guest material 132 is higher than the $T_{1G}$ of the guest material 132 and lower than the $S_{1G}$ of the guest material 132, as shown by the route $E_6$, energy transfer from the lowest triplet excitation energy level ($T_E$) of the exciplex to the second triplet excitation energy level ($T_{2G}$) of the guest material 132 is likely to occur, and thus the generation probability of the triplet excited state of the guest material 132 is improved. Therefore, reverse intersystem crossing shown by the route $A_2$ and the subsequent energy transfer process shown by the route $E_4$ are unlikely to occur, resulting in a decrease in the generation efficiency of the singlet excited state of the guest material 132. That is, it is preferable that the energy transfer process shown by the route $E_6$ in FIG. 3B be less likely to occur because the generation efficiency of the triplet excited state of the guest material 132 can be decreased and thermal deactivation can be reduced.

Accordingly, in order to suppress the energy transfer process shown by the route $E_6$ in FIG. 3B, it is preferable that the second triplet excitation energy level ($T_{2G}$) of the guest material 132 be higher than or equal to the lowest singlet excitation energy level ($S_{1G}$) of the guest material 132.

Furthermore, it is preferable that the second triplet excitation energy level ($T_{2G}$) of the guest material 132 be higher than or equal to the lowest triplet excitation energy level ($T_E$) of the exciplex and that the lowest triplet excitation energy level ($T_E$) of the exciplex be higher than or equal to the lowest triplet excitation energy level ($T_{1G}$) of the guest material 132.

In order to suppress the energy transfer process shown by the route $E_6$ in FIG. 3B and efficiently cause reverse intersystem crossing shown by the route $A_2$ and the subsequent energy transfer process shown by the route $E_4$, it is further preferable that the second triplet excitation energy level ($T_{2G}$) of the guest material 132 be higher than or equal to the lowest triplet excitation energy level ($T_E$) of the exciplex and that the lowest triplet excitation energy level ($T_E$) of the exciplex be higher than or equal to the lowest singlet excitation energy level ($S_{1G}$) of the guest material 132. In this case, the lowest singlet excitation energy level ($S_E$) of the exciplex is higher than or equal to the lowest triplet excitation energy level ($T_E$) of the exciplex and thus higher than or equal to the lowest singlet excitation energy level ($S_{1G}$) of the guest material 132. That is, in the case where the exciplex exhibits thermally activated delayed fluorescence, the thermally activated delayed fluorescence emission energy of the exciplex is preferably higher than or equal to the fluorescence emission energy of the guest material 132.

It is still further preferable that the second triplet excitation energy level ($T_{2G}$) of the guest material 132 be higher than or equal to the lowest singlet excitation energy level ($S_E$) of the exciplex. In this case, the lowest triplet excitation energy level ($T_E$) of the exciplex is lower than the lowest singlet excitation energy level ($S_E$) of the exciplex, and thus the energy transfer from the lowest triplet excitation energy level ($T_E$) of the exciplex to the second triplet excitation energy level ($T_{2G}$) of the guest material 132 can be suppressed effectively. As a result, the generation efficiency of the singlet excited state of the guest material 132 can be improved, leading to improvement in the emission efficiency of a light-emitting element.

Note that when the direct recombination process in the guest material 132 is dominant, a large number of triplet excited states of the guest material 132 are generated in the light-emitting layer, resulting in a decreased emission efficiency due to thermal deactivation. Specifically, it is preferable that the probability of the energy transfer process ($\beta$) be higher than that of the direct recombination process ($\alpha$) because the generation efficiency of the triplet excited state of the guest material 132 can be decreased and thermal deactivation can be reduced. To achieve this, it is preferable that the concentration of the guest material 132 with respect to the organic compounds 131_1 and 131_2 be low.

2-2. Material

In the case where the host material 131 in the light-emitting layer 130 includes the organic compounds 131_1 and 131_2, i.e., two kinds of materials, any of the following materials can be used.

Note that as the organic compounds 131_1 and 131_2, a combination of two kinds of organic compounds which form an exciplex is preferably used. In this case, a variety of organic compounds can be used as appropriate. In order to form an exciplex efficiently, it is particularly preferable to combine a compound which easily accepts electrons (a material having an electron-transport property) and a compound which easily accepts holes (a material having a hole-transport property).

This is because in the case where the combination of a material having an electron-transport property and a material having a hole-transport property which form an exciplex is used as a host material, the carrier balance between holes and electrons in the light-emitting layer can be easily optimized by adjustment of the mixture ratio of the material having an electron-transport property and the material having a hole-transport property. The optimization of the carrier balance between holes and electrons in the light-emitting layer can prevent a region in which electrons and holes are recombined from existing on one side in the light-emitting layer. By preventing the region in which electrons and holes are recombined from existing on one side, the reliability of the light-emitting element can be improved.

As the compound which easily accepts electrons (the material having an electron-transport property), a π-electron deficient heteroaromatic compound, a metal complex, or the like can be used.

Specific examples include a metal complex such as bis(10-hydroxybenzo[h]quinolinato)beryllium(II) (abbreviation: BeBq$_2$), bis(2-methyl-8-quinolinolato) (4-phenylphenolato) aluminum(III) (abbreviation: BAlq), bis(8-quinolinolato) zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound having an azole skeleton such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 9-[4-(4,5-diphenyl-4H-1,2,4-triazol-3-yl)phenyl]-9H-carbazole (abbreviation: CzTAZ1), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBTBIm-II); a heterocyclic compound having a diazine skeleton such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[3-{3-(9H-carbazol-9-yl)-9H-carbazol-9-yl}phenyl]dibenzo[f,h]quinoxaline (abbreviation: 2mCzCzPDBq), 4,6-bis[3-(9H-carbazol-9-yl)-phenyl] pyrimidine (abbreviation: 4,6mCzP2Pm), 4,6-bis[3-(phenanthren-9-yl)phenyl]pyrimidine (abbreviation: 4,6m-PnP2Pm), or 4,6-bis[3-(4-dibenzothienyl)phenyl]pyrimidine (abbreviation: 4,6mDBTP2Pm-II); a heterocyclic compound having a triazine skeleton such as PCCzPTzn; and a heterocyclic compound having a pyridine skeleton such as 3,5-bis[3-(9H-carbazol-9-yl)phenyl]pyridine (abbreviation: 35DCzPPy) or 1,3,5-tri[3-(3-pyridyl)phenyl]benzene (abbreviation: TmPyPB). Among the above materials, heterocyclic compounds having diazine skeletons and triazine skeletons and heterocyclic compounds having pyridine skeletons have high reliability and are thus preferable. Heterocyclic compounds having diazine (pyrimidine or pyrazine) skeletons and triazine skeletons have a high electron-transport property and contribute to a decrease in drive voltage.

As the compound which easily accepts holes (material having a hole-transport property), a π-electron rich heteroaromatic compound, an aromatic amine compound, or the like can be favorably used. Specific examples include a compound having an aromatic amine skeleton such as 2-[N-(9-phenylcarbazol-3-yl)-N-phenylamino]spiro-9,9'-bifluorene (abbreviation: PCASF), 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]-fluoren-2-amine (abbreviation: PCBAF), or N-phenyl-N-[4-(9-phenyl-9H-carbazol-3-yl)phenyl]-spiro-9,9'-bifluoren-2-amine (abbreviation: PCBASF), N-(1,1'-biphenyl-4-yl)-N-[4-(9-phenyl-9H-carbazol-3-yl)phenyl]-9,9-dimethyl-9H-fluoren-2-amine (abbreviation: PCBBiF); a compound having a carbazole skeleton such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 3,6-di(9H-carbazol-9-yl)-9-phenyl-9H-carbazole (abbreviation: PhCzGI), 2,8-di(9H-carbazol-9-yl)-dibenzothiophene (abbreviation: Cz2DBT), or 9-phenyl-9H-3-(9-phenyl-9H-carbazol-3-yl)carbazole (abbreviation: PCCP); a compound having a thiophene skeleton such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton such as 4,4',4"-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II). Among the above materials, a compound having an aromatic amine skeleton and a compound having a carbazole skeleton are preferable because these compounds are highly reliable and have high hole-transport properties to contribute to a decrease in drive voltage.

The organic compounds 131_1 and 131_2 are not limited to the above-described compounds, as long as they can transport carriers, the combination can form an exciplex, and light emission of the exciplex overlaps with an absorption band on the longest wavelength side in an absorption spectrum of a light-emitting substance (an absorption corresponding to the transition of the light-emitting substance from the singlet ground state to the singlet excited state), and other materials may be used.

Note that it is preferable to use, as a material which can be used as the guest material 132 in the light-emitting layer 130 in FIG. 3A, a material whose second triplet excitation energy level is higher than or equal to the lowest singlet excitation energy level.

Furthermore, it is preferable that the second triplet excitation energy level of the guest material 132 be higher than or equal to the lowest triplet excitation energy level of the exciplex and that the lowest triplet excitation energy level of the exciplex be higher than or equal to the lowest triplet excitation energy level of the guest material 132.

It is preferable to use, as the guest material 132 having the above energy level, a material including at least one skeleton selected from anthracene, tetracene, chrysene, pyrene, perylene, and acridone, and at least one substituent selected from an aromatic amino group, an alkyl group, and an aryl group. When the skeleton and the substituent are bonded, the lowest singlet excitation energy level is likely to be lowered and the second triplet excitation energy level is likely to be higher than or equal to the lowest singlet excitation energy level, which is preferable. When the skeleton and the two substituents having the same structure are bonded, the lowest singlet excitation energy level is likely to be lowered and the second triplet excitation energy level is likely to be higher than or equal to the lowest singlet excitation energy level, which is preferable. An organic compound including any of the skeletons is preferably used for a light-emitting material because of its high fluorescence quantum yield and its high reliability.

Specific examples of the guest material 132 having any of the above energy levels or any of the above structures are similar to those of the guest material 132 described in the subsection 1-8 and are therefore not described here.

When an organic compound having any of the above energy levels or any of the above structures is used as the guest material 132, the energy transfer process of the triplet excitation energy shown by the route $E_6$ in FIG. 3B can be suppressed, and reverse intersystem crossing shown by the route $A_2$ and the subsequent energy transfer process of the singlet excitation energy shown by the route $E_4$ occur easily. Accordingly, the generation efficiency of the singlet excited state of the guest material 132 can be improved.

As described above, when the singlet excitation energy levels and the triplet excitation energy levels of the host material 131 and the guest material 132 in the light-emitting layer 130 are set as described above in one embodiment of the present invention, a light-emitting element with high emission efficiency can be provided.

Note that the light-emitting layer 130 can be formed by an evaporation method (including a vacuum evaporation method), an inkjet method, a coating method, gravure printing, or the like.

3. Components of Light-Emitting Element

Next, details of other components of the light-emitting element 150 in FIG. 1A will be described below.

3-1. Pair of Electrodes

The electrode 101 and the electrode 102 have functions of injecting holes and electrons into the light-emitting layer 130. The electrodes 101 and 102 can be formed using a metal, an alloy, or a conductive compound, or a mixture or a stack thereof, for example. A typical example of the metal is aluminum, besides, a transition metal such as silver, tungsten, chromium, molybdenum, copper, or titanium, an alkali metal such as lithium or cesium, or a Group 2 metal such as calcium or magnesium can be used. As the transition metal, a rare earth metal such as ytterbium (Yb) may be used. An alloy containing any of the above metals can be used as the alloy, and MgAg and AlLi can be given as examples. As the conductive compound, a metal oxide such as indium oxide-tin oxide (indium tin oxide) can be given. It is also possible to use an inorganic carbon-based material such as graphene as the conductive compound. As described above, the electrode 101 and/or the electrode 102 may be formed by stacking two or more of these materials.

Light emitted from the light-emitting layer 130 is extracted through the electrode 101 and/or the electrode 102.

Therefore, at least one of the electrodes 101 and 102 transmits visible light. In the case where the electrode through which light is extracted is formed using a material with low light transmittance, such as metal or alloy, the electrode 101 and/or the electrode 102 is formed to a thickness that is thin enough to transmit visible light (e.g., a thickness of 1 nm to 10 nm).

3-2. Hole-Injection Layer

The hole-injection layer 111 has a function of reducing a barrier for hole injection from the electrode 101 to promote hole injection and is formed using a transition metal oxide, a phthalocyanine derivative, or an aromatic amine, for example. As the transition metal oxide, molybdenum oxide, vanadium oxide, ruthenium oxide, tungsten oxide, manganese oxide, or the like can be given. As the phthalocyanine derivative, phthalocyanine, metal phthalocyanine, or the like can be given. As the aromatic amine, a benzidine derivative, a phenylenediamine derivative, or the like can be given. It is also possible to use a high molecular compound such as polythiophene or polyaniline; a typical example thereof is poly(ethylenedioxythiophene)/poly(styrenesulfonic acid), which is self-doped polythiophene.

As the hole-injection layer 111, a layer containing a composite material of a hole-transport material and a material having a property of accepting electrons from the hole-transport material can also be used. Alternatively, a stack of a layer containing a material having an electron accepting property and a layer containing a hole-transport material may also be used. In a steady state or in the presence of an electric field, electric charge can be transferred between these materials. As examples of the material having an electron-accepting property, organic acceptors such as a quinodimethane derivative, a chloranil derivative, and a hexaazatriphenylene derivative can be given. A specific example is a compound having an electron-withdrawing group (a halogen group or a cyano group), such as 7,7,8,8-tetracyano-2,3,5,6-tetrafluoroquinodimethane (abbreviation: $F_4$-TCNQ), chloranil, or 2,3,6,7,10,11-hexacyano-1,4,5,8,9,12-hexaazatriphenylene (abbreviation: HAT-CN). Alternatively, a transition metal oxide such as an oxide of a metal from Group 4 to Group 8 can also be used. Specifically, vanadium oxide, niobium oxide, tantalum oxide, chromium oxide, molybdenum oxide, tungsten oxide, manganese oxide, rhenium oxide, or the like can be used. In particular, molybdenum oxide is preferable because it is stable in the air, has a low hygroscopic property, and is easily handled.

A material having a property of transporting more holes than electrons can be used as the hole-transport material, and a material having a hole mobility of $1\times10^{-6}$ $cm^2/Vs$ or higher is preferable. Specifically, an aromatic amine, a carbazole derivative, an aromatic hydrocarbon, a stilbene derivative, or the like can be used. Furthermore, the hole-transport material may be a high molecular compound. In addition, any of the hole-transport materials exemplified in the description of the light-emitting layer 130 can be used.

3-3. Hole-Transport Layer

The hole-transport layer 112 is a layer containing a hole-transport material and can be formed using any of the materials given as examples of the material of the hole-injection layer 111. In order that the hole-transport layer 112 has a function of transporting holes injected into the hole-injection layer 111 to the light-emitting layer 130, the highest occupied molecular orbital (HOMO) level of the hole-transport layer 112 is preferably equal or close to the HOMO level of the hole-injection layer 111.

3-4. Electron-Transport Layer

The electron-transport layer 117 has a function of transporting, to the light-emitting layer 130, electrons injected from the electrode 102 through the electron-injection layer 118. A material having a property of transporting more electrons than holes can be used as an electron-transport material, and a material having an electron mobility of $1\times10^{-6}$ $cm^2/Vs$ or higher is preferable. Specific examples include a metal complex having a quinoline ligand, a benzoquinoline ligand, an oxazole ligand, or a thiazole ligand; an oxadiazole derivative; a triazole derivative; a phenanthroline derivative; a pyridine derivative; and a bipyridine derivative. In addition, any of the electron-transport materials exemplified in the description of the light-emitting layer 130 can be used.

3-5. Electron-Injection Layer

The electron-injection layer 118 has a function of reducing a barrier for electron injection from the electrode 102 to promote electron injection and can be formed using a Group 1 metal or a Group 2 metal, or an oxide, a halide, or a carbonate of any of the metals, for example. Alternatively, a composite material containing an electron-transport material (described above) and a material having a property of donating electrons to the electron-transport material can also be used. As the material having an electron-donating property, a Group 1 metal, a Group 2 metal, an oxide of any of the metals, or the like can be given.

Note that the hole-injection layer 111, the hole-transport layer 112, the electron-transport layer 117, and the electron-injection layer 118 described above can each be formed by an evaporation method (including a vacuum evaporation method), an inkjet method, a coating method, a gravure printing method, or the like.

Besides the above-mentioned materials, an inorganic compound or a high molecular compound (e.g., an oligomer, a dendrimer, or a polymer) may be used for the hole-injection layer 111, the hole-transport layer 112, the light-emitting layer 130, the electron-transport layer 117, and the electron-injection layer 118.

3-6. Substrate

The light-emitting element 150 is fabricated over a substrate of glass, plastic, or the like. As the way of stacking layers over the substrate, layers may be sequentially stacked from the electrode 101 side or sequentially stacked from the electrode 102 side.

Note that, for example, glass, quartz, plastic, or the like can be used for the substrate over which the light-emitting element 150 can be formed. Alternatively, a flexible substrate can be used. The flexible substrate is a substrate that can be bent, such as a plastic substrate made of polycarbonate or polyarylate, for example. A film, an inorganic film formed by evaporation, or the like can also be used. Note that materials other than these can be used as long as they can function as a support in a manufacturing process of the light-emitting element and an optical element or as long as they have a function of protecting the light-emitting element and the optical element.

The light-emitting element 150 can be formed using a variety of substrates, for example. The type of substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. Examples of the glass substrate include a barium borosilicate glass substrate, an aluminoborosilicate glass substrate, and a soda lime glass substrate. Examples of the flexible substrate, the attachment film, the base material film, and the like are substrates of plastics typified by polyethylene terephthalate (PET), polyethylene naphthalate (PEN), polyether sulfone (PES), and polytetrafluoroethylene (PTFE). Another example is a resin such as acrylic. Other examples are polypropylene, polyester, polyvinyl fluoride, polyvinyl chloride, and the like. Other examples are polyamide, polyimide, aramid, epoxy, an inorganic film formed by evaporation, paper, and the like.

Alternatively, a flexible substrate may be used as the substrate, and the light-emitting element may be provided directly on the flexible substrate. Alternatively, a separation layer may be provided between the substrate and the light-emitting element. The separation layer can be used when part or the whole of the light-emitting element formed over the separation layer is completed, separated from the substrate, and transferred to another substrate. In such a case, the light-emitting element can be transferred to a substrate having low heat resistance or a flexible substrate as well. For the above separation layer, a stack including inorganic films, which are a tungsten film and a silicon oxide film, or a resin film of polyimide or the like formed over a substrate can be used, for example.

In other words, after the light-emitting element is formed using a substrate, the light-emitting element may be transferred to another substrate. Examples of a substrate to which the light-emitting element is transferred include a cellophane substrate, a stone substrate, a wood substrate, a cloth substrate (including a natural fiber (e.g., silk, cotton, and hemp), a synthetic fiber (e.g., nylon, polyurethane, and polyester), a regenerated fiber (e.g., acetate, cupra, rayon, and regenerated polyester), and other fibers), a leather substrate, and a rubber substrate in addition to the above-described substrates. By using such a substrate, a light-emitting element with high durability, a light-emitting element with high heat resistance, a lightweight light-emitting element, or a thin light-emitting element can be obtained.

The light-emitting element 150 may be formed over an electrode electrically connected to a field-effect transistor (FET), for example, which is formed over the above-mentioned substrate, so that an active matrix display device in which the FET controls the drive of the light-emitting element 150 can be manufactured.

In Embodiment 1, one embodiment of the present invention has been described. Other embodiments of the present invention are described in the other embodiments. Note that one embodiment of the present invention is not limited thereto. Although the case where the second triplet excitation energy level of the guest material 132 is higher than or equal to the lowest singlet excitation energy level of the guest material 132 is exemplified in one embodiment of the present invention, one embodiment of the present invention is not limited thereto. Depending on circumstances or conditions, in one embodiment of the present invention, the second triplet excitation energy level of the guest material 132 is not necessarily higher than or equal to the lowest singlet excitation energy level of the guest material 132. Alternatively, one embodiment of the present invention is not limited to the above example in which the second triplet excitation energy level of the guest material 132 is higher than or equal to the lowest triplet excitation energy level of the host material 131. Depending on circumstances or conditions, the second triplet excitation energy level of the guest material 132 in one embodiment of the present invention is not necessarily higher than or equal to the lowest triplet excitation energy level of the host material 131, for example. Further alternatively, although the example in which the host material 131 is a substance which exhibits thermally activated delayed fluorescence at room temperature is described in one embodiment of the present invention, for example, the host material 131 may include a substance other than the substance which exhibits thermally activated delayed fluorescence at room temperature in one embodiment of the present invention. Alternatively, depending on circumstances or conditions, the host material 131 in one embodiment of the present invention does not necessarily include the substance which exhibits thermally activated delayed fluorescence at room temperature, for example. One embodiment of the present invention is not limited to the above example in which the guest material 132 includes at least one skeleton selected from anthracene, tetracene, chrysene, pyrene, perylene, and acridone, and at least one substituent selected from an aromatic amine, an alkyl group, and an aryl group. Depending on circumstances, the guest material 132 does not necessarily include any of the skeletons or any of the substituents.

The structure described above in this embodiment can be combined with any of the structures described in the other embodiments as appropriate.

Embodiment 2

In this embodiment, a light-emitting element having a structure different from that described in Embodiment 1 and an emission mechanism of the light-emitting element will be described below with reference to FIGS. 4A and 4B.

Structure Example of Light-Emitting Element

Figure 4A:
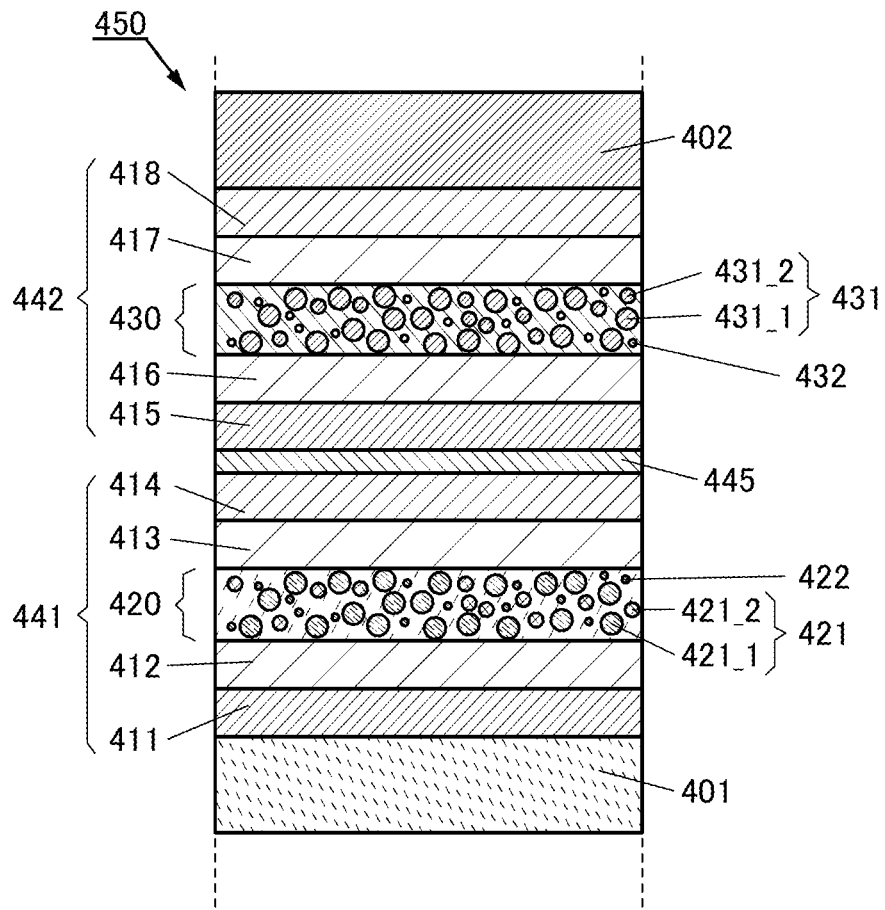
FIGS. 4A and 4B are a schematic cross-sectional view of a light-emitting element of one embodiment of the present invention and a diagram illustrating the correlation of energy levels in a light-emitting layer.

FIG. 4A is a schematic cross-sectional view of a light-emitting element 450.

The light-emitting element 450 illustrated in FIG. 4A includes a plurality of light-emitting units (in FIG. 4A, a light-emitting unit 441 and a light-emitting unit 442) between a pair of electrodes (an electrode 401 and an electrode 402). One light-emitting unit has the same structure as the EL layer 100 illustrated in FIG. 1A. That is, the light-emitting element 150 in FIG. 1A includes one light-emitting unit, while the light-emitting element 450 includes the plurality of light-emitting units. Note that the electrode 401 functions as an anode and the electrode 402 functions as a cathode in the following description of the light-emitting element 450; however, the functions may be interchanged in the light-emitting element 450.

In the light-emitting element 450 illustrated in FIG. 4A, the light-emitting unit 441 and the light-emitting unit 442 are stacked, and a charge-generation layer 445 is provided between the light-emitting unit 441 and the light-emitting unit 442. Note that the light-emitting unit 441 and the light-emitting unit 442 may have the same structure or different structures. For example, it is preferable that the EL layer 100 illustrated in FIG. 1A be used in the light-emitting unit 441 and that a light-emitting layer containing a phosphorescent material as a light-emitting material be used in the light-emitting unit 442.

That is, the light-emitting element 450 includes a light-emitting layer 420 and a light-emitting layer 430. The light-emitting unit 441 includes a hole-injection layer 411, a hole-transport layer 412, an electron-transport layer 413, and an electron-injection layer 414 in addition to the light-emitting layer 420. The light-emitting unit 442 includes a hole-injection layer 415, a hole-transport layer 416, an electron-transport layer 417, and an electron-injection layer 418 in addition to the light-emitting layer 430.

The charge-generation layer 445 contains a composite material of an organic material and a material having an electron accepting property. For the composite material, the composite material that can be used for the hole-injection layer 111 described in Embodiment 1 may be used. As the organic material, a variety of compounds such as an aromatic amine compound, a carbazole compound, an aromatic hydrocarbon, and a high molecular compound (such as an oligomer, a dendrimer, or a polymer) can be used. An organic material having a hole mobility of $1 \times 10^{-6}$ cm$^2$/Vs or higher is preferably used. Note that any other material may be used as long as it has a property of transporting more holes than electrons. Since the composite material of an organic material and a material having an electron accepting property has excellent carrier-injection and carrier-transport properties, low-voltage driving or low-current driving can be realized. Note that when a surface of a light-emitting unit on the anode side is in contact with the charge-generation layer 445 as that of the light-emitting unit 442, the charge-generation layer 445 can also serve as a hole-injection layer or a hole-transport layer of the light-emitting unit; thus, a hole-injection layer or a hole-transport layer does not need to be included in the light-emitting unit.

The charge-generation layer 445 may have a stacked-layer structure of a layer containing the composite material of an organic material and a material having an electron accepting property and a layer containing another material. For example, the charge-generation layer 445 may be formed using a combination of a layer containing the composite material of an organic material and a material having an electron accepting property with a layer containing one material selected from among materials having an electron donating property and a material having a high electron-transport property. Furthermore, the charge-generation layer 445 may be formed using a combination of a layer containing the composite material of an organic material and a material having an electron accepting property with a layer including a transparent conductive film.

The charge-generation layer 445 provided between the light-emitting unit 441 and the light-emitting unit 442 may have any structure as long as electrons can be injected to the light-emitting unit on one side and holes can be injected into the light-emitting unit on the other side when a voltage is applied between the electrode 401 and the electrode 402. For example, in FIG. 4A, the charge-generation layer 445 injects electrons into the light-emitting unit 441 and holes into the light-emitting unit 442 when a voltage is applied such that the potential of the electrode 401 is higher than that of the electrode 402.

The light-emitting element having two light-emitting units is described with reference to FIG. 4A; however, a similar structure can be applied to a light-emitting element in which three or more light-emitting units are stacked. With a plurality of light-emitting units partitioned by the charge-generation layer between a pair of electrodes as in the light-emitting element 450, it is possible to provide a light-emitting element which can emit light with high luminance with the current density kept low and has a long lifetime. A light-emitting element with low power consumption can be provided.

When the structure of the EL layer 100 shown in FIG. 1A is applied to at least one of the plurality of units, a light-emitting element with high emission efficiency can be provided.

The light-emitting layer 420 contains a host material 421 and a guest material 422. The light-emitting layer 430 contains a host material 431 and a guest material 432. The host material 421 contains an organic compound 421_1 and an organic compound 421_2. The host material 431 contains an organic compound 431_1 and an organic compound 431_2.

In this embodiment, the light-emitting layer 420 has a structure similar to that of the light-emitting layer 130 in FIG. 3A. That is, the host material 421, the organic compound 421_1, the organic compound 4212, and the guest material 422 in the light-emitting layer 420 correspond to the host material 131, the organic compound 131_1, the organic compound 131_2, and the guest material 132 in the light-emitting layer 130, respectively. In the following description, the guest material 432 contained in the light-emitting layer 430 is a phosphorescent material.

Note that the electrode 401, the electrode 402, the hole-injection layers 411 and 415, the hole-transport layers 412 and 416, the electron-transport layers 413 and 417, and the electron-injection layers 414 and 418 have functions similar to those of the electrode 101, the electrode 102, the hole-injection layer 111, the hole-transport layer 112, the electron-transport layer 117, and the electron-injection layer 118 in Embodiment 1, respectively. Therefore, detailed description thereof is omitted in this embodiment.

Emission Mechanism of Light-Emitting Layer 420

An emission mechanism of the light-emitting layer 420 is similar to that of the light-emitting layer 130 in FIG. 3A.

Emission Mechanism of Light-Emitting Layer 430

Next, an emission mechanism of the light-emitting layer 430 will be described.

The organic compound 431_1 and the organic compound 431_2 which are contained in the light-emitting layer 430 form an exciplex. The organic compound 431_1 serves as a host material and the organic compound 431_2 serves as an assist material in the description here.

Although it is acceptable as long as the combination of the organic compound 431_1 and the organic compound 431_2 can form an exciplex in the light-emitting layer 430, it is preferred that one organic compound be a material having a hole-transport property and the other organic compound be a material having an electron-transport property. Note that the combination of the organic compound 431_1 and the organic compound 431_2 may have a structure similar to the combination of the organic compound 421_1 and the organic compound 421_2 which form an exciplex.

Figure 4B:
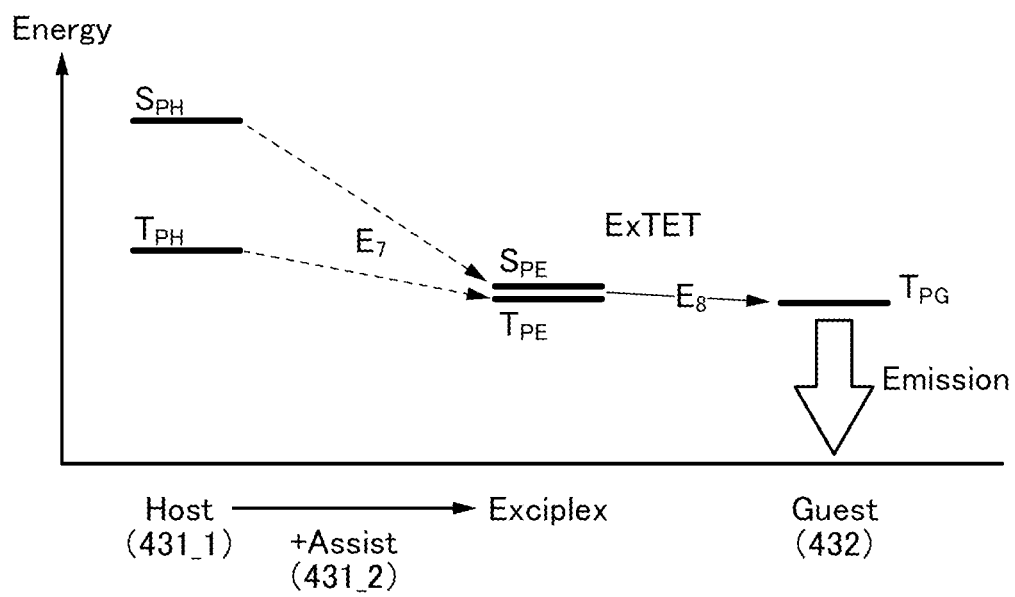

FIG. 4B illustrates the correlation of energy levels of the organic compound 431_1, the organic compound 431_2, and the guest material 432 in the light-emitting layer 430. The following explains what terms and signs in FIG. 4B represent:

Host (431_1): the host material (organic compound 431_1);

Assist (431_2): the assist material (organic compound 431_2);

Guest (432): the guest material 432 (phosphorescent material);

$S_{PH}$: the level of the lowest singlet excited state of the host material (organic compound 431_1);

$T_{PH}$: the level of the lowest triplet excited state of the host material (organic compound 431_1);

$T_{PG}$: the level of the lowest triplet excited state of the guest material 432 (the phosphorescent material);

$S_{PE}$: the level of the lowest singlet excited state of the exciplex; and $T_{PE}$: the level of the lowest triplet excited state of the exciplex.

The level ($S_{PE}$) of the lowest singlet excited state of the exciplex, which is formed by the organic compound 431_1 and the organic compound 431_2 and the level ($T_{PE}$) of the lowest triplet excited state of the exciplex are close to each other (see $E_7$ in FIG. 4B).

Both energies of $S_{PE}$ and $T_{PE}$ of the exciplex are then transferred to the level ($T_{PG}$) of the lowest triplet excited state of the guest material 432 (the phosphorescent material); thus, light emission is obtained (see $E_8$ in FIG. 4B).

The above-described processes through a route $E_7$ and a route $E_8$ may be referred to as exciplex-triplet energy transfer (ExTET) in this specification and the like.

When one of the organic compounds 431_1 and 432_2 receiving holes and the other receiving electrons come close to each other, the exciplex is formed at once. Alternatively, when one compound is brought into an excited state, the one immediately interacts with the other compound to form the exciplex. Therefore, most excitons in the light-emitting layer 430 exist as exciplexes. The band gap of the exciplex is narrower than that of each of the organic compounds 431_1 and 431_2; therefore, the driving voltage can be lowered when the exciplex is formed by recombination of a hole and an electron.

When the light-emitting layer 430 has the above structure, light emission from the guest material 432 (the phosphorescent material) of the light-emitting layer 430 can be efficiently obtained.

Note that light emitted from the light-emitting layer 420 preferably has a peak on the shorter wavelength side than light emitted from the light-emitting layer 430. The luminance of a light-emitting element using the phosphorescent material emitting light with a short wavelength tends to degrade quickly. In view of the above, light emission from a fluorescent material is used for light emission with a short wavelength, so that a light-emitting element with less degradation of luminance can be provided.

Furthermore, the light-emitting layer 420 and the light-emitting layer 430 may be made to emit light with different emission wavelengths, so that the light-emitting element can be a multicolor light-emitting element. In that case, the emission spectrum of the light-emitting element is formed by combining light having different emission peaks, and thus has at least two peaks.

The above structure is also suitable for obtaining white light emission. When the light-emitting layer 420 and the light-emitting layer 430 emit light of complementary colors, white light emission can be obtained.

In addition, white light emission with a high color rendering property that is formed of three primary colors or four or more colors can be obtained by using a plurality of light-emitting materials emitting light with different wavelengths for one of the light-emitting layers 420 and 430 or both. In that case, one of the light-emitting layers 420 and 430 or both may be divided into layers and each of the divided layers may contain a different light-emitting material from the others.

Next, materials that can be used for the light-emitting layers 420 and 430 will be described.

Material that can be Used for Light-Emitting Layer 420

A material that can be used for the light-emitting layer 130 described in Embodiment 1 may be used as a material that can be used for the light-emitting layer 420.

Material that can be Used for Light-Emitting Layer 430

In the light-emitting layer 430, the organic compound 431_1 (the host material) exists in the highest proportion in weight ratio, and the guest material 432 (the phosphorescent material) is dispersed in the organic compound 431_1 (the host material).

Examples of the organic compound 431_1 (the host material) include a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, a phenanthroline derivative, and the like. Other examples are an aromatic amine, a carbazole derivative, and the like. In addition, the materials which can be used for the light-emitting layer 130 (the materials having a hole-transport property and the materials having an electron-transport property), which is described in Embodiment 1, can be used.

As the guest material 432 (the phosphorescent material), an iridium-, rhodium-, or platinum-based organometallic complex or metal complex can be used; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, and the like can be given. As the metal complex, a platinum complex having a porphyrin ligand and the like can be given.

As the organic compound 4312 (the assist material), a substance which can form an exciplex together with the organic compound 431_1 is used. In that case, it is preferable that the organic compound 431_1, the organic compound 4312, and the guest material 432 (the phosphorescent material) be selected such that the emission peak of the exciplex overlaps with an adsorption band, specifically an adsorption band on the longest wavelength side, of a triplet metal to ligand charge transfer (MLCT) transition of the phosphorescent material. This makes it possible to provide a light-emitting element with drastically improved emission efficiency. Note that in the case where a thermally activated delayed fluorescence material is used instead of the phosphorescent material, it is preferable that the adsorption band on the longest wavelength side be a singlet absorption band. Specifically, the materials which can be used for the light-emitting layer 130 (the materials having a hole-transport property and the materials having an electron-transport property), which is described in Embodiment 1, can be used.

As the light-emitting material contained in the light-emitting layer 430, any material can be used as long as the material can convert triplet excitation energy into light emission. As an example of the material that can convert triplet excitation energy into light emission, a thermally activated delayed fluorescence material can be given in addition to the phosphorescent material. Therefore, the term "phosphorescent material" in the description can be replaced with the term "thermally activated delayed fluorescence material". Note that the thermally activated delayed fluorescence material is a material that can up-convert a triplet excited state into a singlet excited state (i.e., reverse intersystem crossing is possible) using a little thermal energy and efficiently exhibits light emission (fluorescence) from the singlet excited state. Thermally activated delayed fluorescence is efficiently obtained under the condition where the difference between the triplet excitation energy level and the singlet excitation energy level is preferably larger than 0 eV and smaller than or equal to 0.2 eV, further preferably larger than 0 eV and smaller than or equal to 0.1 eV.

There is no limitation on the emission colors of the light-emitting material included in the light-emitting layer 420 and the light-emitting material included in the light-emitting layer 430, and they may be the same or different. Light emitted from the light-emitting materials is mixed and extracted out of the element; therefore, for example, in the case where their emission colors are complementary colors, the light-emitting element can emit white light. In consideration of the reliability of the light-emitting element, the emission peak wavelength of the light-emitting material contained in the light-emitting layer 420 is preferably shorter than that of the light-emitting material included in the light-emitting layer 430.

Note that the light-emitting layers 420 and 430 can be formed by an evaporation method (including a vacuum evaporation method), an inkjet method, a coating method, gravure printing, or the like.

Note that the structure described in this embodiment can be combined with any of the structures described in the other embodiments as appropriate.

Embodiment 3

In this embodiment, a light-emitting element having a structure different from those described in Embodiment 1 and Embodiment 2 will be described below with reference to FIGS. 5A and 5B.

Structure Example of Light-Emitting Element

Figure 5A:
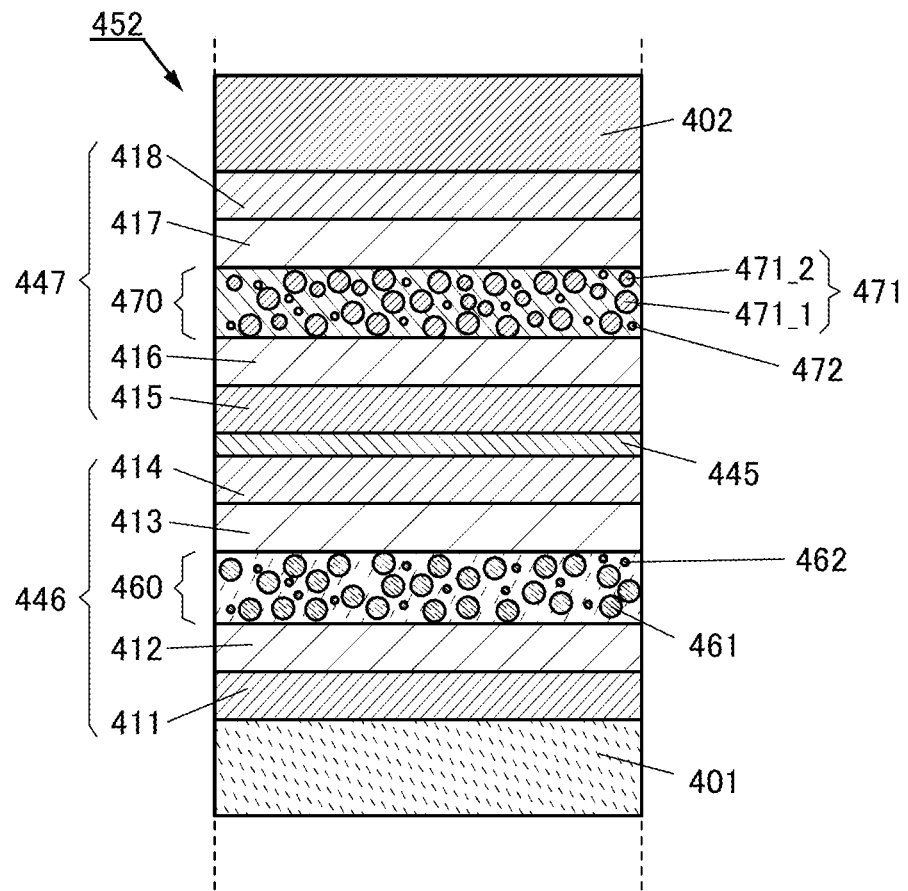
FIGS. 5A and 5B are a schematic cross-sectional view of a light-emitting element of one embodiment of the present invention and a diagram illustrating the correlation of energy levels in a light-emitting layer.

FIG. 5A is a schematic cross-sectional view of a light-emitting element 452 of one embodiment of the present invention.

The light-emitting element 452 includes a plurality of light-emitting units (in FIG. 5A, a light-emitting unit 446 and a light-emitting unit 447) between an electrode 401 and an electrode 402. One light-emitting unit has the same structure as the EL layer 100 illustrated in FIG. 1A. That is, the light-emitting element 150 in FIG. 1A includes one light-emitting unit, while the light-emitting element 452 includes the plurality of light-emitting units. Note that the electrode 401 functions as an anode and the electrode 402 functions as a cathode in the following description of this embodiment; however, the functions may be interchanged in the light-emitting element 452.

In the light-emitting element 452 illustrated in FIG. 5A, the light-emitting unit 446 and the light-emitting unit 447 are stacked, and a charge-generation layer 445 is provided between the light-emitting unit 446 and the light-emitting unit 447. Note that the light-emitting unit 446 and the light-emitting unit 447 may have the same structure or different structures. For example, it is preferable that a light-emitting layer containing a fluorescent material as a light-emitting material be used in the light-emitting unit 446 and that the EL layer 100 illustrated in FIG. 1A be used in the light-emitting unit 447.

That is, the light-emitting element 452 includes a light-emitting layer 460 and a light-emitting layer 470. The light-emitting unit 446 includes a hole-injection layer 411, a hole-transport layer 412, an electron-transport layer 413, and an electron-injection layer 414 in addition to the light-emitting layer 460. The light-emitting unit 447 includes a hole-injection layer 415, a hole-transport layer 416, an electron-transport layer 417, and an electron-injection layer 418 in addition to the light-emitting layer 470.

The light-emitting element having two light-emitting units is described with reference to FIG. 5A; however, a similar structure can be applied to a light-emitting element in which three or more light-emitting units are stacked. With a plurality of light-emitting units partitioned by the charge-generation layer between a pair of electrodes as in the light-emitting element 452, it is possible to provide a light-emitting element which can emit light with high luminance with the current density kept low and has a long lifetime. A light-emitting element with low power consumption can be provided.

When the structure of the EL layer 100 shown in FIG. 1A is applied to at least one of the plurality of units, a light-emitting element with high emission efficiency can be provided.

The light-emitting layer 460 contains a host material 461 and a guest material 462. The light-emitting layer 470 contains a host material 471 and a guest material 472.

The host material 471 contains an organic compound 471_1 and an organic compound 471_2.

In this embodiment, the light-emitting layer 470 has a structure similar to that of the light-emitting layer 130 in FIG. 1A. That is, the host material 471, the organic compound 471_1, the organic compound 471_2, and the guest material 472 in the light-emitting layer 470 correspond to the host material 131, the organic compound 131_1, the organic compound 131_2, and the guest material 132 in the light-emitting layer 130, respectively. In the following description, the guest material 462 contained in the light-emitting layer 460 is a fluorescent material.

Emission Mechanism of Light-Emitting Layer 460

First, an emission mechanism of the light-emitting layer 460 will be described.

In the light-emitting layer 460, an excited state is generated by recombination of carriers. Because the amount of the host material 461 is large as compared to the guest material 462, the excited states are formed mostly as the excited states of the host material 461. The ratio of singlet excited states to triplet excited states caused by carrier recombination (hereinafter referred to as exciton generation probability) is approximately 1:3.

First, a case where the triplet excitation energy level of the host material 461 is higher than the triplet excitation energy level of the guest material 462 will be described below.

The triplet excited state of the host material 461 is transferred to the guest material 462 (triplet energy transfer). However, the guest material 462 in the triplet excitation energy state does not provide light emission in a visible light region because the guest material 462 is the fluorescent material. Thus, it is difficult to use the triplet excitation energy of the host material 461 for light emission. Therefore, when the triplet excitation energy level of the host material 461 is higher than the triplet excitation energy level of the guest material 462, it is difficult to use more than approximately 25% of injected carriers for light emission.

Figure 5B:
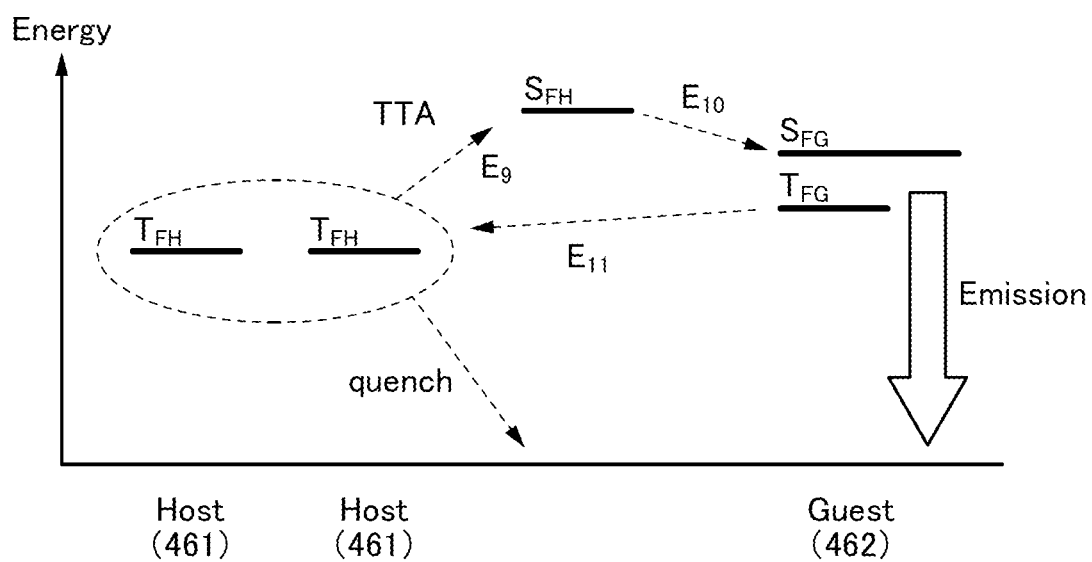

FIG. 5B illustrates the correlation of energy levels of the host material 461 and the guest material 462 in the light-emitting layer 460. The following explains what terms and signs in FIG. 5B represent:

Host (461): the host material 461;
Guest (462): the guest material 462 (fluorescent material);
$S_{FH}$: the level of the lowest singlet excited state of the host material 461;
$T_{FH}$: the level of the lowest triplet excited state of the host material 461;
$S_{FG}$: the level of the lowest singlet excited state of the guest material 462 (fluorescent material); and
$T_{FG}$: the level of the lowest triplet excited state of the guest material 462 (fluorescent material).

As illustrated in FIG. 5B, the triplet excitation energy level of the guest material 462 ($T_{FG}$ in FIG. 5B) is higher than the triplet excitation energy level of the host material 461 ($T_{FH}$ in FIG. 5B).

In addition, as illustrated in FIG. 5B, triplet excitons collide with each other by triplet-triplet annihilation (TTA) (see a route $E_9$ in FIG. 5B), and part of energy of them is converted into the level of the lowest singlet excited state of the host material 461 ($S_{FH}$). Energy is transferred from the level of the lowest singlet excited state of the host material ($S_{FH}$) to the level of the lowest singlet excited state of the guest material 462 (the fluorescent material) ($S_{FG}$) that is the level lower than $S_{FH}$ (see Route E10 in FIG. 5B); and thus the guest material 462 (the fluorescent material) emits light.

Because the triplet excitation energy level of the host material 462 is lower than the triplet excitation energy level of the guest material, energy is transferred from $T_{FG}$ to $T_{FH}$ without deactivation (see a route $E_{11}$ in FIG. 5B), which is utilized for TTA.

When the light-emitting layer 460 has the above structure, light emission from the guest material 462 of the light-emitting layer 460 can be efficiently obtained.

Note that the light-emitting layer 460 and the light-emitting layer 470 may be made to emit light with different emission wavelengths, so that the light-emitting element can be a multicolor light-emitting element. In that case, the emission spectrum of the light-emitting element is formed by combining light having different emission peaks, and thus has at least two peaks.

The above structure is also suitable for obtaining white light emission. When the light-emitting layer 460 and the light-emitting layer 470 emit light of complementary colors, white light emission can be obtained.

In addition, white light emission with a high color rendering property that is formed of three primary colors or four or more colors can be obtained by using a plurality of light-emitting materials emitting light with different wavelengths for one of the light-emitting layers 460 and 470 or both. In that case, one of the light-emitting layers 460 and 470 or both may be divided into layers and each of the divided layers may contain a different light-emitting material from the others.

Emission Mechanism of Light-Emitting Layer 470

An emission mechanism of the light-emitting layer 470 is similar to that of the light-emitting layer 130 in FIG. 3A.

Next, materials that can be used for the light-emitting layers 460 and 470 will be described.

Material that can be Used for Light-Emitting Layer 460

In the light-emitting layer 460, the host material 461 is present in the highest proportion in weight ratio, and the guest material 462 (the fluorescent material) is dispersed in the host material 461. The singlet excitation energy level of the host material 461 is preferably higher than the singlet excitation energy level of the guest material 462 (the fluorescent material), while the triplet excitation energy level of the host material 461 is preferably lower than the triplet excitation energy level of the guest material 462 (the fluorescent material).

An anthracene derivative or a tetracene derivative is preferably used as the host material 461. This is because these derivatives each have a high singlet excitation energy level and a low triplet excitation energy level. Specific examples include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), and 9-phenyl-10-{4-(9-phenyl-9H-fluoren-9-yl)biphenyl-4'-yl}anthracene (abbreviation: FLPPA). Besides, 5,12-diphenyltetracene, 5,12-bis(biphenyl-2-yl)tetracene, and the like can be given.

Examples of the guest material 462 (the fluorescent material) include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, a naphthalene derivative, and the like. A pyrene derivative is particularly preferable because it has a high emission quantum yield. Specific examples of the pyrene derivative include N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-dipheny-N,N'-bis[4-(9-phenyl-9H-fluoren-9-yl)phenyl]pyrene-1,6-diamine (abbreviation: 1,6FLPAPrn), N,N'-bis(dibenzofuran-2-yl)-N,N'-diphenylpyrene-1,6-diamine (abbreviation: 1,6FrAPrn), N,N'-bis(dibenzothiophene-2-yl)-N,N'-diphenylpyrene-1,6-diamine (abbreviation: 1,6 ThAPrn), and the like. Any of the materials exemplified as the guest material 132 in Embodiment 1 can be used.

Material that can be Used for Light-Emitting Layer 470

A material that can be used for the light-emitting layer 130 described in Embodiment 1 may be used as a material that can be used for the light-emitting layer 470.

There is no limitation on the emission colors of the light-emitting material included in the light-emitting layer 460 and the light-emitting material included in the light-emitting layer 470, and they may be the same or different. Light emitted from the light-emitting materials is mixed and extracted out of the element; therefore, for example, in the case where their emission colors are complementary colors, the light-emitting element can emit white light. In consideration of the reliability of the light-emitting element, the emission peak wavelength of the light-emitting material contained in the light-emitting layer 460 is preferably shorter than that of the light-emitting material contained in the light-emitting layer 470.

Note that the light-emitting layers 460 and 470 can be formed by an evaporation method (including a vacuum evaporation method), an inkjet method, a coating method, gravure printing, or the like.

Note that the above-described structure can be combined with any of the structures in this embodiment and the other embodiments.

Embodiment 4

In this embodiment, a display device including a light-emitting element of one embodiment of the present invention will be described with reference to FIGS. 6A and 6B.

Figure 6A:
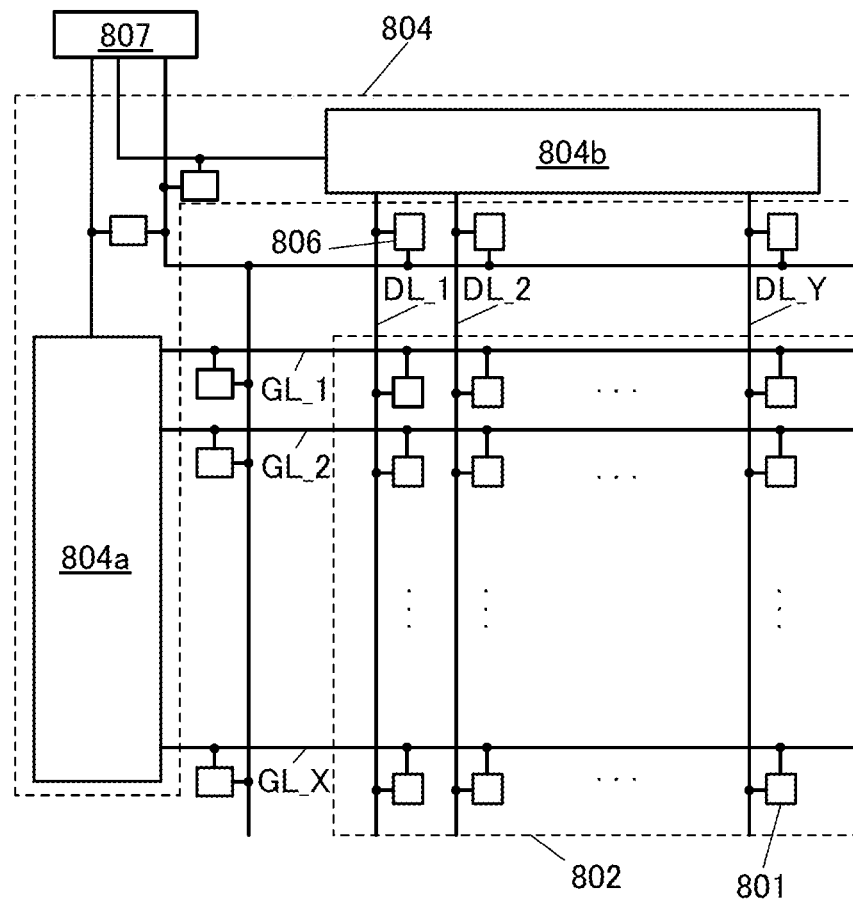
FIGS. 6A and 6B are a block diagram and a circuit diagram illustrating a display device of one embodiment of the present invention.
Figure 6B:
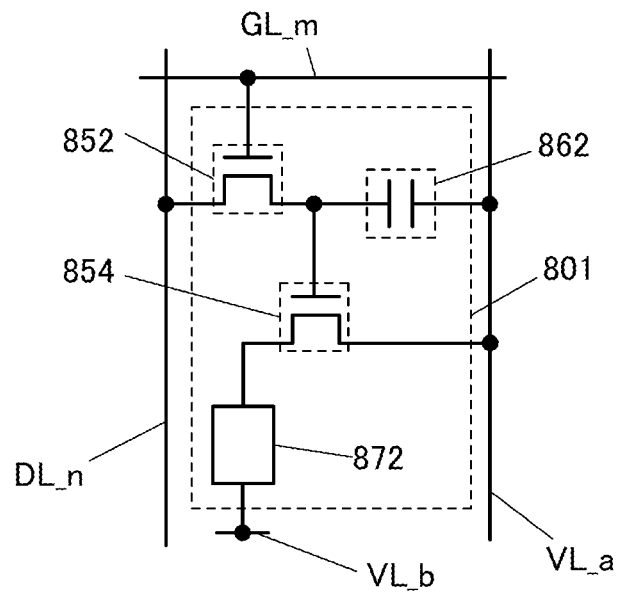

FIG. 6A is a block diagram illustrating the display device of one embodiment of the present invention, and FIG. 6B is a circuit diagram illustrating a pixel circuit of the display device of one embodiment of the present invention.

Display Device

The display device illustrated in FIG. 6A includes a region including pixels of display elements (the region is hereinafter referred to as a pixel portion 802), a circuit portion provided outside the pixel portion 802 and including circuits for driving the pixels (the portion is hereinafter referred to as a driver circuit portion 804), circuits having a function of protecting elements (the circuits are hereinafter referred to as protection circuits 806), and a terminal portion 807. Note that the protection circuits 806 are not necessarily provided.

A part or the whole of the driver circuit portion 804 is preferably formed over a substrate over which the pixel portion 802 is formed, in which case the number of components and the number of terminals can be reduced. When a part or the whole of the driver circuit portion 804 is not formed over the substrate over which the pixel portion 802 is formed, the part or the whole of the driver circuit portion 804 can be mounted by chip-on-glass (COG) or tape automated bonding (TAB).

The pixel portion 802 includes a plurality of circuits for driving display elements arranged in X rows (X is a natural number of 2 or more) and Y columns (Y is a natural number of 2 or more) (such circuits are hereinafter referred to as pixel circuits 801). The driver circuit portion 804 includes driver circuits such as a circuit for supplying a signal (scan signal) to select a pixel (the circuit is hereinafter referred to as a scan line driver circuit 804a) and a circuit for supplying a signal (data signal) to drive a display element in a pixel (the circuit is hereinafter referred to as a signal line driver circuit 804b).

The scan line driver circuit 804a includes a shift register or the like. Through the terminal portion 807, the scan line driver circuit 804a receives a signal for driving the shift register and outputs a signal. For example, the scan line driver circuit 804a receives a start pulse signal, a clock signal, or the like and outputs a pulse signal. The scan line driver circuit 804a has a function of controlling the potentials of wirings supplied with scan signals (such wirings are hereinafter referred to as scan lines GL_1 to GL_X). Note that a plurality of scan line driver circuits 804a may be provided to control the scan lines GL_1 to GL_X separately. Alternatively, the scan line driver circuit 804a has a function of supplying an initialization signal. Without being limited thereto, the scan line driver circuit 804a can supply another signal.

The signal line driver circuit 804b includes a shift register or the like. The signal line driver circuit 804b receives a signal (video signal) from which a data signal is derived, as well as a signal for driving the shift register, through the terminal portion 807. The signal line driver circuit 804b has a function of generating a data signal to be written to the pixel circuit 801 which is based on the video signal. In addition, the signal line driver circuit 804b has a function of controlling output of a data signal in response to a pulse signal produced by input of a start pulse signal, a clock signal, or the like. Furthermore, the signal line driver circuit 804b has a function of controlling the potentials of wirings supplied with data signals (such wirings are hereinafter referred to as data lines DL_1 to DL_Y). Alternatively, the signal line driver circuit 804b has a function of supplying an initialization signal. Without being limited thereto, the signal line driver circuit 804b can supply another signal.

The signal line driver circuit 804b includes a plurality of analog switches or the like, for example. The signal line driver circuit 804b can output, as the data signals, signals obtained by time-dividing the video signal by sequentially turning on the plurality of analog switches. The signal line driver circuit 804b may include a shift register or the like.

A pulse signal and a data signal are input to each of the plurality of pixel circuits 801 through one of the plurality of scan lines GL supplied with scan signals and one of the plurality of data lines DL supplied with data signals, respectively. Writing and holding of the data signal to and in each of the plurality of pixel circuits 801 are controlled by the scan line driver circuit 804a. For example, to the pixel circuit 801 in the m-th row and the n-th column (m is a natural number of less than or equal to X, and n is a natural number of less than or equal to Y), a pulse signal is input from the scan line driver circuit 804a through the scan line GL_m, and a data signal is input from the signal line driver circuit 804b through the data line DL_n in accordance with the potential of the scan line GL_m.

The protection circuit 806 shown in FIG. 6A is connected to, for example, the scan line GL between the scan line driver circuit 804a and the pixel circuit 801. Alternatively, the protection circuit 806 is connected to the data line DL between the signal line driver circuit 804b and the pixel circuit 801. Alternatively, the protection circuit 806 can be connected to a wiring between the scan line driver circuit 804a and the terminal portion 807. Alternatively, the protection circuit 806 can be connected to a wiring between the signal line driver circuit 804b and the terminal portion 807. Note that the terminal portion 807 means a portion having terminals for inputting power, control signals, and video signals to the display device from external circuits.

The protection circuit 806 is a circuit that electrically connects a wiring connected to the protection circuit to another wiring when a potential out of a certain range is applied to the wiring connected to the protection circuit.

As illustrated in FIG. 6A, the protection circuits 806 are provided for the pixel portion 802 and the driver circuit portion 804, so that the resistance of the display device to overcurrent generated by electrostatic discharge (ESD) or the like can be improved. Note that the configuration of the protection circuits 806 is not limited to that, and for example, a configuration in which the protection circuits 806 are connected to the scan line driver circuit 804a or a configuration in which the protection circuits 806 are connected to the signal line driver circuit 804b may be employed. Alternatively, the protection circuits 806 may be configured to be connected to the terminal portion 807.

In FIG. 6A, an example in which the driver circuit portion 804 includes the scan line driver circuit 804a and the signal line driver circuit 804b is shown; however, the structure is not limited thereto. For example, only the scan line driver circuit 804a may be formed and a separately prepared substrate where a signal line driver circuit is formed (e.g., a driver circuit substrate formed with a single crystal semiconductor film or a polycrystalline semiconductor film) may be mounted.

Structural Example of Pixel Circuit

Each of the plurality of pixel circuits 801 in FIG. 6A can have a structure illustrated in FIG. 6B, for example.

The pixel circuit 801 illustrated in FIG. 6B includes transistors 852 and 854, a capacitor 862, and a light-emitting element 872.

One of a source electrode and a drain electrode of the transistor 852 is electrically connected to a wiring to which a data signal is supplied (hereinafter referred to as a signal line DL_n). A gate electrode of the transistor 852 is electrically connected to a wiring to which a gate signal is supplied (hereinafter referred to as a scan line GL_m).

The transistor 852 has a function of controlling whether to write a data signal.

One of a pair of electrodes of the capacitor 862 is electrically connected to a wiring to which a potential is supplied (hereinafter referred to as a potential supply line VL_a), and the other is electrically connected to the other of the source electrode and the drain electrode of the transistor 852.

The capacitor 862 functions as a storage capacitor for storing written data.

One of a source electrode and a drain electrode of the transistor 854 is electrically connected to the potential supply line VL_a. Furthermore, a gate electrode of the transistor 854 is electrically connected to the other of the source electrode and the drain electrode of the transistor 852.

One of an anode and a cathode of the light-emitting element 872 is electrically connected to a potential supply line VL_b, and the other is electrically connected to the other of the source electrode and the drain electrode of the transistor 854.

As the light-emitting element 872, any of the light-emitting elements described in Embodiments 1 to 3 can be used.

Note that a high power supply potential VDD is supplied to one of the potential supply line VL_a and the potential supply line VL_b, and a low power supply potential VSS is supplied to the other.

In the display device including the pixel circuits 801 in FIG. 6B, the pixel circuits 801 are sequentially selected row by row by the scan line driver circuit 804a in FIG. 6A, for example, whereby the transistors 852 are turned on and a data signal is written.

When the transistors 852 are turned off, the pixel circuits 801 in which the data has been written are brought into a holding state. Furthermore, the amount of current flowing between the source electrode and the drain electrode of the transistor 854 is controlled in accordance with the potential of the written data signal. The light-emitting element 872 emits light with a luminance corresponding to the amount of flowing current. This operation is sequentially performed row by row; thus, an image is displayed.

A light-emitting element of one embodiment of the present invention can be used for an active matrix method in which an active element is included in a pixel of a display device or a passive matrix method in which an active element is not included in a pixel of a display device.

In the active matrix method, as an active element (a non-linear element), not only a transistor but also a variety of active elements (non-linear elements) can be used. For example, a metal insulator metal (MIM), a thin film diode (TFD), or the like can also be used. Since these elements can be formed with a smaller number of manufacturing steps, manufacturing cost can be reduced or yield can be improved. Alternatively, since the size of these elements is small, the aperture ratio can be improved, so that power consumption can be reduced or higher luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or yield can be improved. Alternatively, since an active element (a non-linear element) is not used, the aperture ratio can be improved, so that power consumption can be reduced or higher luminance can be achieved, for example.

The structure described in this embodiment can be combined with any of the structures described in the other embodiments as appropriate.

Embodiment 5

In this embodiment, a display device including a light-emitting element of one embodiment of the present invention and an electronic device in which the display device is provided with an input device will be described with reference to FIGS. 7A and 7B, FIGS. 8A to 8C, FIGS. 9A and 9B, FIGS. 10A and 10B, and FIG. 11.

Description 1 of Touch Panel

In this embodiment, a touch panel 2000 including a display device and an input device will be described as an example of an electronic device. In addition, an example in which a touch sensor is used as an input device will be described.

Figure 7A:
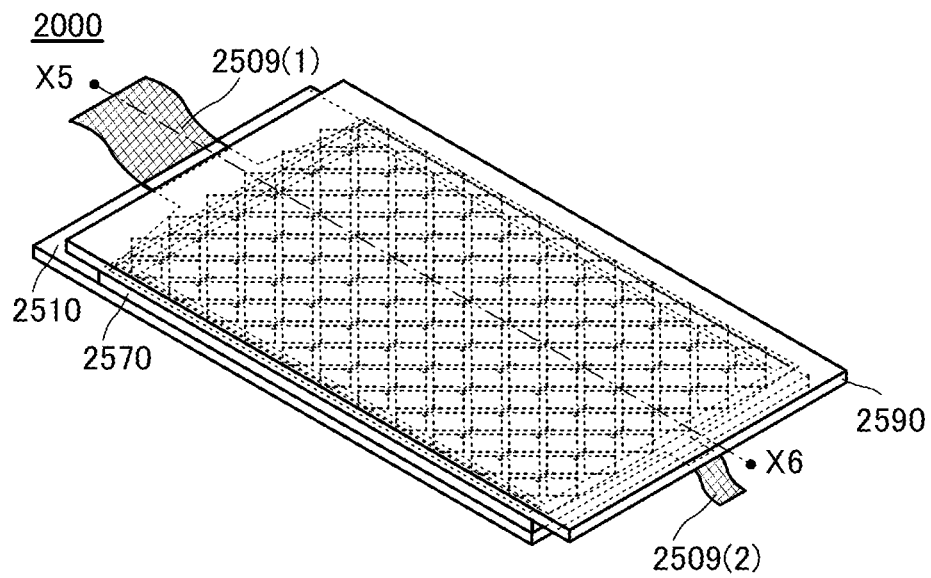
FIGS. 7A and 7B are perspective views of an example of a touch panel of one embodiment of the present invention.
Figure 7B:
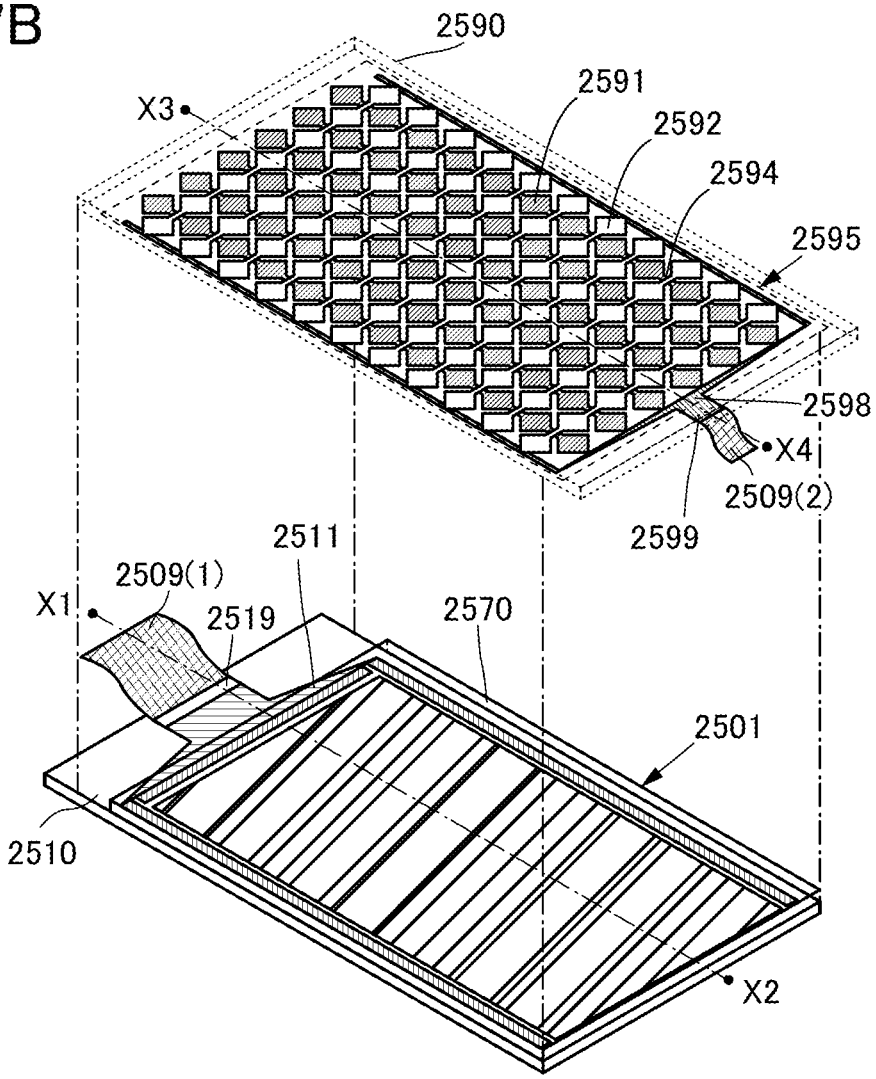

FIGS. 7A and 7B are perspective views of the touch panel 2000. Note that FIGS. 7A and 7B illustrate only main components of the touch panel 2000 for simplicity.

The touch panel 2000 includes a display device 2501 and a touch sensor 2595 (see FIG. 7B). The touch panel 2000 also includes a substrate 2510, a substrate 2570, and a substrate 2590. The substrate 2510, the substrate 2570, and the substrate 2590 each have flexibility. Note that one or all of the substrates 2510, 2570, and 2590 may be inflexible.

The display device 2501 includes a plurality of pixels over the substrate 2510 and a plurality of wirings 2511 through which signals are supplied to the pixels. The plurality of wirings 2511 are led to a peripheral portion of the substrate 2510, and parts of the plurality of wirings 2511 form a terminal 2519. The terminal 2519 is electrically connected to an FPC 2509(1).

The substrate 2590 includes the touch sensor 2595 and a plurality of wirings 2598 electrically connected to the touch sensor 2595. The plurality of wirings 2598 are led to a peripheral portion of the substrate 2590, and parts of the plurality of wirings 2598 form a terminal. The terminal is electrically connected to an FPC 2509(2). Note that in FIG.

7B, electrodes, wirings, and the like of the touch sensor 2595 provided on the back side of the substrate 2590 (the side facing the substrate 2510) are indicated by solid lines for clarity.

As the touch sensor 2595, a capacitive touch sensor can be used. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive type is preferable because multiple points can be sensed simultaneously.

Note that the touch sensor 2595 illustrated in FIG. 7B is an example of using a projected capacitive touch sensor.

Note that a variety of sensors that can sense proximity or touch of a sensing target such as a finger can be used as the touch sensor 2595.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598.

The electrodes 2592 each have a shape of a plurality of quadrangles arranged in one direction with one corner of a quadrangle connected to one corner of another quadrangle as illustrated in FIGS. 7A and 7B.

The electrodes 2591 each have a quadrangular shape and are arranged in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region where the electrodes are not provided, reducing variation in transmittance. As a result, variation in luminance of light passing through the touch sensor 2595 can be reduced.

Note that the shapes of the electrodes 2591 and the electrodes 2592 are not limited thereto and can be any of a variety of shapes. For example, a structure may be employed in which the plurality of electrodes 2591 are arranged so that gaps between the electrodes 2591 are reduced as much as possible, and the electrodes 2592 are spaced apart from the electrodes 2591 with an insulating layer interposed therebetween to have regions not overlapping with the electrodes 2591. In this case, it is preferable to provide, between two adjacent electrodes 2592, a dummy electrode electrically insulated from these electrodes because the area of regions having different transmittances can be reduced.

Display Device

Figure 8A:
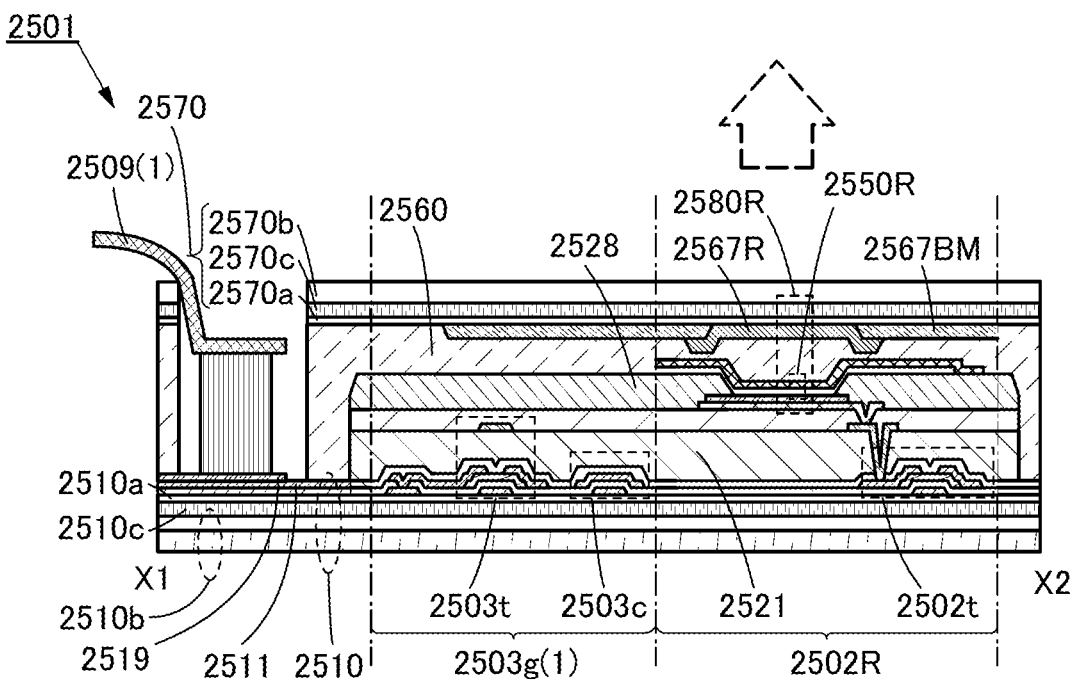
FIGS. 8A to 8C are cross-sectional views of examples of a display device and a touch sensor of one embodiment of the present invention.

Next, the display device 2501 will be described in detail with reference to FIG. 8A. FIG. 8A corresponds to a cross-sectional view taken along dashed-dotted line X1-X2 in FIG. 7B.

The display device 2501 includes a plurality of pixels arranged in a matrix. Each of the pixels includes a display element and a pixel circuit for driving the display element.

In the following description, an example of using a light-emitting element that emits white light as a display element will be described; however, the display element is not limited to such an element. For example, light-emitting elements that emit light of different colors may be included so that the light of different colors can be emitted from adjacent pixels.

For the substrate 2510 and the substrate 2570, for example, a flexible material with a vapor permeability of lower than or equal to $1\times10^{-5}$ g·m$^{-2}$·day$^{-1}$, preferably lower than or equal to $1\times10^{-6}$ g·m$^{-2}$·day$^{-1}$ can be favorably used. Alternatively, materials whose thermal expansion coefficients are substantially equal to each other are preferably used for the substrate 2510 and the substrate 2570. For example, the coefficients of linear expansion of the materials are preferably lower than or equal to $1\times10^{-3}$/K, further preferably lower than or equal to $5\times10^{-5}$/K, and still further preferably lower than or equal to $1\times10^{-5}$/K.

Note that the substrate 2510 is a stacked body including an insulating layer 2510a for preventing impurity diffusion into the light-emitting element, a flexible substrate 2510b, and an adhesive layer 2510c for attaching the insulating layer 2510a and the flexible substrate 2510b to each other. The substrate 2570 is a stacked body including an insulating layer 2570a for preventing impurity diffusion into the light-emitting element, a flexible substrate 2570b, and an adhesive layer 2570c for attaching the insulating layer 2570a and the flexible substrate 2570b to each other.

For the adhesive layer 2510c and the adhesive layer 2570c, for example, polyester, polyolefin, polyamide (e.g., nylon, aramid), polyimide, polycarbonate, or an acrylic resin, polyurethane, or an epoxy resin, or a material which includes a resin having a siloxane bond such as silicone can be used.

A sealing layer 2560 is provided between the substrate 2510 and the substrate 2570. The sealing layer 2560 preferably has a refractive index higher than that of air. In the case where light is extracted to the sealing layer 2560 side as illustrated in FIG. 8A, the sealing layer 2560 can also serve as an optical adhesive layer.

A sealant may be formed in the peripheral portion of the sealing layer 2560. With the use of the sealant, a light-emitting element 2550R can be provided in a region surrounded by the substrate 2510, the substrate 2570, the sealing layer 2560, and the sealant. Note that an inert gas (such as nitrogen or argon) may be used instead of the sealing layer 2560. A drying agent may be provided in the inert gas so as to adsorb moisture or the like. An ultraviolet curable resin or a heat curable resin may be used; for example, a polyvinyl chloride (PVC) based resin, an acrylic resin, a polyimide-based resin, an epoxy-based resin, a silicone-based resin, a polyvinyl butyral (PVB) based resin, or an ethylene vinyl acetate (EVA) based resin can be used. For example, an epoxy-based resin or a glass frit is preferably used as the sealant. As a material used for the sealant, a material which is impermeable to moisture or oxygen is preferably used.

The display device 2501 includes a pixel 2502R. The pixel 2502R includes a light-emitting module 2580R.

The pixel 2502R includes the light-emitting element 2550R and a transistor 2502t that can supply electric power to the light-emitting element 2550R. Note that the transistor 2502t functions as part of the pixel circuit. The light-emitting module 2580R includes the light-emitting element 2550R and a coloring layer 2567R.

The light-emitting element 2550R includes a lower electrode, an upper electrode, and an EL layer between the lower electrode and the upper electrode. As the light-emitting element 2550R, any of the light-emitting elements described in Embodiments 1 to 3 can be used, for example.

A microcavity structure may be employed between the lower electrode and the upper electrode so as to increase the intensity of light having a specific wavelength.

In the case where the sealing layer 2560 is provided on the light extraction side, the sealing layer 2560 is in contact with the light-emitting element 2550R and the coloring layer 2567R.

The coloring layer 2567R is positioned in a region overlapping with the light-emitting element 2550R. Accordingly, part of light emitted from the light-emitting element 2550R passes through the coloring layer 2567R and is emitted to the outside of the light-emitting module 2580R as indicated by an arrow in FIG. 8A.

The display device 2501 includes a light-blocking layer 2567BM on the light extraction side. The light-blocking layer 2567BM is provided so as to surround the coloring layer 2567R.

The coloring layer 2567R is a coloring layer having a function of transmitting light in a particular wavelength region. For example, a color filter for transmitting light in a red wavelength range, a color filter for transmitting light in a green wavelength range, a color filter for transmitting light in a blue wavelength range, a color filter for transmitting light in a yellow wavelength range, or the like can be used. Each color filter can be formed with any of various materials by a printing method, an inkjet method, an etching method using a photolithography technique, or the like.

An insulating layer 2521 is provided in the display device 2501. The insulating layer 2521 covers the transistor 2502t. Note that the insulating layer 2521 has a function of planarizing unevenness caused by the pixel circuit. The insulating layer 2521 may have a function of suppressing impurity diffusion. This can prevent the reliability of the transistor 2502t or the like from being lowered by impurity diffusion.

The light-emitting element 2550R is formed over the insulating layer 2521. A partition 2528 is provided so as to overlap with an end portion of the lower electrode of the light-emitting element 2550R. Note that a spacer for controlling the distance between the substrate 2510 and the substrate 2570 may be formed over the partition 2528.

A scan line driver circuit 2503g(1) includes a transistor 2503t and a capacitor 2503c. Note that the driver circuit can be formed in the same process and over the same substrate as those of the pixel circuits.

The wirings 2511 through which signals can be supplied are provided over the substrate 2510. The terminal 2519 is provided over the wirings 2511. The FPC 2509(1) is electrically connected to the terminal 2519. The FPC 2509(1) has a function of supplying a video signal, a clock signal, a start signal, a reset signal, or the like. Note that the FPC 2509(1) may be provided with a printed wiring board (PWB).

Figure 8B:
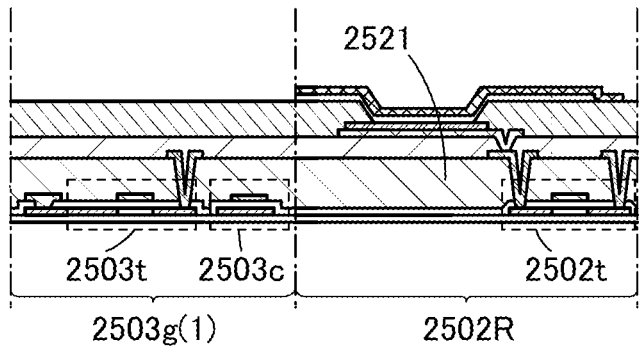

In the display device 2501, transistors with any of a variety of structures can be used. FIG. 8A illustrates an example of using bottom-gate transistors; however, the present invention is not limited to this example, and top-gate transistors may be used in the display device 2501 as illustrated in FIG. 8B.

In addition, there is no particular limitation on the polarity of the transistor 2502t and the transistor 2503t. For these transistors, n-channel and p-channel transistors may be used, or either n-channel transistors or p-channel transistors may be used, for example. Furthermore, there is no particular limitation on the crystallinity of a semiconductor film used for the transistors 2502t and 2503t. For example, an amorphous semiconductor film or a crystalline semiconductor film may be used. Examples of semiconductor materials include Group 13 semiconductors (e.g., a semiconductor including gallium), Group 14 semiconductors (e.g., a semiconductor including silicon), compound semiconductors (including oxide semiconductors), organic semiconductors, and the like. An oxide semiconductor that has an energy gap of 2 eV or more, preferably 2.5 eV or more, further preferably 3 eV or more is preferably used for one of the transistors 2502t and 2503t or both, so that the off-state current of the transistors can be reduced. Examples of the oxide semiconductors include an In—Ga oxide, an In-M-Zn oxide (M represents aluminum (Al), gallium (Ga), yttrium (Y), zirconium (Zr), lanthanum (La), cerium (Ce), tin (Sn), hafnium (Hf), or neodymium (Nd)), and the like.

Touch Sensor

Figure 8C:
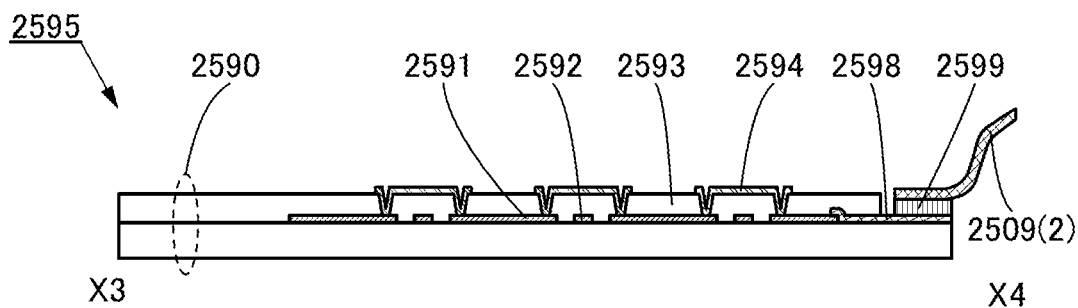

Next, the touch sensor 2595 will be described in detail with reference to FIG. 8C. FIG. 8C corresponds to a cross-sectional view taken along dashed-dotted line X3-X4 in FIG. 7B.

The touch sensor 2595 includes the electrodes 2591 and the electrodes 2592 provided in a staggered arrangement on the substrate 2590, an insulating layer 2593 covering the electrodes 2591 and the electrodes 2592, and the wiring 2594 that electrically connects the adjacent electrodes 2591 to each other.

The electrodes 2591 and the electrodes 2592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film containing graphene oxide. As a reducing method, a method with application of heat or the like can be employed.

The electrodes 2591 and the electrodes 2592 may be formed by, for example, depositing a light-transmitting conductive material on the substrate 2590 by a sputtering method and then removing an unnecessary portion by any of various pattern forming techniques such as photolithography.

Examples of a material for the insulating layer 2593 are a resin such as an acrylic resin or an epoxy resin, a resin having a siloxane bond, and an inorganic insulating material such as silicon oxide, silicon oxynitride, or aluminum oxide.

Openings reaching the electrodes 2591 are formed in the insulating layer 2593, and the wiring 2594 electrically connects the adjacent electrodes 2591. A light-transmitting conductive material can be favorably used as the wiring 2594 because the aperture ratio of the touch panel can be increased. Moreover, a material with higher conductivity than the conductivities of the electrodes 2591 and 2592 can be favorably used for the wiring 2594 because electric resistance can be reduced.

One electrode 2592 extends in one direction, and a plurality of electrodes 2592 are provided in the form of stripes. The wiring 2594 intersects with the electrode 2592.

Adjacent electrodes 2591 are provided with one electrode 2592 provided therebetween. The wiring 2594 electrically connects the adjacent electrodes 2591.

Note that the plurality of electrodes 2591 are not necessarily arranged in the direction orthogonal to one electrode 2592 and may be arranged to intersect with one electrode 2592 at an angle of more than 0 degrees and less than 90 degrees.

The wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 2593 and the wiring 2594 may be provided to protect the touch sensor 2595.

A connection layer 2599 electrically connects the wiring 2598 to the FPC 2509(2).

As the connection layer 2599, any of various anisotropic conductive films (ACF), anisotropic conductive pastes (ACP), or the like can be used.

Description 2 of Touch Panel

Figure 9A:
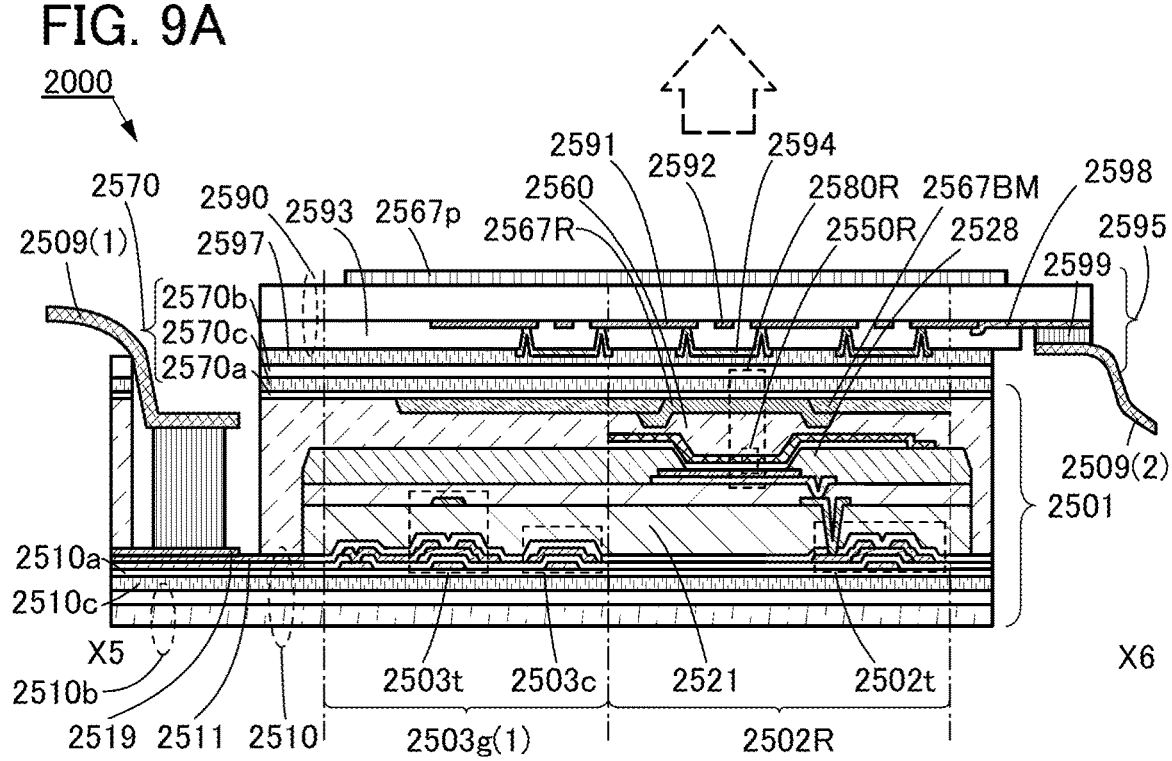
FIGS. 9A and 9B are cross-sectional views of examples of a touch panel of one embodiment of the present invention.

Next, the touch panel 2000 will be described in detail with reference to FIG. 9A. FIG. 9A corresponds to a cross-sectional view taken along dashed-dotted line X5-X6 in FIG. 7A.

In the touch panel 2000 illustrated in FIG. 9A, the display device 2501 described with reference to FIG. 8A and the touch sensor 2595 described with reference to FIG. 8C are attached to each other.

The touch panel 2000 illustrated in FIG. 9A includes an adhesive layer 2597 and an anti-reflective layer 2567p in addition to the components described with reference to FIGS. 8A and 8C.

The adhesive layer 2597 is provided in contact with the wiring 2594. Note that the adhesive layer 2597 attaches the substrate 2590 to the substrate 2570 so that the touch sensor 2595 overlaps with the display device 2501. The adhesive layer 2597 preferably has a light-transmitting property. A heat curable resin or an ultraviolet curable resin can be used for the adhesive layer 2597. For example, an acrylic-based resin, an urethane-based resin, an epoxy-based resin, or a siloxane-based resin can be used.

The anti-reflective layer 2567p is positioned in a region overlapping with pixels. As the anti-reflective layer 2567p, a circularly polarizing plate can be used, for example.

Next, a touch panel having a structure different from that illustrated in FIG. 9A will be described with reference to FIG. 9B.

Figure 9B:
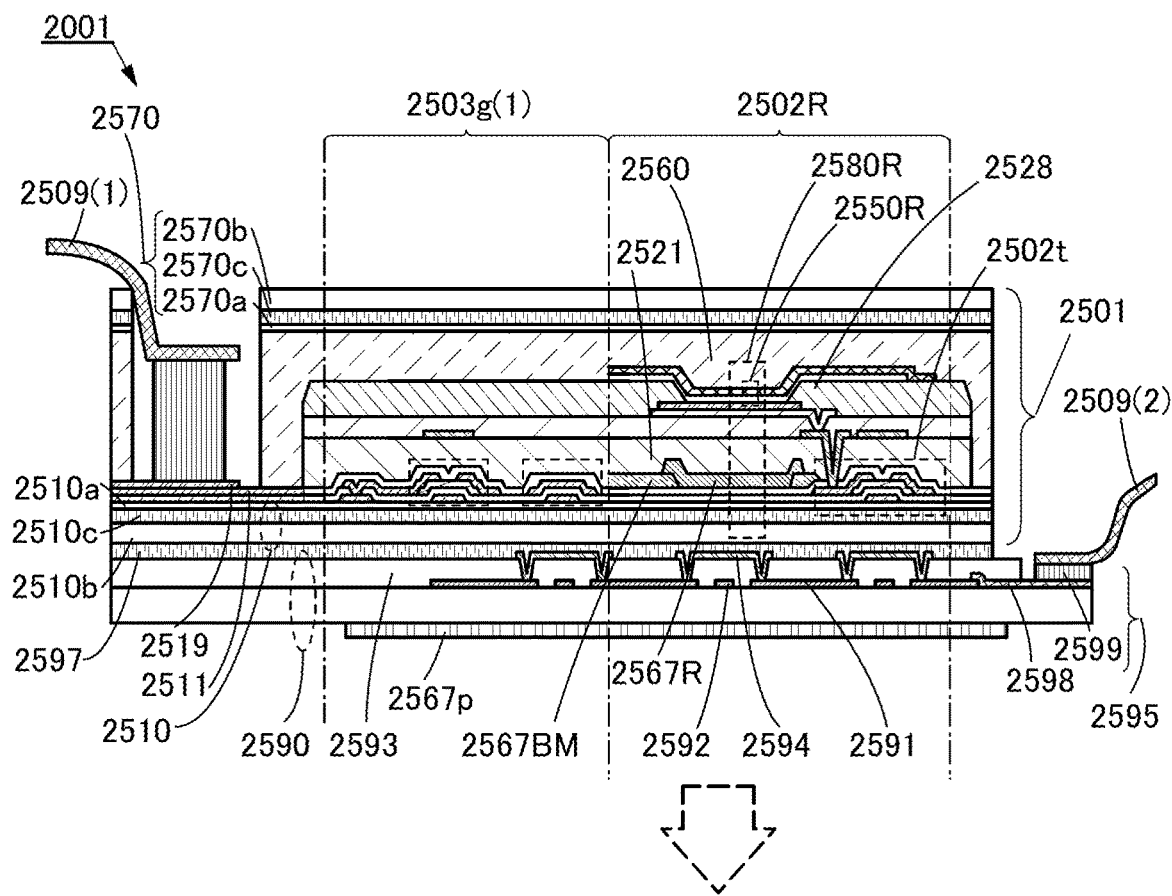

FIG. 9B is a cross-sectional view of a touch panel 2001. The touch panel 2001 illustrated in FIG. 9B differs from the touch panel 2000 illustrated in FIG. 9A in the position of the touch sensor 2595 relative to the display device 2501. Different parts are described in detail below, and the above description of the touch panel 2000 is referred to for the other similar parts.

The coloring layer 2567R is positioned in a region overlapping with the light-emitting element 2550R. The light-emitting element 2550R illustrated in FIG. 9B emits light to the side where the transistor 2502t is provided. Accordingly, part of light emitted from the light-emitting element 2550R passes through the coloring layer 2567R and is emitted to the outside of the light-emitting module 2580R as indicated by an arrow in FIG. 9B.

The touch sensor 2595 is provided on the substrate 2510 side of the display device 2501.

The adhesive layer 2597 is provided between the substrate 2510 and the substrate 2590 and attaches the touch sensor 2595 to the display device 2501.

As illustrated in FIG. 9A or 9B, light may be emitted from the light-emitting element to one of upper and lower sides, or both, of the substrate.

Method for Driving Touch Panel

Next, an example of a method for driving a touch panel will be described with reference to FIGS. 10A and 10B.

Figure 10A:
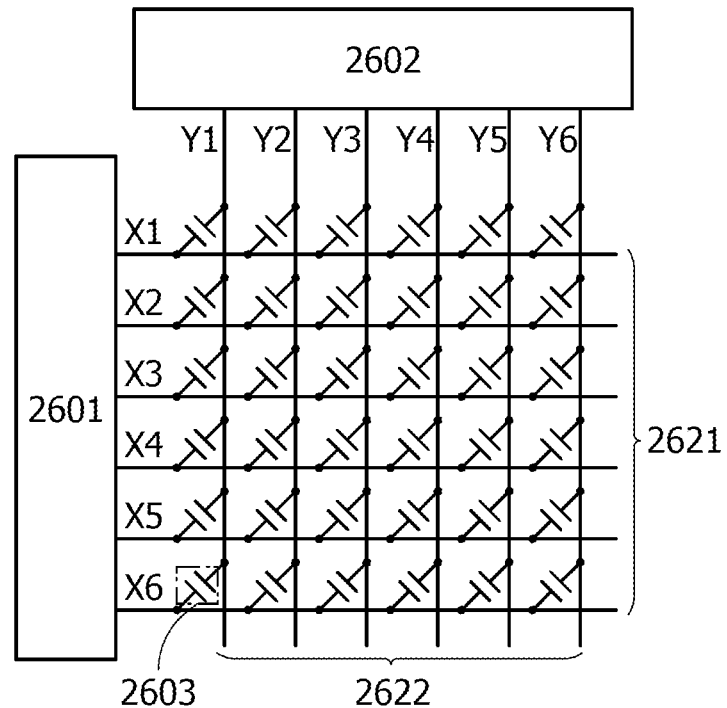
FIGS. 10A and 10B are a block diagram and a timing chart of a touch sensor of one embodiment of the present invention.

FIG. 10A is a block diagram illustrating the structure of a mutual capacitive touch sensor. FIG. 10A illustrates a pulse voltage output circuit 2601 and a current sensing circuit 2602. Note that in FIG. 10A, six wirings X1 to X6 represent the electrodes 2621 to which a pulse voltage is applied, and six wirings Y1 to Y6 represent the electrodes 2622 that detect changes in current. FIG. 10A also illustrates capacitors 2603 that are each formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for sensing of current values.

Figure 10B:
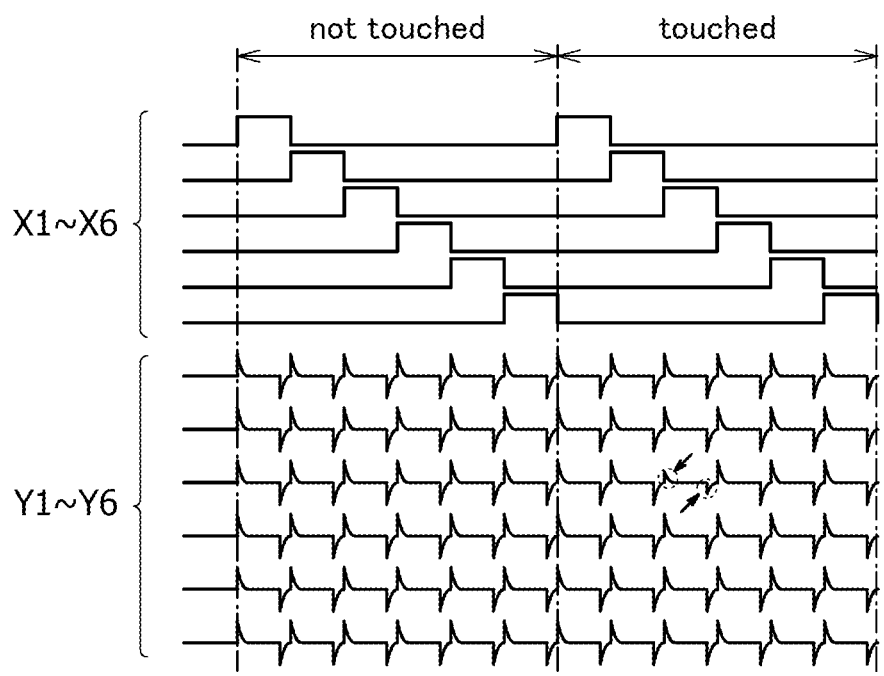

FIG. 10B is a timing chart showing input and output waveforms in the mutual capacitive touch sensor illustrated in FIG. 10A. In FIG. 10B, sensing of a sensing target is performed in all the rows and columns in one frame period. FIG. 10B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change in accordance with changes in the voltages of the wirings X1 to X6. The current value is decreased at the point of approach or contact of a sensing target and accordingly the waveform of the voltage value changes.

By detecting a change in mutual capacitance in this manner, the approach or contact of a sensing target can be sensed.

Sensor Circuit

Figure 11:
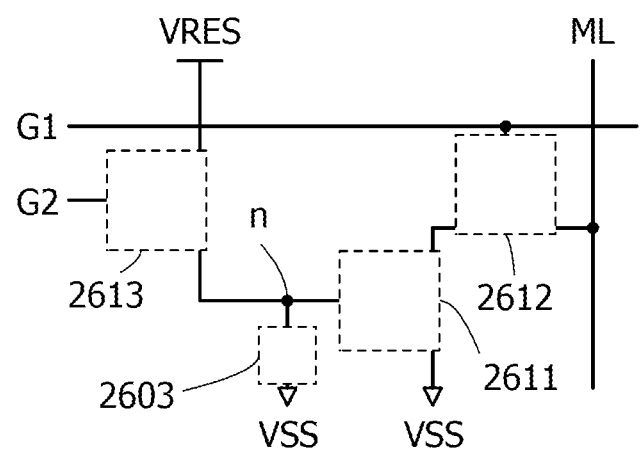
FIG. 11 is a circuit diagram of a touch sensor of one embodiment of the present invention.

Although FIG. 10A illustrates a passive matrix type touch sensor in which only the capacitor 2603 is provided at the intersection of wirings as a touch sensor, an active matrix type touch sensor including a transistor and a capacitor may be used. FIG. 11 illustrates an example of a sensor circuit included in an active matrix type touch sensor.

The sensor circuit in FIG. 11 includes the capacitor 2603 and transistors 2611, 2612, and 2613.

A signal G2 is input to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. A signal G1 is input to a gate of the transistor 2612, and a wiring ML is electrically connected to the other of the source and the drain of the transistor 2612. The voltage VSS is applied to the other electrode of the capacitor 2603.

Next, the operation of the sensor circuit in FIG. 11 will be described. First, a potential for turning on the transistor 2613 is supplied as the signal G2, and a potential with respect to the voltage VRES is thus applied to the node n connected to the gate of the transistor 2611. Then, a potential for turning off the transistor 2613 is applied as the signal G2, whereby the potential of the node n is maintained.

Then, mutual capacitance of the capacitor 2603 changes owing to the approach or contact of a sensing target such as a finger, and accordingly the potential of the node n is changed from VRES.

In reading operation, a potential for turning on the transistor 2612 is supplied as the signal G1. A current flowing through the transistor 2611, that is, a current flowing through the wiring ML is changed in accordance with the potential of the node n. By sensing this current, the approach or contact of a sensing target can be sensed.

In each of the transistors 2611, 2612, and 2613, an oxide semiconductor layer is preferably used as a semiconductor layer in which a channel region is formed. In particular, such a transistor is preferably used as the transistor 2613 so that the potential of the node n can be held for a long time and the frequency of operation of resupplying VRES to the node n (refresh operation) can be reduced.

The structure described in this embodiment can be combined with any of the structures described in the other embodiments as appropriate.

Embodiment 6

In this embodiment, a display module and electronic devices including a light-emitting element of one embodiment of the present invention will be described with reference to FIG. 12 and FIGS. 13A to 13G.

Display Module

Figure 12:
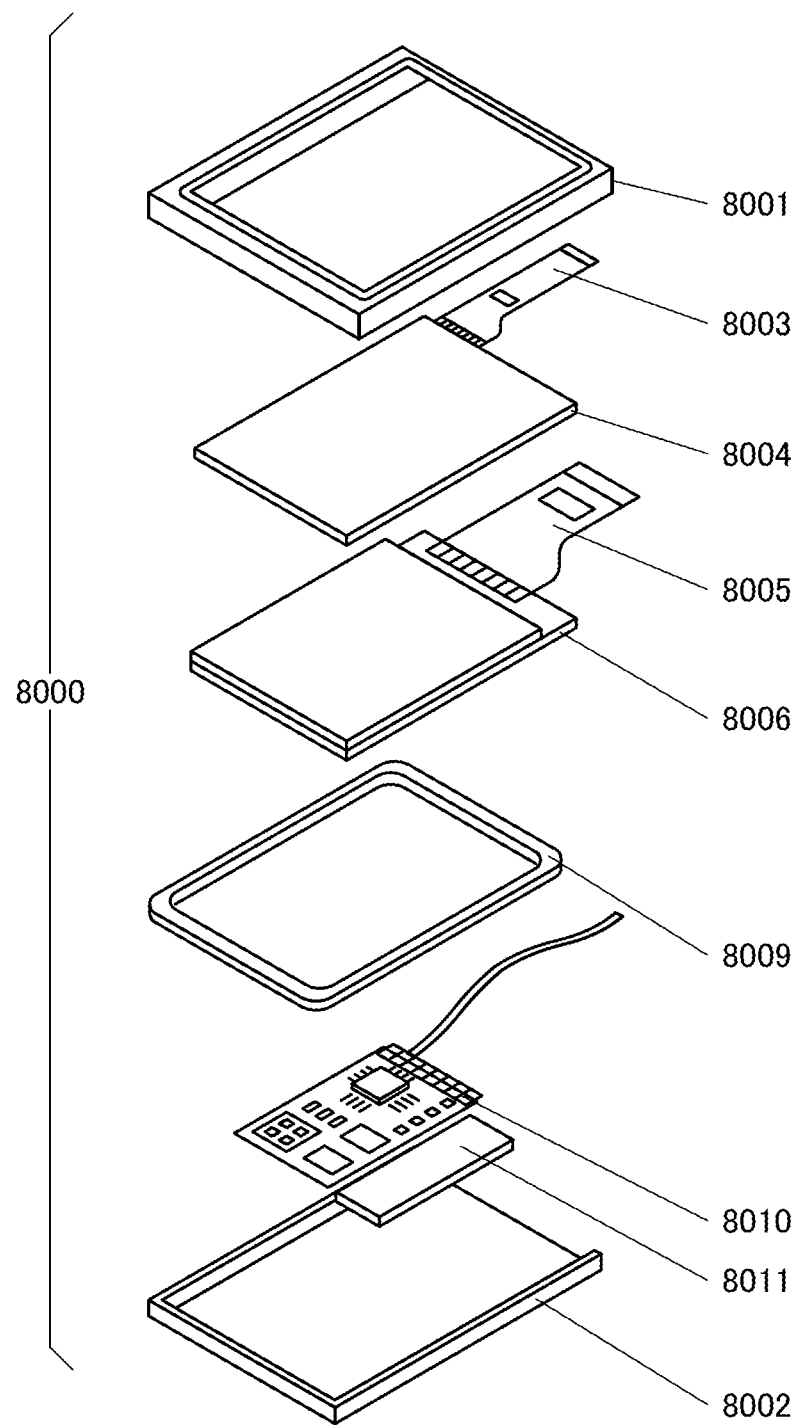
FIG. 12 is a perspective view of a display module of one embodiment of the present invention.

In a display module 8000 in FIG. 12, a touch sensor 8004 connected to an FPC 8003, a display device 8006 connected to an FPC 8005, a frame 8009, a printed board 8010, and a battery 8011 are provided between an upper cover 8001 and a lower cover 8002.

The light-emitting element of one embodiment of the present invention can be used for the display device 8006, for example.

The shapes and sizes of the upper cover 8001 and the lower cover 8002 can be changed as appropriate in accordance with the sizes of the touch sensor 8004 and the display device 8006.

The touch sensor 8004 can be a resistive touch sensor or a capacitive touch sensor and may be formed to overlap with the display device 8006. A counter substrate (sealing substrate) of the display device 8006 can have a touch sensor function. A photosensor may be provided in each pixel of the display device 8006 so that an optical touch sensor is obtained.

The frame 8009 protects the display device 8006 and also serves as an electromagnetic shield for blocking electromagnetic waves generated by the operation of the printed board 8010. The frame 8009 may serve as a radiator plate.

The printed board 8010 has a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 can be additionally provided with a member such as a polarizing plate, a retardation plate, or a prism sheet.

Electronic Device

FIGS. 13A to 13G illustrate electronic devices. These electronic devices can include a housing 9000, a display portion 9001, a speaker 9003, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIGS. 13A to 13G can have a variety of functions, for example, a function of displaying a variety of data (a still image, a moving image, a text image, and the like) on the display portion, a touch sensor function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions that can be provided for the electronic devices illustrated in FIGS. 13A to 13G are not limited to those described above, and the electronic devices can have a variety of functions. Although not illustrated in FIGS. 13A to 13G, the electronic devices may include a plurality of display portions. The electronic devices may have a camera or the like and a function of taking a still image, a function of taking a moving image, a function of storing the taken image in a memory medium (an external memory medium or a memory medium incorporated in the camera), a function of displaying the taken image on the display portion, or the like.

The electronic devices illustrated in FIGS. 13A to 13G will be described in detail below.

Figure 13A:
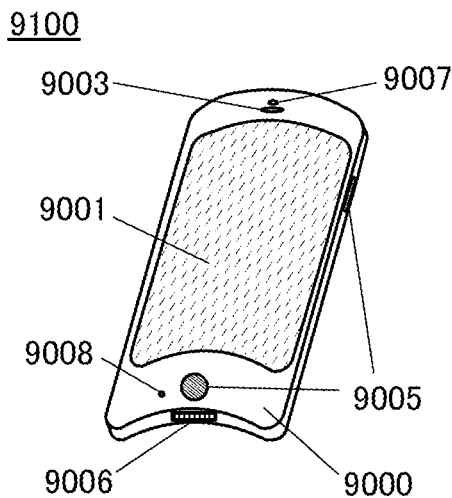
FIGS. 13A to 13G are diagrams of electronic devices of one embodiment of the present invention.

FIG. 13A is a perspective view of a portable information terminal 9100. The display portion 9001 of the portable information terminal 9100 is flexible. Therefore, the display portion 9001 can be incorporated along a bent surface of a bent housing 9000. In addition, the display portion 9001 includes a touch sensor, and operation can be performed by touching the screen with a finger, a stylus, or the like. For example, when an icon displayed on the display portion 9001 is touched, an application can be started.

Figure 13D:
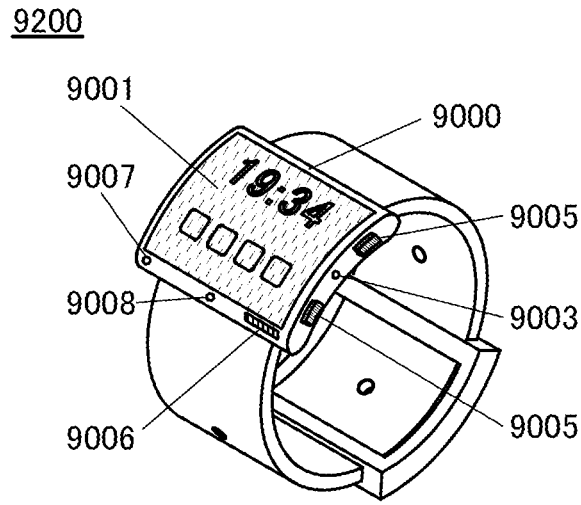
Figure 13B:
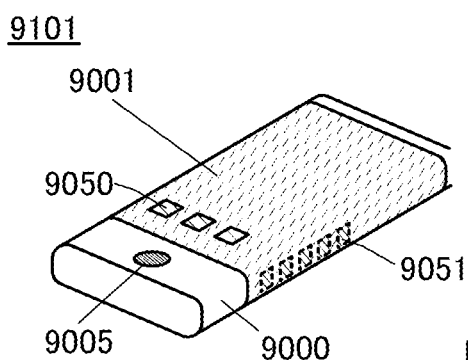

FIG. 13B is a perspective view of a portable information terminal 9101. The portable information terminal 9101 functions as, for example, one or more of a telephone set, a notebook, and an information browsing system. Specifically, the portable information terminal can be used as a smartphone. Note that the speaker 9003, the connection terminal 9006, the sensor 9007, and the like, which are not shown in FIG. 13B, can be positioned in the portable information terminal 9101 as in the portable information terminal 9100 shown in FIG. 13A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, call, and the like; the title and sender of an email and SNS message; the date; the time; remaining battery; and the reception strength of an antenna. Instead of the information 9051, the operation buttons 9050 or the like may be displayed on the position where the information 9051 is displayed.

Figure 13E:
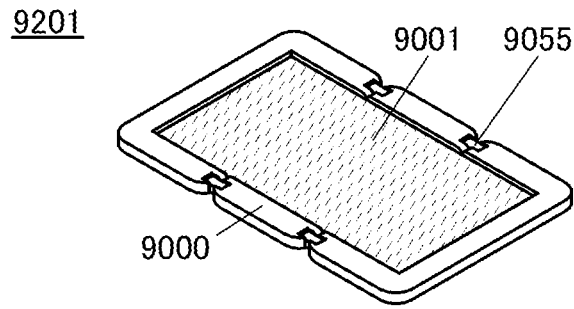
Figure 13C:
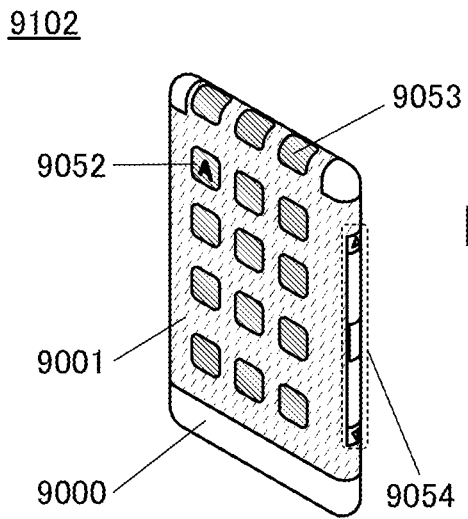

FIG. 13C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

FIG. 13D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal 9200 can employ near field communication that is a communication method based on an existing communication standard. In that case, for example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is possible. Note that the charging operation may be performed by wireless power feeding without using the connection terminal 9006.

Figure 13F:
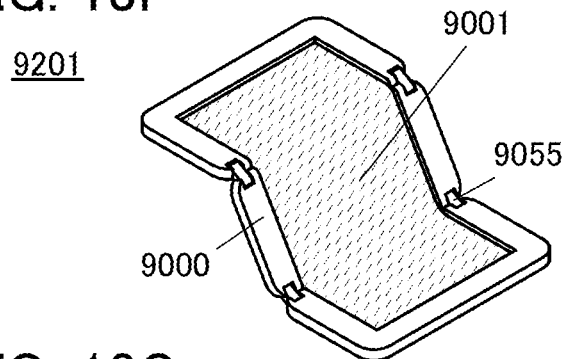
Figure 13G:
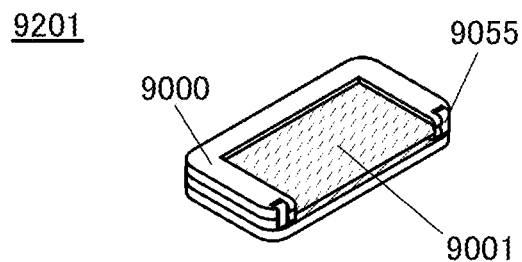

FIGS. 13E, 13F, and 13G are perspective views of a foldable portable information terminal 9201. FIG. 13E is a perspective view illustrating the portable information terminal 9201 that is opened. FIG. 13F is a perspective view illustrating the portable information terminal 9201 that is being opened or being folded. FIG. 13G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature of greater than or equal to 1 mm and less than or equal to 150 mm.

The electronic devices described in this embodiment each include the display portion for displaying some sort of data. Note that the light-emitting element of one embodiment of the present invention can also be used for an electronic device which does not have a display portion. The structure in which the display portion of the electronic device described in this embodiment is flexible and display can be performed on the bent display surface or the structure in which the display portion of the electronic device is foldable is described as an example; however, the structure is not limited thereto and a structure in which the display portion of the electronic device is not flexible and display is performed on a plane portion may be employed.

The structure described in this embodiment can be combined with any of the structures described in the other embodiments as appropriate.

Embodiment 7

In this embodiment, examples of lighting devices in which the light-emitting element of one embodiment of the present invention is used will be described with reference to FIG. 14.

Figure 14:
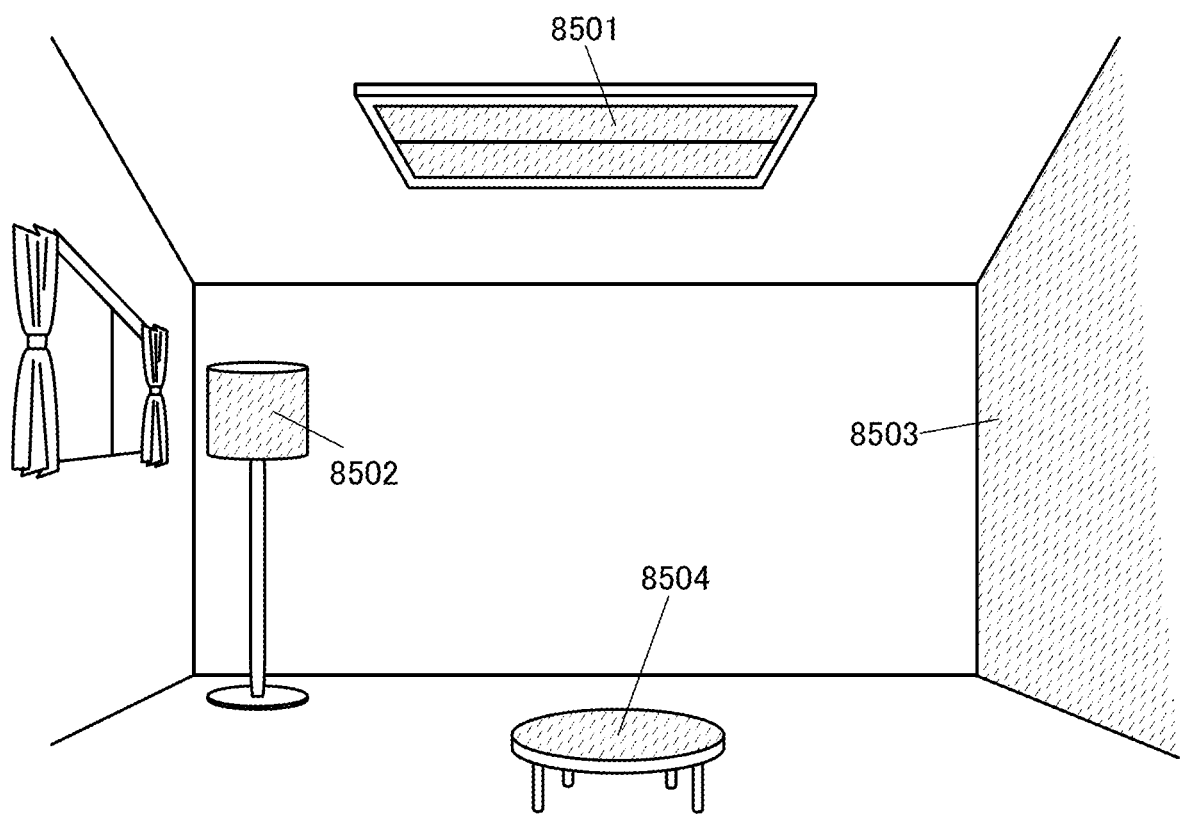
FIG. 14 is a diagram of a lighting device of one embodiment of the present invention.

FIG. 14 illustrates an example in which the light-emitting element is used for an indoor lighting device 8501. Since the light-emitting element can have a larger area, a lighting device having a large area can also be formed. In addition, a lighting device 8502 in which a light-emitting region has a curved surface can also be formed with the use of a housing with a curved surface. A light-emitting element described in this embodiment is in the form of a thin film, which allows the housing to be designed more freely. Therefore, the lighting device can be elaborately designed in a variety of ways. Furthermore, a wall of the room may be provided with a large-sized lighting device 8503. Touch sensors may be provided in the lighting devices 8501, 8502, and 8503 to control the power on/off of the lighting devices.

Moreover, when the light-emitting element is used on the surface side of a table, a lighting device 8504 which has a function as a table can be obtained. When the light-emitting element is used as part of other furniture, a lighting device which has a function as the furniture can be obtained.

In this manner, a variety of lighting devices to which the light-emitting element is applied can be obtained. Note that such lighting devices are also embodiments of the present invention.

The structure described in this embodiment can be combined with any of the structures described in the other embodiments as appropriate.

This application is based on Japanese Patent Application serial no. 2014-208543 filed with Japan Patent Office on Oct. 10, 2014, the entire contents of which are hereby incorporated by reference.

What is claimed is:
1. A light-emitting element comprising:
a pair of electrodes; and
an EL layer provided between the pair of electrodes,
wherein the EL layer comprises a light-emitting layer,
wherein the light-emitting layer comprises a host material and a guest material, wherein the host material comprises a first organic compound and a second organic compound, wherein an exciplex formed by the first organic compound and the second organic compound is capable of exhibiting thermally activated delayed fluorescence at room temperature, wherein the guest material is capable of exhibiting fluorescence, wherein a second triplet excitation energy level of the guest material is higher than or equal to a lowest triplet excitation energy level of the exciplex, and wherein the lowest triplet excitation energy level of the exciplex is higher than or equal to a lowest triplet excitation energy level of the guest material.

2. The light-emitting element according to claim 1, wherein the second triplet excitation energy level of the guest material is higher than or equal to a lowest singlet excitation energy level of the exciplex.

3. The light-emitting element according to claim 1, wherein the lowest triplet excitation energy level of the exciplex is higher than or equal to a lowest singlet excitation energy level of the guest material.

4. The light-emitting element according to claim 1, wherein a difference between the lowest triplet excitation energy level of the exciplex and the lowest triplet excitation energy level of the guest material is higher than or equal to 0.5 eV.

5. The light-emitting element according to claim 1, wherein a thermally activated delayed fluorescence emission energy of the exciplex is higher than or equal to a phosphorescence emission energy of the guest material.

6. The light-emitting element according to claim 1, wherein a difference between a thermally activated delayed fluorescence emission energy of the exciplex and a phosphorescence emission energy of the guest material is higher than or equal to 0.5 eV.

7. The light-emitting element according to claim 1, wherein the exciplex has a difference of more than 0 eV and less than or equal to 0.2 eV between a lowest singlet excitation energy level and the lowest triplet excitation energy level.

8. The light-emitting element according to claim 1, wherein the guest material comprises at least one skeleton selected from anthracene, tetracene, chrysene, pyrene, perylene and acridine, and at least one substituent bonded to the skeleton.

9. The light-emitting element according to claim 1,
wherein the guest material comprises a skeleton, a first substituent and a second substituent,
wherein the skeleton is selected from anthracene, tetracene, chrysene, pyrene, perylene and acridine, and
wherein a structure of the first substituent is same as that of the second substituent.

10. A display device comprising:
the light-emitting element according to claim 1; and
any one of a color filter, a seal and a transistor.

11. An electronic device comprising:
the display device according to claim 10; and
a housing or a touch sensor.

12. A lighting device comprising:
the light-emitting element according to claim 1; and
a housing or a touch sensor.

* * * * *